United States Patent [19]

Takashima

[11] Patent Number: 5,894,447
[45] Date of Patent: Apr. 13, 1999

[54] SEMICONDUCTOR MEMORY DEVICE INCLUDING A PARTICULAR MEMORY CELL BLOCK STRUCTURE

[75] Inventor: Daisaburo Takashima, Yokohama, Japan

[73] Assignee: Kabushiki Kaisha Toshiba, Kawasaki, Japan

[21] Appl. No.: 08/936,727

[22] Filed: Sep. 25, 1997

[30] Foreign Application Priority Data

Sep. 26, 1996 [JP] Japan .................... 8-254074
Jul. 16, 1997 [JP] Japan .................... 9-191380

[51] Int. Cl.[6] ........................ G11C 11/00
[52] U.S. Cl. ............... 365/158; 365/210; 365/230.03
[58] Field of Search ................ 365/158, 210, 365/230.03

[56] References Cited

U.S. PATENT DOCUMENTS 4,829,476  5/1989  Dupuis et al. ................ 365/158
5,029,135  7/1991  Okubo ......................... 365/203

Primary Examiner—David Nelms
Assistant Examiner—Vanthu Nguyen
Attorney, Agent, or Firm—Oblon, Spivak, McClelland, Maier & Neustadt, P.C.

[57] ABSTRACT

A semiconductor memory device comprises a plurality of word lines, a plurality of bitlines, a plurality of memory cells selectively disposed at intersections between the plural bitlines and the plural word lines and arranged to store data in accordance with change in the resistance, a plurality of sub-cell blocks formed by one of the plural memory cells or two or more memory cells in series connected in a direction of the bitline, a plurality of cell blocks formed by at least two sub-cell blocks in series connected in the direction of the bitline and a memory cell array formed by at least two cell blocks disposed in a direction of the word line, circuit for allowing an electric current to flow in a direction of the bitline of the plural cell blocks, and circuit for reading data from nodes at two ends of the sub-cell block in the plural sub-cell blocks including a memory cell selected by the plural word lines.

9 Claims, 40 Drawing Sheets

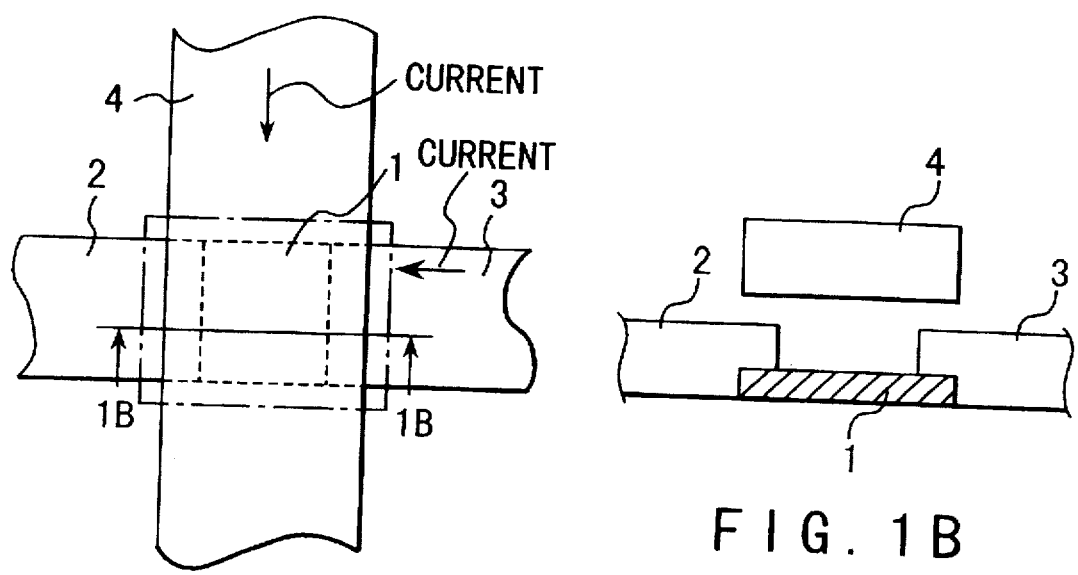
FIG. 1A (PRIOR ART)
FIG. 1B (PRIOR ART)
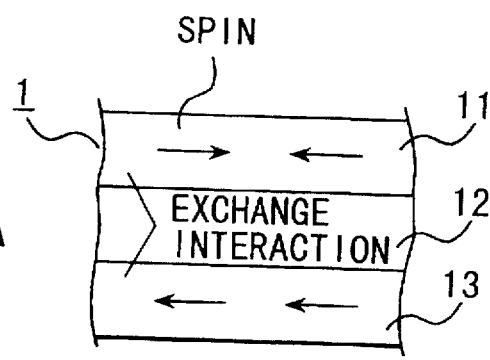
FIG. 2A (PRIOR ART)
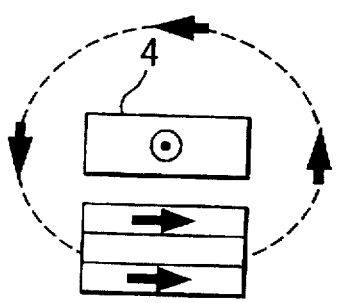
FIG. 2B (PRIOR ART)
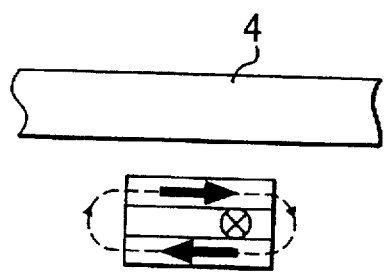
FIG. 2C (PRIOR ART)

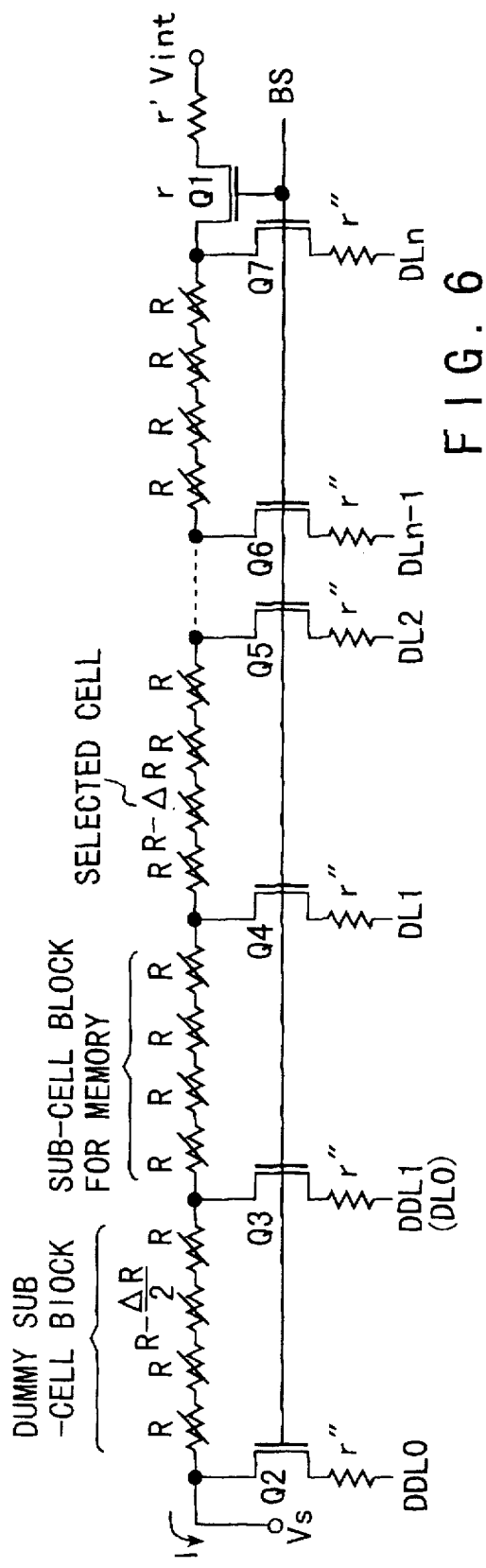
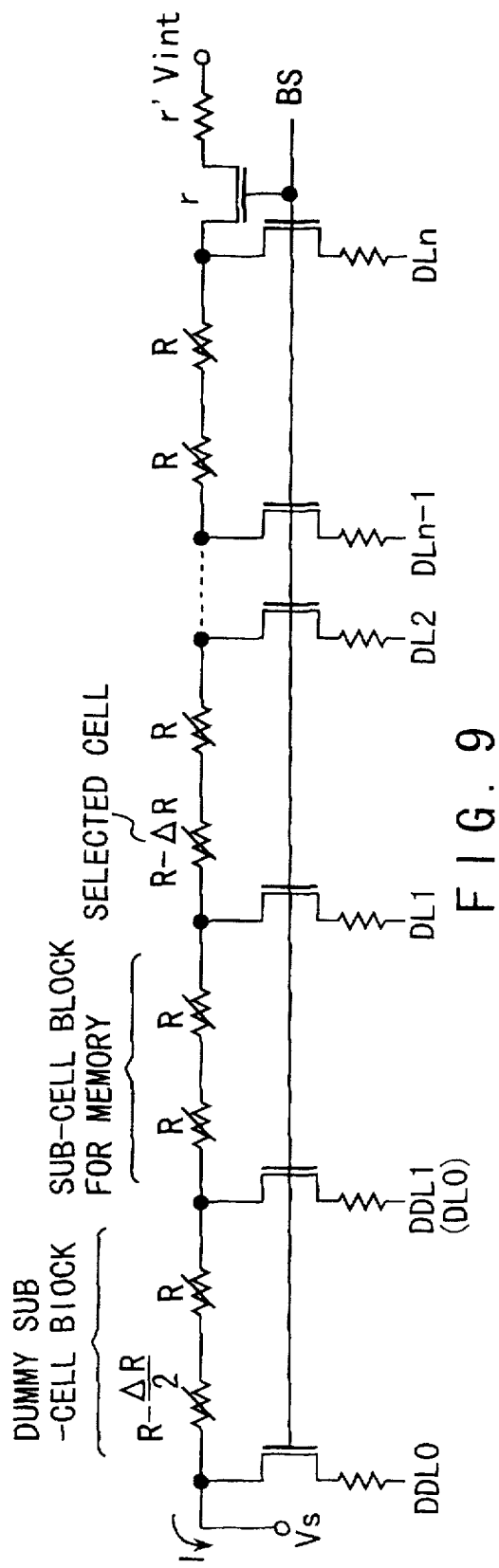
FIG. 6
FIG. 9

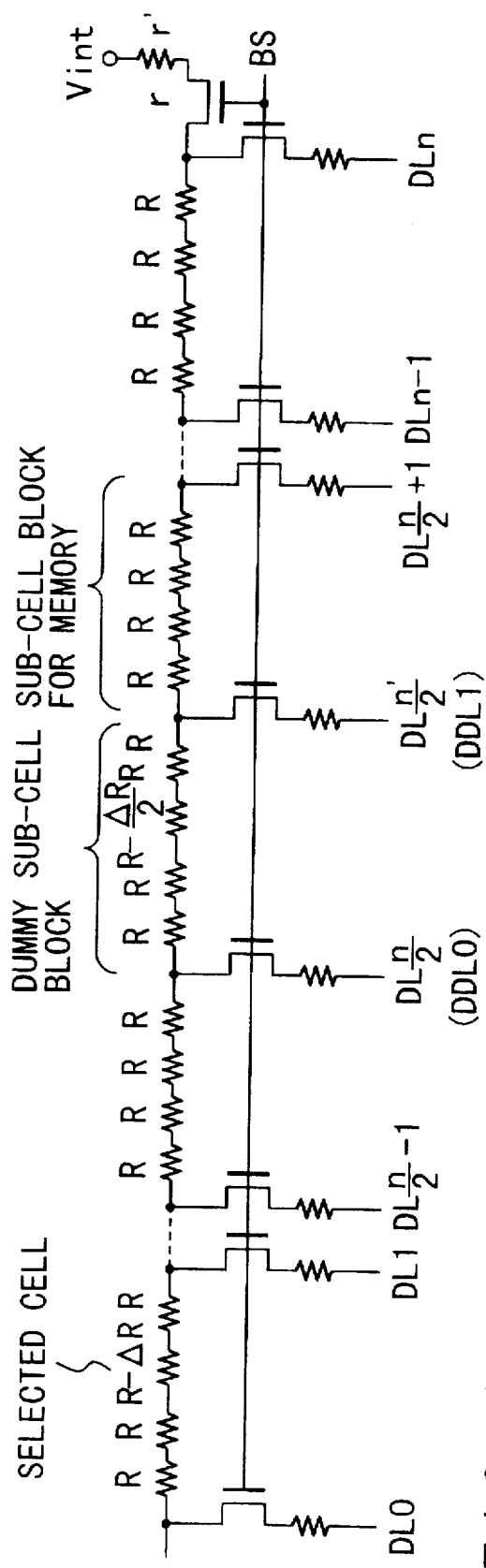
F I G. 12
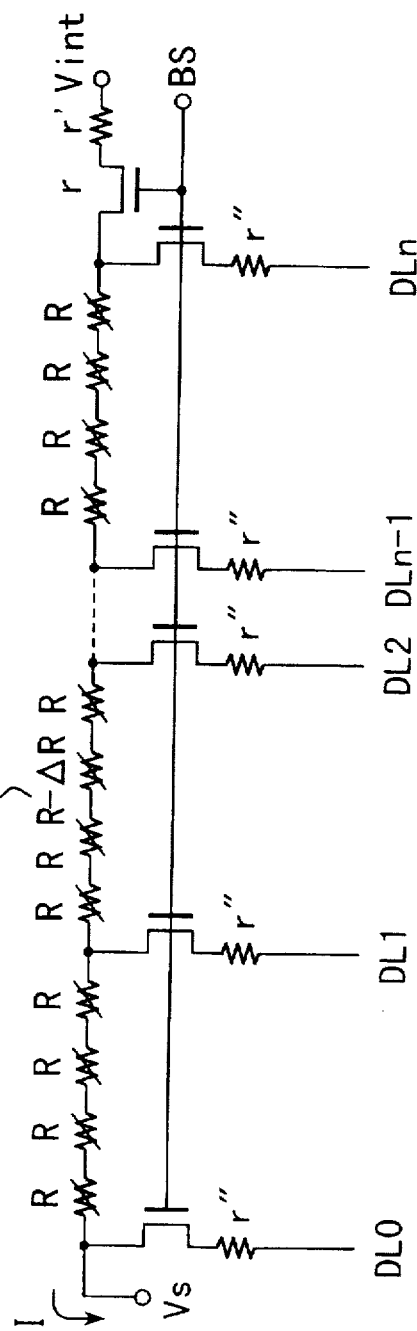
F I G. 13

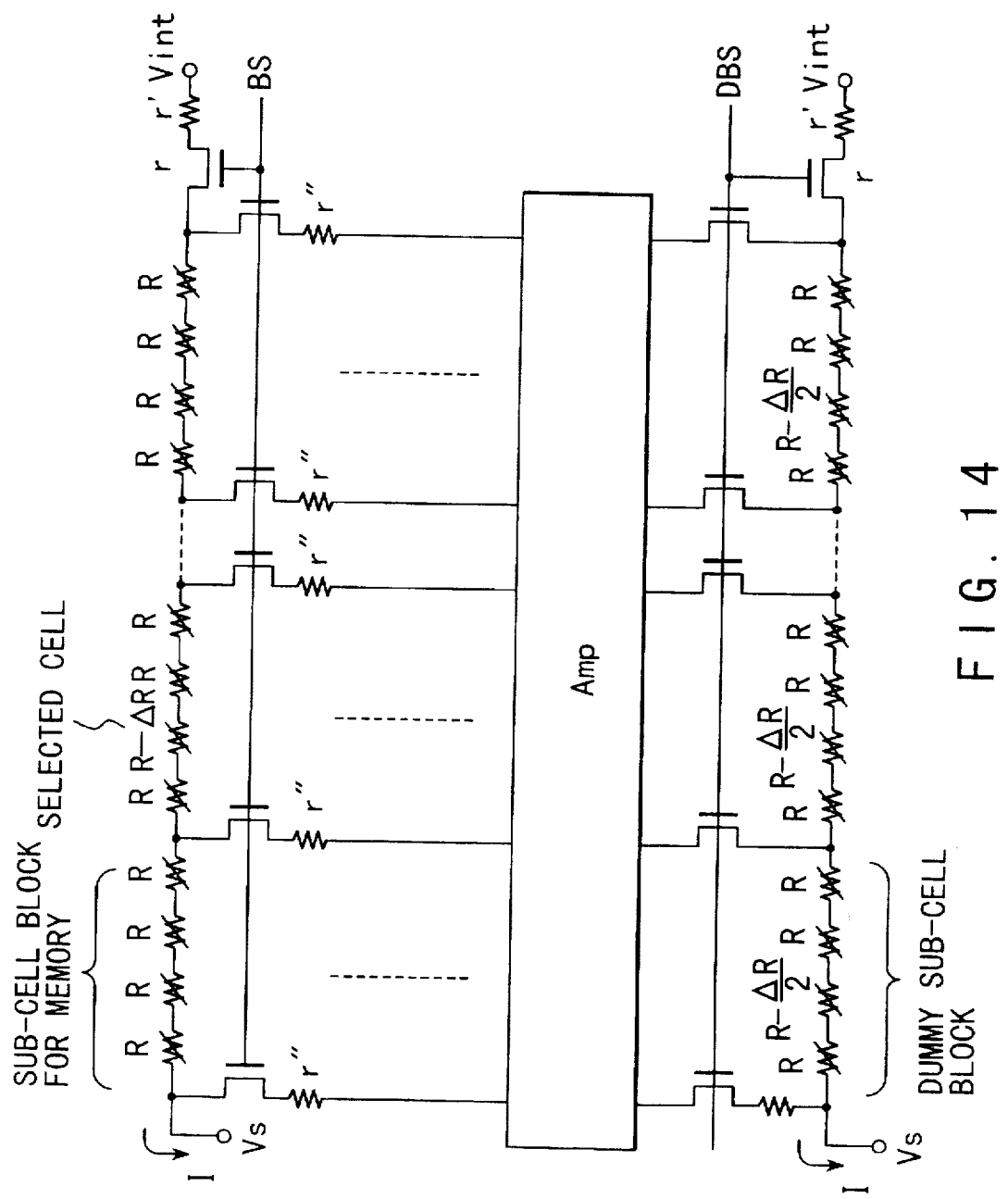
F I G. 14

DATA LINE ACTIVE CONTACT  
DATA LINE LAYER

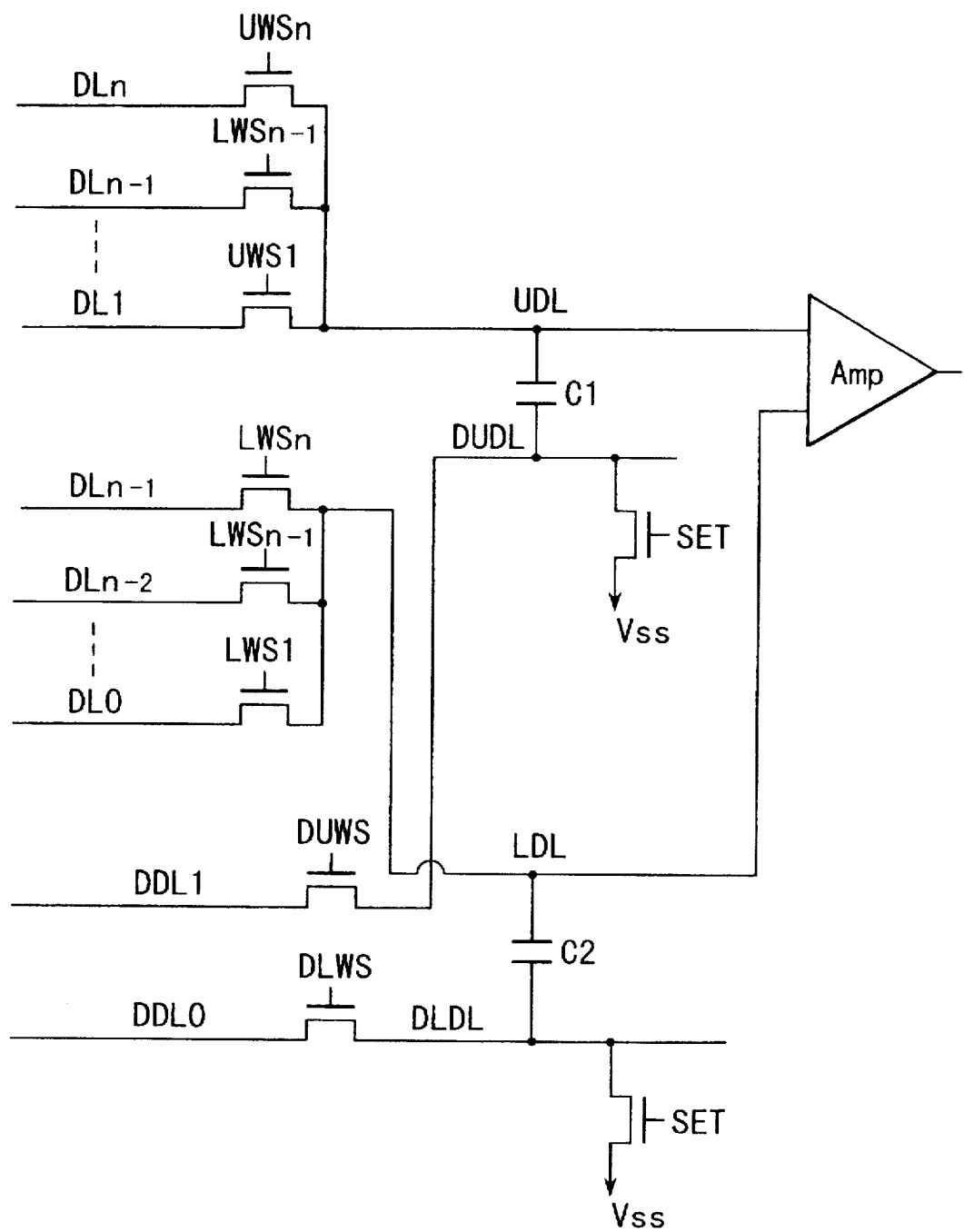
F I G. 29

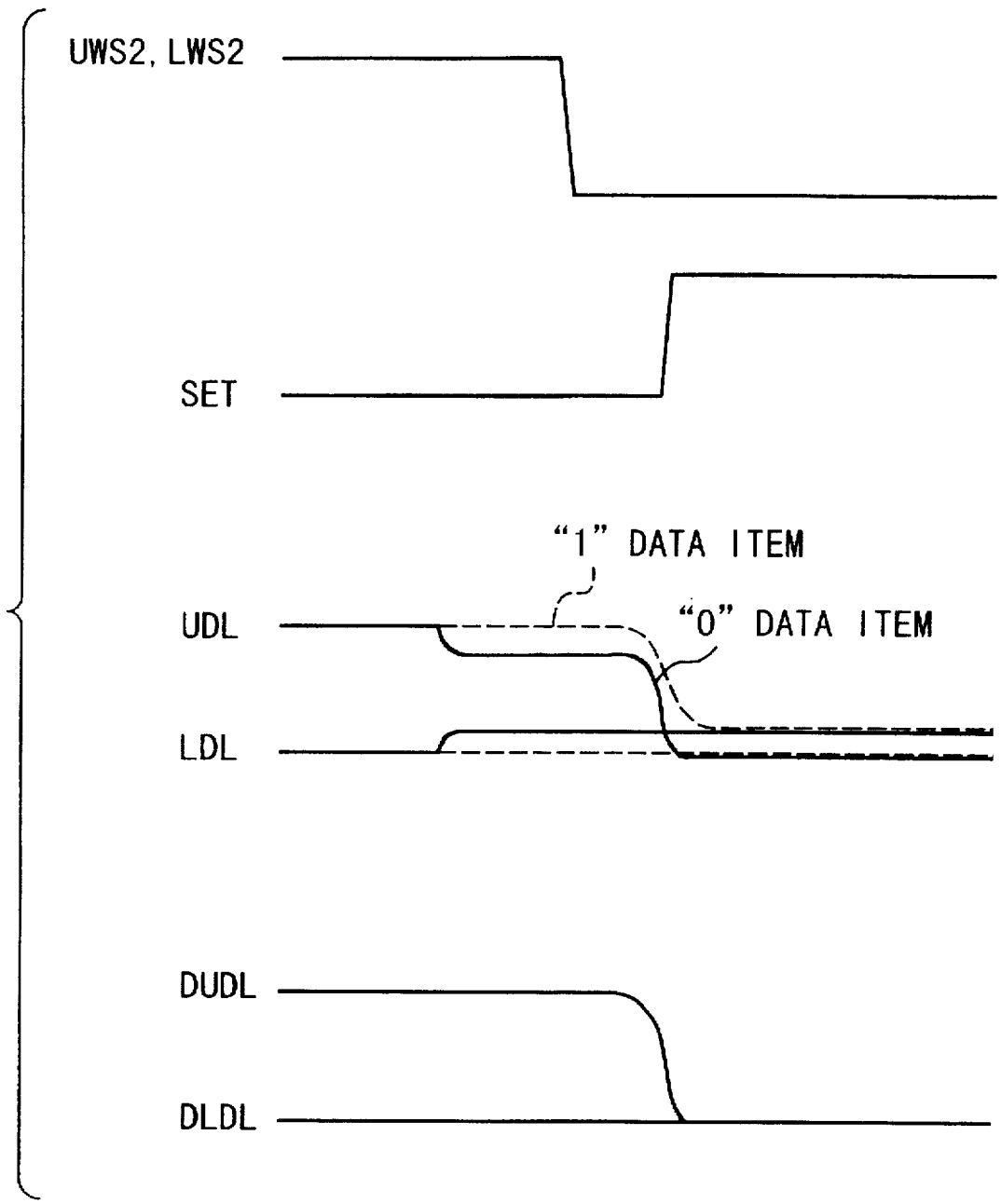
F I G. 30

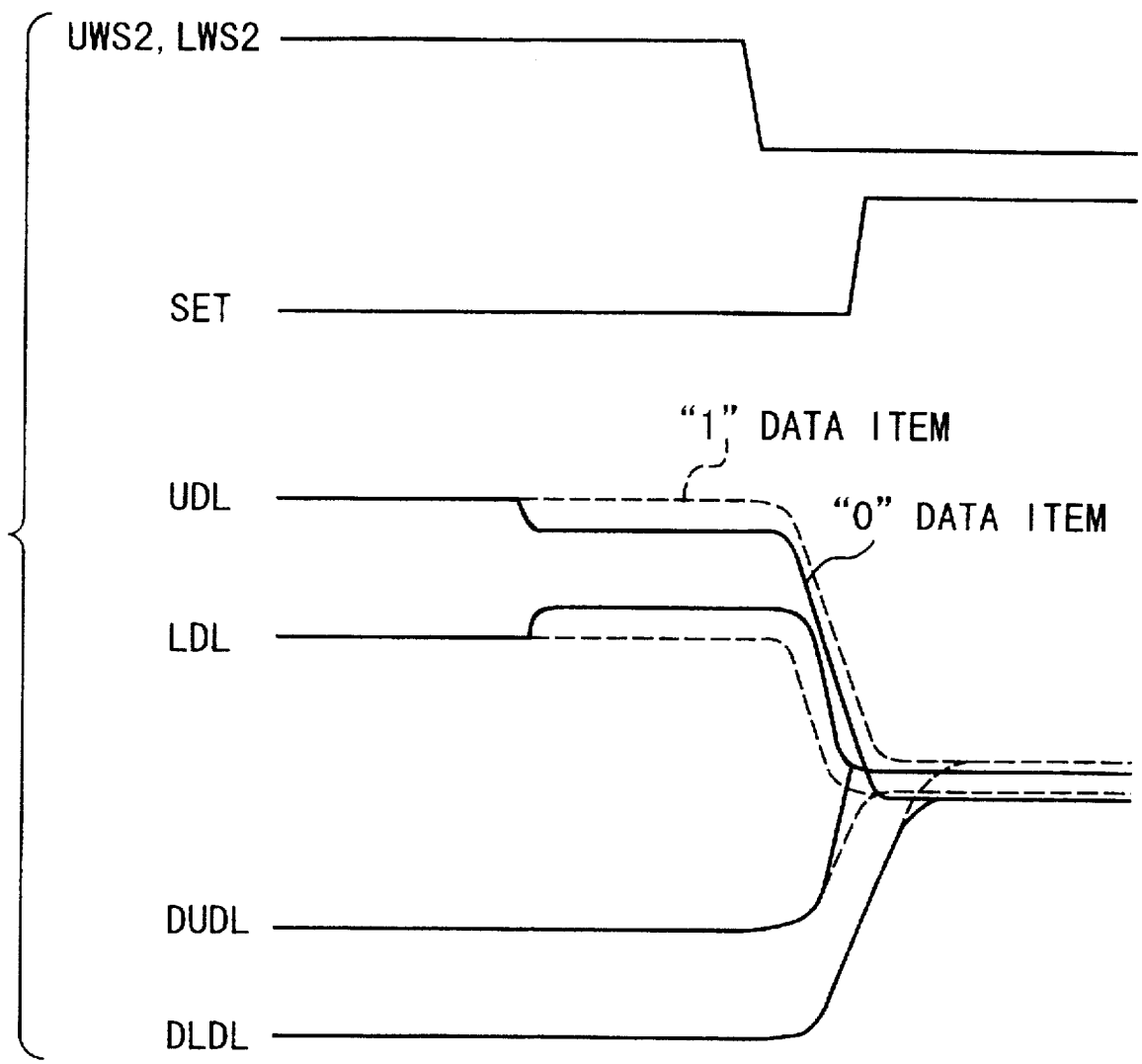
F I G. 32

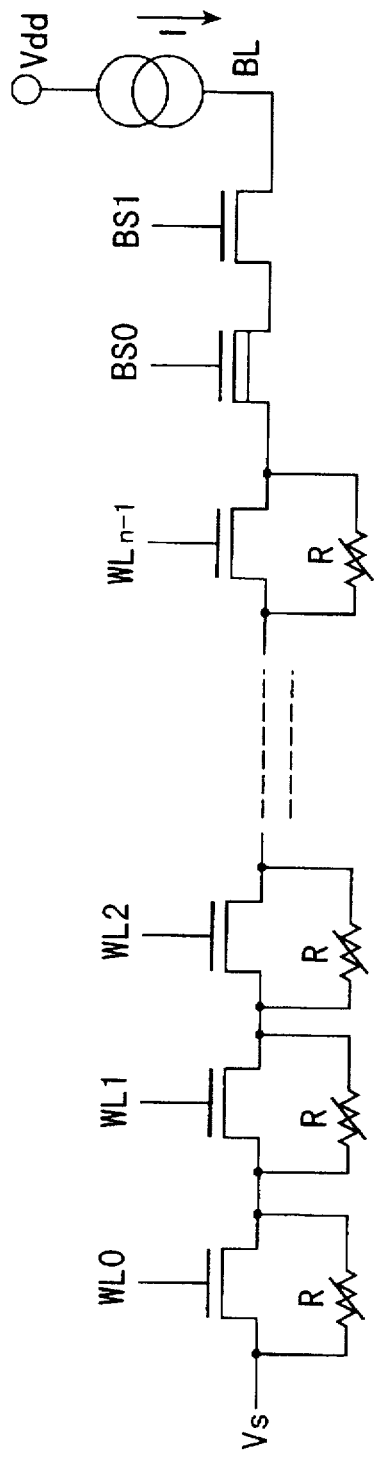
F I G. 34A
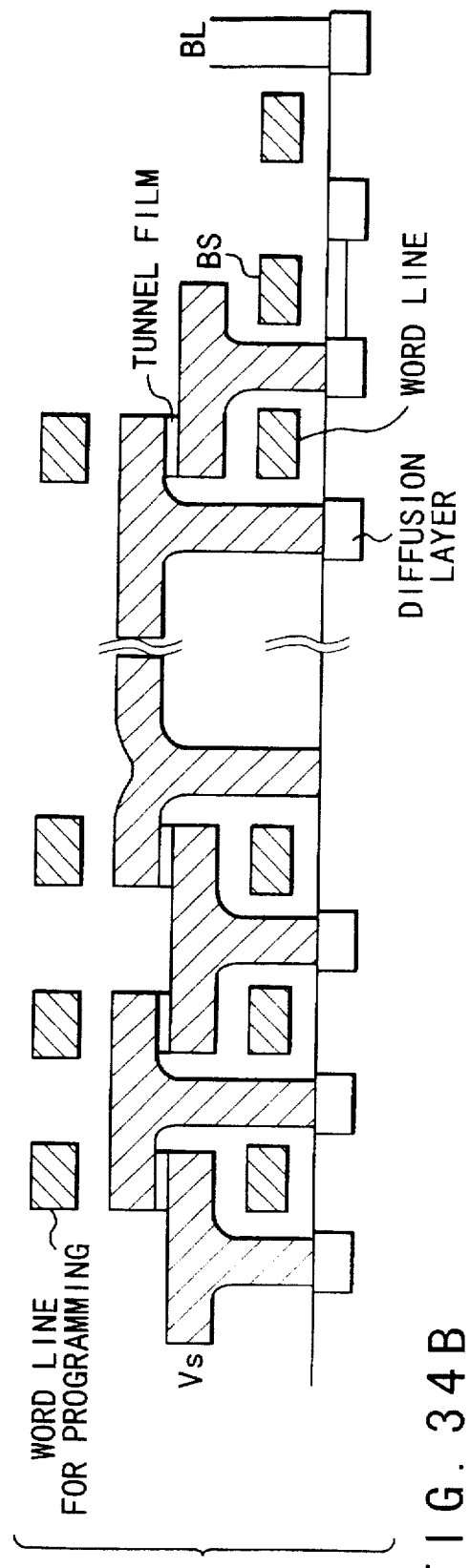
F I G. 34B

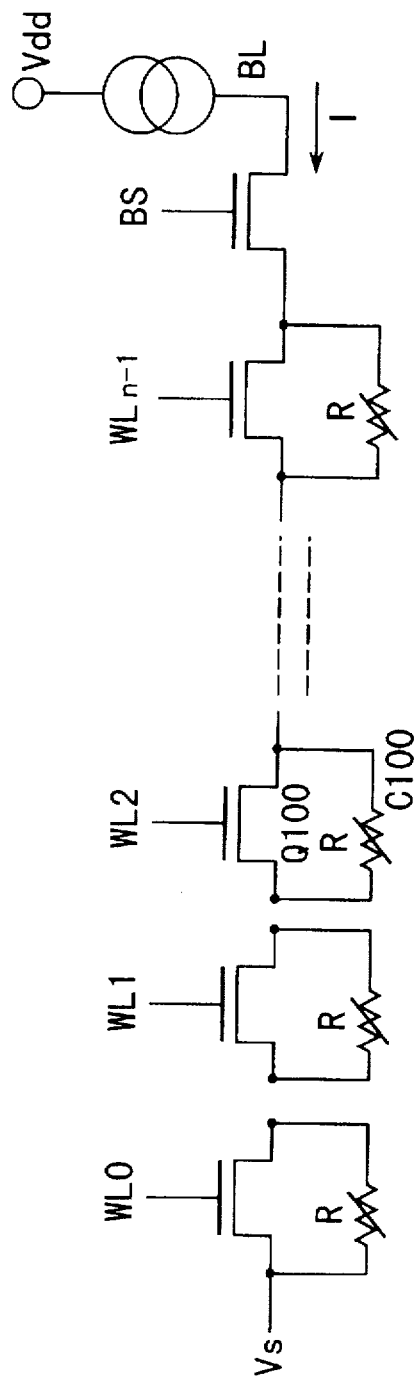
F I G. 35A
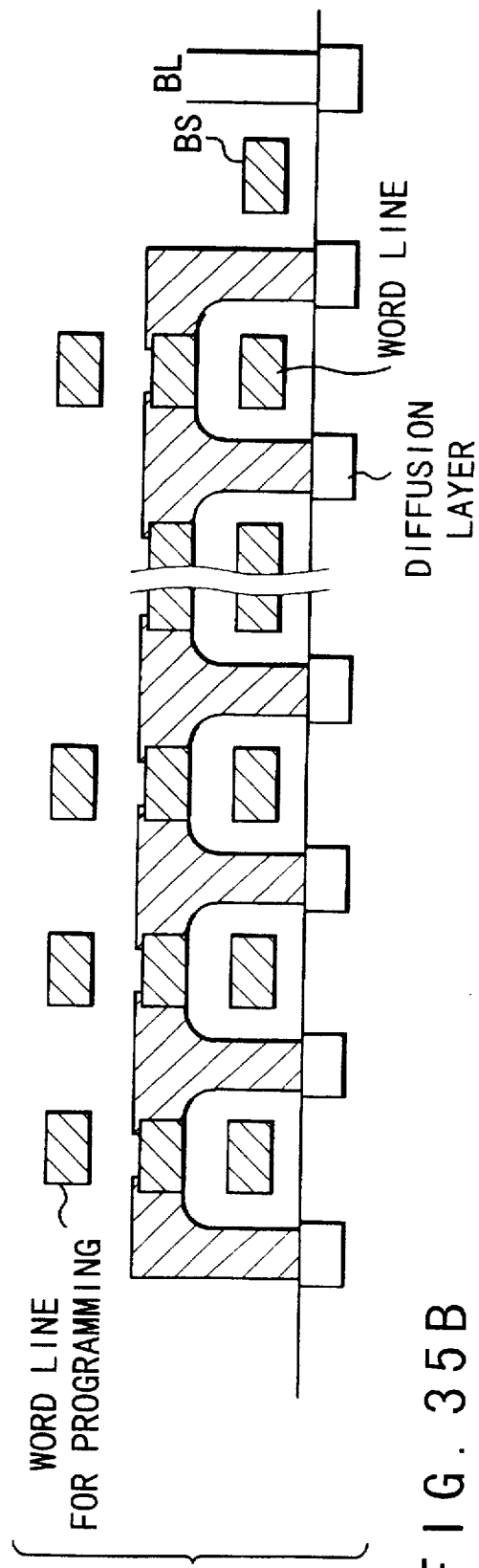
F I G. 35B

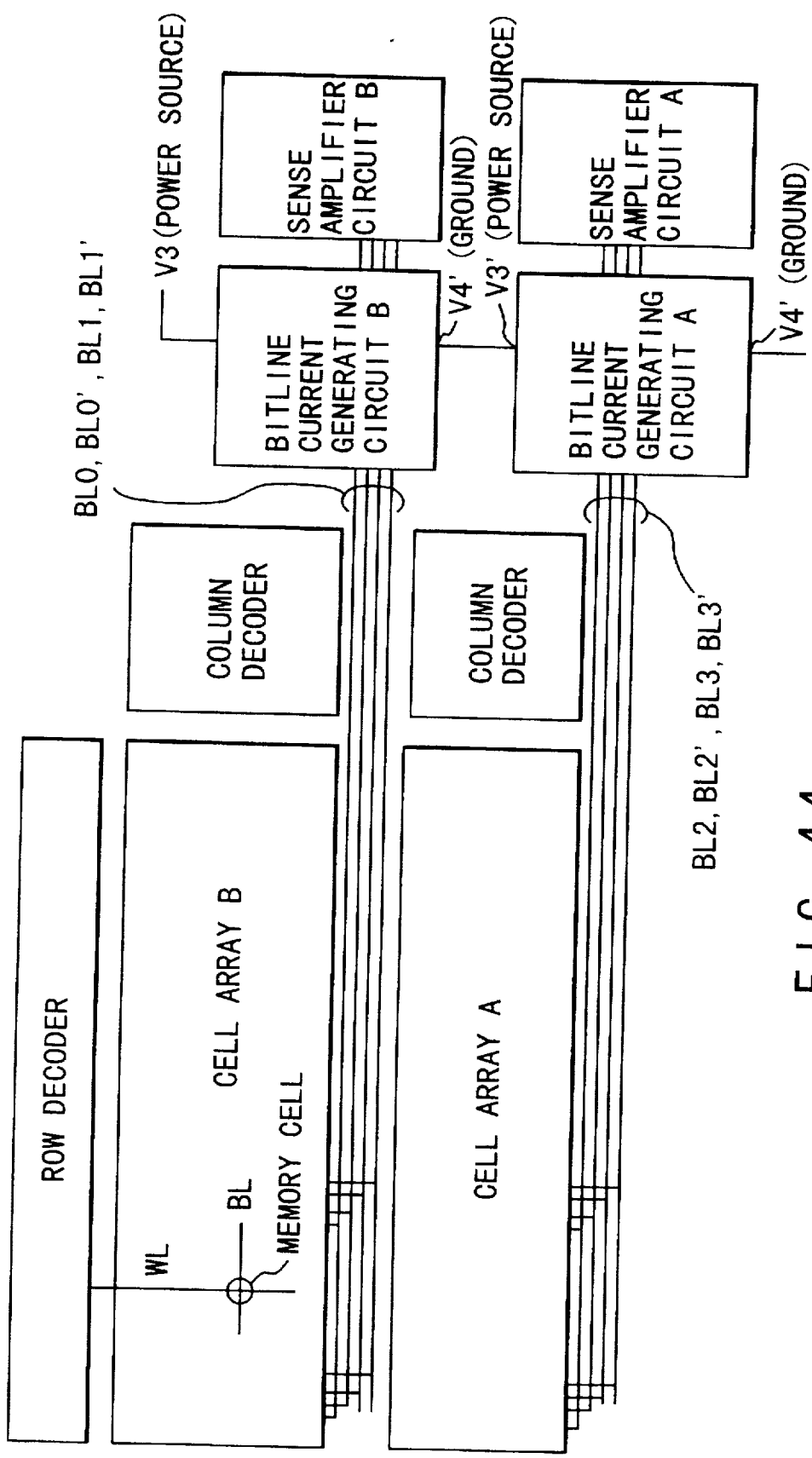
F I G. 44

MAGNETIC FIELD = 75 (Oe)

MAGNETIC FIELD = 81 (Oe)

MAGNETIC FIELD = 114 (Oe)

MAGNETIC FIELD = 107 (Oe)

MAGNETIC FIELD = 127 (Oe)

MAGNETIC FIELD = 155 (Oe)

MAGNETIC FIELD = 218 (Oe)

MAGNETIC FIELD = 150 (Oe)

SEMICONDUCTOR MEMORY DEVICE INCLUDING A PARTICULAR MEMORY CELL BLOCK STRUCTURE

BACKGROUND OF THE INVENTION

The present invention relates to a semiconductor memory device for storing information by using change in the magnetic resistance occurring attributable to magnetic spins.

These days semiconductor memories have been widely used in a main memory for a large-scaled computer, a personal computer, a home electric product, a portable telephone and the like. The semiconductor memories are, on the market, classified into a volatile DRAM (Dynamic RAM), an SRAM (Static RAM), a non-volatile MROM (Mask ROM), a Flash EEPROM (Electrically Erasable Programmable ROM) and the like. In particular, the DRAM, which is a volatile memory, has advantages of low cost (because the area is ¼ of the SRAM) and high speed operation (as compared with the EEPROM). Therefore, the DRAM has the largest market share.

The EEPROM, which is a programmable and non-volatile memory, has a problem of a poor number of permitted writing and read operations (too small number of W/E operations) of about $10^6$ times, a time of about a microsecond being required to write data and a necessity of applying high voltage (12 V to 22 V) to write data. Therefore, the EEPROM cannot get a large share as compared with the DRAM.

On the other hand, the FRAM which is a non-volatile semiconductor memory using a ferroelectric capacitor and suggested in 1980 has advantages of a large number of permitted writing and read operations of $10^{12}$ times, short time being required to write/read data similar to that required for the DRAM and a low voltage level of 3 V to 5 V being required to be applied. Therefore, the FRAM has been energetically researched and developed by a multiplicity of manufacturers. However, when the number of writing/read operations is $10^{12}$ times, (100 ns×$10^{12}$ times)/(60×60×24 seconds)=1.15 days at 100 ns cycle time. Therefore, if the number of writing/read operations is smaller than $10^{15}$ times, a continuous operation for 10 years or longer is not permitted. Thus, the FRAM cannot be used as a main memory like the DRAM.

On the other hand, a non-volatile semiconductor memory using the magnetoresistance effect, such as the GMR (Giant Magneto Resistance) has been researched and developed (for example, J. L. Brown et al, IEEE Trans. of Components Packaging, and Manufacturing Technology-PART A, Vol. 17, No. 3, September, 1994). The GMR memory has advantages of nondestructive readout, high speed operation and high radioactive ray pressure resistance. Moreover, the GMR memory exhibits a large number of writing/read operations of $10^{15}$ times or more. Therefore, the GMR memory has a possibility that the GMR memory will be used in place of the DRAM market, all of semiconductor memories and hard disk (HD).

FIG. 1A is a plan view showing a conventional GMR memory, and FIG. 1B is a cross sectional view taken along line 1B—1B shown in FIG. 1A. As shown in FIGS. 1A and 1B, a GMR film 1 is, in series, connected to bit-lines 2 and 3, while a word line 4 is formed above the GMR film 1 to intersect the bitlines 2 and 3. The GMR film 1 is in the form of a artificial metal lattice, nanogranular alloy or an exchange connection GMR film formed by a sandwich layer composed of thin ferromagnetic layer 11, a non-magnetic conductive layer 12 and a ferromagnetic layer 13 as shown in FIG. 2A. Moreover, a tunnel GMR, a GMR made of an oxide magnetic material and CMR (Colossal MR) have been suggested.

The operation of the GMR memory will now be described in which the exchange connection GMR film will be described. The layers have thicknesses such that the ferromagnetic layers 11 and 13 have thickness of 3.0 nm and the non-magnetic conductive layer 12 has a thickness of 2.0 nm. The thicknesses of the foregoing layers are smaller than the mean free path of electrons. The spin of the ferromagnetic layers 11 and 13 on the two sides of the non-magnetic conductive layer 12 is made to be opposite directions to each other in a state of a zero magnetic field attributable to the mutual exchange effect. The direction of the spin is changed into a direction of the synthesized magnetic field of the magnetic fields (H) generated by the electric current allowed to flow in the word line shown in FIG. 2B and the bitline shown in FIG. 2C. When the directions of the spins on the two sides are opposite, the electric resistance is high, while the electric resistance is low when the directions of the spins on the two sides are the same.

That is, the resistance is determined by only the relative directions of the spins on the two sides, that is, the resistance does not depend upon the absolute directions of the spins on the two sides (isotropy). The GMR memory uses the difference in the resistance to read written information. That is, the difference in the potential generated when an electric current is supplied to the bitline is amplified by a sense amplifier so that information "0"and "1" is read.

FIG. 2B shows a direction of a magnetic field when an electric current has been supplied to the bitline. A circular mark having a dot therein indicates a case where the electric current is allowed to flow on this side, while a circular mark having a mark x therein indicates a case where the electric current is allowed to flow in the deep portion. The Ampere's corkscrew rule causes the electric current in the word line to generate a magnetic field in a direction of the bitline. Thus, both of the ferromagnetic layers generate magnetic fields in the same direction. The electric current in the bitline generates a magnetic field in the direction of the word line. Thus, magnetic fields (hereinafter called as "rotating magnetic fields") in directions opposite to each other are generated with respect to the ferromagnetic layers on the two sides.

A variety of structures of the GMR memory cell have been suggested as shown in FIGS. 3A to 3C.

FIG. 3A shows an exchange connection GMR film in the form of a stacked structure composed of, in the ascending order, a ferromagnetic layer (mainly composed of any one of Co, NiFe, CoFe or NiFeCo), a non-magnetic conductive layer (mainly composed of any one of Co, Ag or Au) and a ferromagnetic layer (mainly composed of any one of Co, NiFe, CoFe or NiFeCo). One of storage methods adapted to the GMR film is arranged such that spins in opposite directions are provided when the magnetic field is low and spins in the same direction are provided when the magnetic field is higher than the saturated magnetic field so that "1" and "0" are stored. Another method is arranged such that spins in opposite directions are provided in the direction of the word line so as to be "0" data item. Moreover, a large electric current is allowed to flow in the word line to direct the both spins into the direction of the bitline and an electric current is allowed to flow in such a manner that a rotating magnetic field is generated in a direction opposite to the spinning direction in the opposite direction so that the spins of the upper and lower ferromagnetic layers in the opposite directions and opposite absolute directions are inverted so as to stored as "1" data item. The spin cannot be rotated by only the rotating magnetic field. When the synthesized magnetic field with the magnetic field generated by the electric current in the word line exceeds energy required for the inversion, the spins can be inverted.

A method of reading the GMR memory cell is arranged in such a manner that an electric current smaller than that for use in the writing operation is allowed to flow into the opposite direction to the direction of the word line to direct the both spins into the direction of the same bitlines. Then, an electric current is allowed to flow in the bitline in a direction in which the rotating magnetic field, which is the same when the "1" data item has been written, is generated. Since the direction of the rotating magnetic field is the same as the direction of the spin when "1" data item is read, the spins are directed in the direction of the word line in the opposite directions regardless of the electric current in the word line. As a result, the resistance of the bitline is raised. If the "0" data item is read, the direction of the spin and the direction of the rotating magnetic field are different from each other. Therefore, force for causing the direction of both spins attributable to the electric current in the word line to direct the direction of the same bit is enlarged (no inversion takes place because the electric current in the word line is small). As a result, the resistance of the bitline is lowered.

FIGS. 3B and 3C shows a non-connection (spin-bulb) film in which the upper and lower magnetic layers of the conductive layer are independently operated. Referring to FIG. 3B, a stacked structure is formed in which a soft magnetic layer (NiFe(Co)), a non-magnetic conductive layer (Cu) and a (semi) hard magnetic layer (CoPt) are formed in this sequential order when viewed from the lower position. The magnetic field in which the spinning direction in the (semi) hard magnetic layer is inverted is high, while that in which the spinning direction in the soft magnetic layer is inverted is low. Therefore, when a large word line electric current is allowed to flow toward this side when viewed in FIG. 3B, the (semi) hard magnetic layer store the "0" data item. When a large word line electric current is allowed to flow, the (semi) hard magnetic layer stores "1" data item.

When data is read, for example, "0" data item is read, left-hand spin is generated in the soft magnetic layer so that the soft magnetic layer has the spin opposite to that in the hard magnetic layer. Thus, the resistance of the soft magnetic layer increases. When "1" data item is read, the spin in the soft magnetic layer is the same as that in the hard magnetic layer. Thus, the resistance of the soft magnetic layer decreases. The difference in the resistance value is read as recorded information. The intensity of the magnetic field may be the synthesized magnetic field of the word line and the bitline or a second word line is provided in a direction perpendicular to the word line and a cell in a portion in which the selected word line and the second word line intersect may be generated by the synthesized magnetic field.

FIG. 3C shows a stacked structure composed of, in the ascending order, a soft magnetic layer (NiFe(Co)), a non-magnetic thin layer (Cu), a soft magnetic layer (NiFe(Co)) and an anti-ferromagnetic layer (FeMn). The anti-magnetic layer causes the soft magnetic layer above the conductive layer is connected strongly attributable to exchange connection and thus the spin is fixed. The spin in only the soft magnetic layer below the conductive layer is inverted attributable to the magnetic field so that data is stored.

However, a GMR memory of the foregoing type has not been put into practical use because of the following critical problems.

FIG. 4 shows a circuit diagram equivalent to the conventional GMR memory. Referring to FIG. 4, a memory cell is indicated by a symbol representing resistance provided with a diagonal line. Since the resistance of the bitline is changed by the magnetoresistance effect, the foregoing symbol is employed in this specification. Referring to FIG. 4, the word line is omitted from illustration. As the memory cell, the cell shown in FIGS. 3A to 3C may be employed. An assumption is performed that the resistance of a bitline in a case where spins in the upper and lower magnetic layers of one cell is opposite is R and the resistance in a case where the directions of the spins are the same is (R−ΔR). FIG. 4 shows a structure in which a plurality of cells are connected in series, one end (Vs) is grounded and another end is connected to a sense amplifier circuit and a constant-current generating circuit through a block select transistor (Q1).

When a read operation is performed such that, for example, "1" data item is read, the resistance of the selected and the other non-selected cells is R. When "0" data item is read, the resistance of the selected cell is (R−ΔR), and the other non-selected cell is R. Assuming that the electric current which flows from the constant current generating circuit to Vint and Vs is I, half of input potential (Vint) to the sense amplifier in the case of the "1" data item and the "0" data item, that is, the amount (Vout) of the signal from the cell is theoretically ΔR×I. However, the present GMR has the resistance change rate ΔR/R is a low value of 5% to 30%. Also Vout is a low value of 5 mV to 10 mV. Since the read signal is small as described above, the conventional GMR cell has the following problem.

The electric current I, which flows in the bitline, and the ON resistance (r) of the block select transistor cause IR drop to be generated in the block select transistor. For example, when the number of series cells=16, R=100 Ω, ΔR=10 Ω, r=625 Ω and Vint=2 V, I=2 V/(100×16+625) Ω=0.89 mA and output Vout=±4.5 mV. On the other hand, potential of I×r=0.55 V is applied between the source and the drain of the block select transistor. When the dispersion in the electric current in the transistor is ±10%, the output potential is changed by a large amount of ±55 mv. Also the noise/signal ratio is undesirably made to be 1000%. When the IR drop of the wiring resistance r' between the cell block and the constant current generating circuit is added, a practical operation as a large capacity memory cannot be performed although operation of one cell block is permitted.

On the other hand, a GMR memory of a type, such as Brown, is arranged to read cell data two times to cancel noise. The foregoing method is arranged such that, for example, the sense amplifier side reads both Vout in which the resistance of the selected cell is R as it is and Vout in which the resistance of the selected cell is (R−ΔR) so as to obtain the difference as an output signal. However, the foregoing double reading method, having a problem in that the sensing operation is made to be excessively slow, encounters a critical problem when the power supply is changed. That is, if the value of Vint is changed by 100 mV between the first read operation and the second read operation, a malfunction occurs.

Although the present GMR film is able to obtain a magnetoresistance change rate (about 100% at room temperature is enabled) by a large magnetic field by supplying a large electric current of 100 mA to several A, electric current consumption cannot be reduced. Since there is the difference between the distance from the word line to the GMR film and that from the bitline to the GMR film, the magnetic field generated by the word line current is undesirably weakened than the magnetic field generated by the bitline. Therefore, a large electric current is required for the word line. If a material having a high resistance change ratio (high MR ratio) capable of excellent sensing sensitivity required to manufacture a reliable LSI is used, a large word line current must be allowed to flow in the chip. If a plurality of word lines are selected, there arises a problem in that a larger electric current consumption is required for the practical use. The foregoing problem can be explained by the relationship shown in FIG. 5 between the magnetic field [Oe] and MR change rate (%). The present GMR film permits either a film having a high change ratio and requiring a large magnetic field (indicated with line A) or a film having a low change ratio and requiring a low magnetic field (indicated with line B). Thus, an ideal film as indicated with line Cell requiring a low magnetic field and capable of realizing a high MR ratio cannot be obtained.

Moreover, the conventional technique involves an influence of the magnetic field on memory cells of non-selected cell adjacent to a selected word line when an electric current is supplied to the selected word line to generate the magnetic field. Thus, data on the adjacent cell is broken when data is written. When data is read, change in the resistance of the selected cell is weakened in a case where inverse data has been written on the adjacent cell with respect to the selected cell. The foregoing problem becomes further critical when the structure is formed more precisely.

As described above, the conventional semiconductor memory device, such as the GMR memory, has advantages of nondestructive reading, high speed operation and excellent resistance against high radioactive ray pressure, permitted number of reading/writing operations of $10^{15}$ times or more and continuous operation for ten years. Thus, the semiconductor memory device of the foregoing types is able to get the DRAM market and replace all of the semiconductor memories and hard disks (HD). However, the dispersion of the IR drop and IR drop of the wiring system in the transistor portion, such as the block select transistor, occurs excessively with respect to a small amount of read signal. Thus, the operation as a large capacity memory cannot easily be performed. The method arranged to read data two times has a problem of a slow operation and encounters a critical problem if the power supply voltage is changed.

What is worse, if a magnetic layer required to manufacture a reliable LSI, having an excellent sensing sensitivity and having a high resistance change ratio (a high MR ratio) is employed, a large word line current must be supplied in the chip. If a plurality of word lines are selected, there arises a critical problem in that an excessively larger electric current consumption is required for the practical use. If the structure is formed further finely, there arises a problem in that the leaked magnetic field breaks data on the adjacent cell.

BRIEF SUMMARY OF THE INVENTION

An object of the present invention is to provide a semiconductor memory device which is capable of reducing or theoretically preventing change in IR drop in a memory for storing information in accordance with change in the resistance occurring attributable of dispersion of transistors and wiring portions which is able to stably operate even if a cell reading signal level is low, which is not considerably affect by change in the power source and which is capable of operated at high speed.

Another object of the present invention is to provide a memory device of a type for storing information in accordance with change in the magnetic resistance, capable of reducing required electric power and exhibiting excellent sensing performance.

To achieve the foregoing objects, the present invention employs the following structure:

A semiconductor memory device according to a first aspect of the present invention characterized by comprising: a plurality of word lines; a plurality of bitlines; a plurality of memory cells selectively disposed at intersections between the plural bitlines and the plural word lines and arranged to store data in accordance with change in the resistance, a plurality of sub-cell blocks formed by one of the plural memory cells or two or more memory cells in series connected in a direction of the bitline, a plurality of cell blocks formed by at least two sub-cell blocks in series connected in the direction of the bitline and a memory cell array formed by at least two cell blocks disposed in a direction of the word line; means for allowing an electric current to flow through the bitline of the plural cell blocks; and means for reading data from nodes at two ends of the sub-cell block including a memory cell selected by activating one of the plural word lines.

Preferred aspects of the present invention are as follows. Note that the following aspects may arbitrarily be combined.

(1) The plural cell blocks has a structure in which at least two sub-cell blocks and a dummy sub-cell block for use as a dummy cell are connected in series in the direction of the bitline, and the apparatus further comprises means for reading reference data from nodes at two ends of the dummy sub-cell block.

(2) The memory cell array includes a cell block for a memory and a dummy cell block for use as a dummy cell, and the apparatus further comprises means for reading reference data from nodes at two ends of a dummy sub-cell block corresponding to a selected memory cell in the dummy cell block.

(3) An end of a cell block is connected to a power supply terminal through a cell block select transistor, and another end of the same is corresponding to a ground terminal through a cell block select transistor.

(4) Data in the selected memory cell is read as the potential difference between the first and second potential differences where the first potential difference between nodes at two ends of the sub-cell block for a memory and the second potential difference between nodes at two ends of the dummy sub-cell block.

(5) The resistance level of the dummy sub-cell block is set to be an intermediate level between a resistance level of the sub-cell block when data in a selected memory cell in the sub-cell block for a memory is "0" and a resistance level of the sub-cell block when data in a selected memory cell is "1".

(6) At least either end of the cell block is connected to a power supply terminal through a cell block select transistor.

(7) The nodes at two ends of the sub-cell block are connected to a sense amplifier through a sub-cell block select transistor.

(8) The memory cell is in the form of a GMR (Giant Magneto Resistance) film.

(9) The GMR film is an exchange connection type film in which ferromagnetic layers made of Co, Ni, Fe or their alloy are connected to the two sides of a non-magnetic conductive layer made of Cu, Au, Ag, Cr or the like.

(10) The GMR film is a spin-bulb type film in which a (semi) hard magnetic layer made of CoPt or the like is connected to either side of a non-magnetic conductive layer, made of Cu, Au, Ag, Cr or the like and a soft magnetic layer made of NiFe, NiFeCo or the like is connected to another side of the same; or a spin bulb type film in which a soft magnetic layer made of NiFe, NiFeCo or the like and an inverted ferromagnetic layer made of FeMn or the like are connected to either side of a non-magnetic conductive layer made of Cu, Au, Ag, Cr or the like and a soft magnetic layer made of NiFe, NiFeCo or the like is connected to another side.

(11) The memory cell is in the form of a tunnel type GMR having a structure in which a ferromagnetic layer made of Fe or the like is connected to a non-magnetic insulation layer made of $Al_2O_2$; or a CMR (Colossal Magneto Resistance) film including Pr, Sr, Mn or O.

(12) The memory cell includes a magnetoresistance effect element.

According to the first aspect of the present invention, the data line sides extracted from the two ends of the sub-cell block are connected to a high impedance sense amplifier so that no DC current flows in the data line. Thus, IR drop occurring due to the parasitic resistance of the data line and IR drop occurring due to ON-resistance of a sub-cell block select transistor inserted between nodes at two ends between the data line and the sub-cell block can be eliminated. Therefore, the potential at the two ends of the sub-cell block can be transmitted to the sense amplifier as it is. Therefore, data can be read without an influence of noise.

Even if cell data is read by one read operation, Vnoise caused from shift of the potential occurring due to dispersion in the IR drop occurring due to dispersion of the ON-resistance of the cell block select transistor connected to an end of the bitline of the cell block and dispersion of IR drop occurring due to dispersion of the resistance of wiring between the power source and the bitline can be divided by m sub-cell blocks. Thus, when viewed from two ends of one sub-cell block, it can be reduced to Vnoise/m.

If cell data is read by one time, noise which is generated due to change in the power supply voltage is not generated. If cell data is read by a plurality of read operations, noise which is generated due to change in the power supply voltage can be reduced to 1/m.

In a case where the dummy sub-cell block is connected to the bitline in series, if the electric current which flows in the one sub-cell block is changed due to the dispersion and thus affected by noise Vnoise/m, the same electric current flows in the dummy sub-cell block. Therefore, the same noise Vnoise/m acts. Thus, the sense amplifier obtains the difference so that Vnoise/m is theoretically canceled.

The memory cell for storing data by using change in the resistance according to the first aspect of the present invention may be a device for storing data by using change in the resistance of an infrared sensor, such as a bolometer, as well as the magnetoresistance effect film, such as the GMR film.

Another semiconductor memory device according to the first aspect of the present invention is characterized by comprising: a plurality of first word lines; a plurality of second word lines; a plurality of memory cells each including a magnetoresistance effect device and the first word line which applies magnetic field to the magnetoresistance effect device to store data in accordance with change in the resistance and a cell transistor whose gate is the second word line connected in parallel to the magnetoresistance effect device and a plurality of memory cell block which consist at least two memory cells being in series connected; and at least one block select transistor for connecting at least one cell block to a power supply terminal.

According to another semiconductor memory device according to the first aspect of the present invention, a problem experienced with a structure in which a tunnel type GMR cell or the like having a very high resistance of the magnetoresistance effect is employed to form a structure in which one cell is formed by one transistor/one GMR device, in that the GMR device and the transistor are connected in parallel and they are connected in series encounters a difficulty in that the cell size cannot be reduced to $8F^2$ size or smaller as the DRAM can be overcome. Thus, a GMR cell having a size of $4F^2$ permitting for a planar transistor to perform random access can be realized.

As described above, the first aspect of the present invention is structured such that data is read from nodes at two ends of a sub-cell block formed by, in series, connecting memory cell, which stores data by using change in the resistance realized by the magnetoresistance effect, in the direction of the bitline. Therefore, change in the IR drop occurring due to dispersion of transistors and wiring portions can be reduced or theoretically prevented. Thus, a semiconductor memory device can be realized which is able to stably operate even if the cell reading signal is small, which cannot easily be affected by change in the power source and which is capable of operating at high speed.

A structure in which the magnetoresistance effect device and cell transistors are connected in parallel to form the memory cells, a plurality of the memory cells are, in series, connected in the direction of the bitline and the cell block is connected to the bitline through the block select transistor, similarly to the above-mentioned structure, change in the IR drop occurring due to the dispersion of the transistors and the wiring portions can be reduced or theoretically prevented. Thus, a semiconductor memory device can be realized which is able to stably operate even if the cell reading signal is small, which cannot easily be affected by change in the power source and which is capable of operating at high speed.

A semiconductor memory device according to a second aspect of the present invention is characterized by comprising: a plurality of bitlines; a plurality of word lines disposed to intersect the plural bitlines; and a plurality of memory cells selectively disposed at intersections between the plural bitlines and the plural word lines and having a magnetoresistance effect film in series connected to the plural bitlines, wherein the plural word lines include at least two word line layers and the word line layers are connected in series or arranged to be supplied with an electric current from the same electric current source.

Preferred structures are as follows:

(1) At least two word line layers are formed at least above or below the magnetoresistance effect film, when the at least two word line layers are formed above the magnetoresistance effect film or below the same, electric currents flow in the at least two word line layers in the same direction, when the at least two word line layers are formed above the magnetoresistance effect film and below the same, a direction in which an electric current flows in the word line layer formed above the magnetoresistance effect film and a direction in which an electric current flows in the word line layer formed below the magnetoresistance effect film are opposite to each other.

(2) The at least two word line layers includes a first word line layer formed above the magnetoresistance effect film and a second word line layer formed below the magnetoresistance effect film, and the first and second word line layers are connected to each other at an end of a cell array disposed in the direction of the word line.

(3) The plural word lines formed by the first word line layer and the second word line layer are alternately connected to a word line driving circuit at two ends of the cell array.

(4) A first word line layer is formed above the magnetoresistance effect film, a second word line layer is formed above the first word line layer, a third word line layer is formed below the magnetoresistance effect film, a four word line layer is formed below the third word line layer, the first word line layer and the fourth word line layer are connected to each other at an end of the cell array, and the second word line layer and the fourth word line layer are connected to each other at another end of the cell array.

According to the second aspect of the present invention, the magnetoresistance effect is affected by a synthesized magnetic field generated by electric currents in a plurality of word line layers of word lines in a plurality of layers. Therefore, a large magnetic field substantially in proportion to the number of word line layers can be obtained as compared with a conventional memory device using a magnetoresistance effect film using one layer of word line. The plural word line layers are connected in series by using cell ends or the like. Moreover, electric currents supplied from the same electric current source are used. Thus, a large synthesized magnetic field can be generated in proportion to the number of layers of the word lines with substantially the same quantity of the electric current required for the conventional memory device. Therefore, a high magnetoresistance change rate can be realized with a small electric current required for the chip.

Another semiconductor memory device according to the second aspect of the present invention is characterized by comprising: a plurality of bitlines; a plurality of word lines intersecting the plural bitlines; a plurality of word line driving circuits for driving the plural word lines; a plurality of memory cells selectively formed at intersections between the plural bitlines and the plural word lines and having at least one magnetoresistance effect film in series connected to the plural bitlines; a first power supply source for, at an end of a cell array in a direction of the word line, a potential lower than the potential at another end to the plural word lines; and a second power supply line connected to the first power supply line and arranged at an end of another cell array, and supply a potential higher than the potential at another end to the plural word lines.

The above-mentioned structure is formed such that a plurality of magnetoresistance effect films are formed into an array shape between plural word line layers. Thus, word lines opposite to each other across the magnetoresistance effect film are supplied with electric currents which flow in opposite directions. When the power sources for the plural word line driving circuits for different cell arrays are connected in series, the electric current consumption is not enlarged even if the word lines of plural cell arrays are simultaneously operated. Thus, the overall electric power consumption for the plural cell arrays can be reduced.

Another semiconductor memory device according to the second aspect of the present invention is characterized by comprising: a plurality of bitlines; a plurality of word lines intersecting the plural bitlines; a plurality of word line driving circuits for driving the plural word lines; a plurality of memory cells selective formed at intersections between the plurality bitlines and the plural word lines and having a plurality of magnetoresistance effect films in series connected to the plural bitlines; a first power supply line for supplying, to an end of the bitline in the cell array, a potential lower than the potential at another end; and a second power supply line connected to the first power supply line and arranged to supply, to an end of the bitline in another cell array, a potential higher than the potential at another end.

According to the structure of this aspect of the invention in which the power sources of the bitline drive circuits for different cell arrays are connected in series. Thus, even if bitline of a plurality of cell arrays are simultaneously operated, the electric current consumption is not enlarged. Thus, the electric power consumption for the chip can be reduced.

Another semiconductor memory device according to the second aspect of the present invention is characterized by comprising: a plurality bitlines; a plurality word lines intersecting the plural bitlines; a plurality of word line driving circuits for driving the plural word lines; a plurality of memory cells selective formed at intersections between the plural bitlines and the plural word lines and having a magnetoresistance effect film in series connected to the plural bitlines; and a wiring formed between the plural word lines, in which selective positive currents flow, and the plural word lines adjacent to the plural word lines, the wiring being arranged to be supplied with an opposite current lower than the positive current.

According to the foregoing structure, the magnetic field, which flows in the selected word line, is able to weaken the influence of the leaked magnetic field on the adjacent memory cell by supplying an electric current to a control line disposed between word lines in a direction opposite to the direction of the selected word line to generate a magnetic field in a direction in which the leaked magnetic field is weakened.

Another semiconductor memory device according to the second aspect of the present invention is characterized by comprising: a plurality of bitlines; a plurality of word lines intersecting the plural bit-lines; a plurality of word line driving circuits for driving the plural word lines; and a plurality of memory cells formed in regions at which the plural bitlines and the plural word lines intersect and having a magnetoresistance effect film in series connected to the plural bitlines, wherein opposite currents flow in the plural word lines adjacent to the plural word lines in which selective positive currents flow, the opposite currents being smaller than the positive currents.

According to the above-mentioned structure, the magnetic field, which flows in the selected word line, is able to weaken the influence of the leaked magnetic field on the adjacent memory cell by supplying a small electric current to an adjacent word line in a direction opposite to the direction of the selected word line to generate a magnetic field in a direction in which the leaked magnetic field is weakened.

The distance from the word line to the magnetoresistance effect film can be shortened as compared with the conventional structure. The present invention can preferably be employed in a structure in which a material capable of realizing a high change ratio of the magnetoresistance and which consumes a large electric current is attempted to be employed. A GMR film is exemplified. An exchange connection GMR film is a film in which ferromagnetic layers made of Co, Ni, Ferromagnetic layer or their alloy are formed vertically across a non-magnetic conductive layer made of Cu, Au, Ag, Cr or the like. A spin-bulb GMR film is a film in which a (semi) hard magnetic layer made of CoPt or the like is formed adjacent to either side of a non-magnetic conductive layer made of Cu, Au, Ag, Cr or the like and a soft magnetic layer made of NiFe, NiFeCo or the like is formed on the other side of the same. Another spin-bulb GMR film has a structure in which a soft magnetic layer made of NiFe, NiFeCo or the like and an inverted ferromagnetic layer made of FeMn are formed on either side of non-magnetic conductive layer made of Cu, Au, Ag, Cr or the like and a soft magnetic layer made of NiFe, NiFeCo is formed on the other side of the same. Moreover, a tunnel type GMR film having a ferromagnetic layers made of Fe or the like formed on the two sides of a non-magnetic insulation layer made of $Al_2O_2$ may be employed. Also a CMR (Colossal Magneto Resistive) film containing Pr, Sr, Mn or O may be employed.

The present invention enables a non-volatile memory for storing information by using change in the magnetic resistance to realize small word line current and a high change ratio of the magnetoresistance effect with a small chip current. Thus, reduction in the electric power consumption and improvement in the sensing performance can be realized. If the structure is fined, data breakage can be prevented.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B are a plan view and a cross sectional view showing the structure of a cell of a conventional GMR memory:

FIGS. 2A to 2C are schematic views showing the operation mechanism of the conventional GMR memory;

FIG. 6 is a circuit diagram showing a cell block of a GMR memory according to a first embodiment;

FIG. 9 is a circuit diagram showing a cell block of a GMR memory according to a fourth embodiment;

FIG. 12 is a circuit diagram showing a cell block of a GMR memory according to a seventh embodiment;

FIG. 13 is a circuit diagram showing a cell block of a GMR memory according to an eighth embodiment;

FIG. 14 is a circuit diagram showing a cell block of a GMR memory according to a ninth embodiment;

FIG. 29 is a circuit diagram showing a sense amplifier portion of a GMR memory according to a sixteenth embodiment;

FIG. 30 is a signal waveform graph showing an example of the operation of the sixteenth embodiment;

FIG. 32 is a signal waveform graph showing an example of the operation of the seventeenth embodiment;

FIGS. 34A and 34B are an equivalent circuit diagram and a cross sectional view showing the structure of a cell block of a GMR memory according to a nineteenth embodiment;

FIGS. 35A and 35B are an equivalent circuit diagram and a cross sectional view showing the structure of a cell block of a GMR memory according to a twentieth embodiment;

FIG. 44 is a structural view showing wiring of bitlines of a plurality of cell arrays, a sense amplifier circuit and a bitline current generating circuit;

DETAILED DESCRIPTION OF THE INVENTION

Figure 3A:
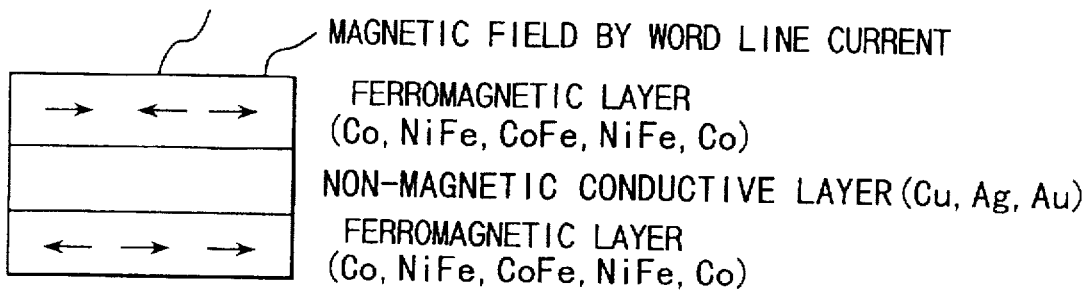
FIGS. 3A to 3C are schematic views showing examples of the structures of various cells of the conventional GMR memory.
Figure 3B:
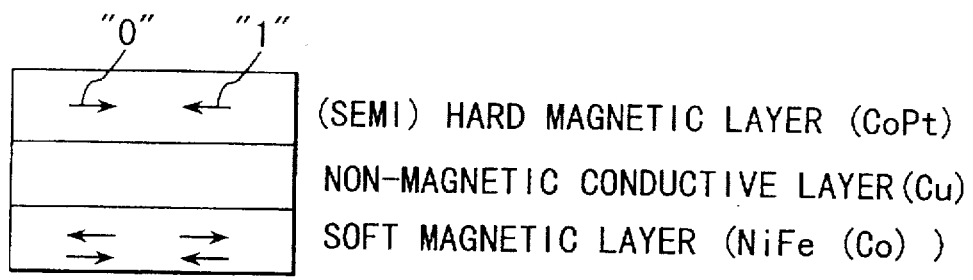
Figure 3C:
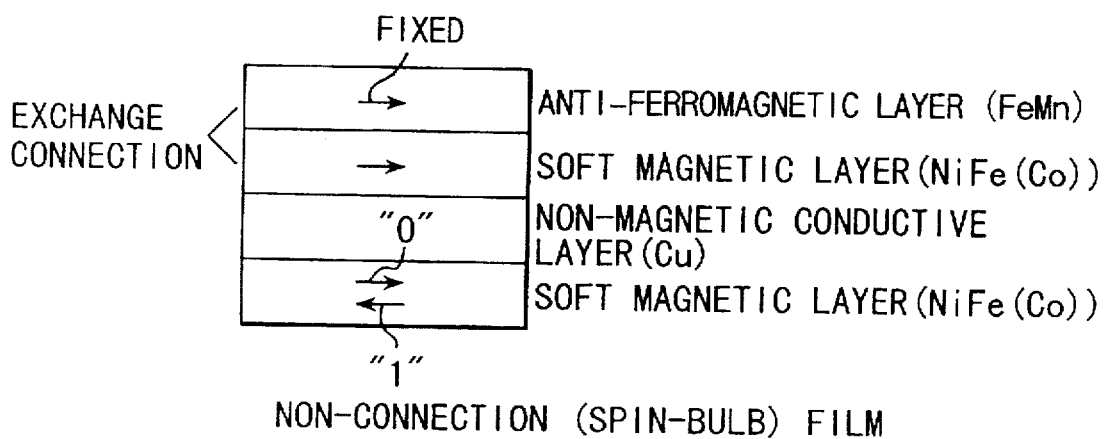
Figure 4:
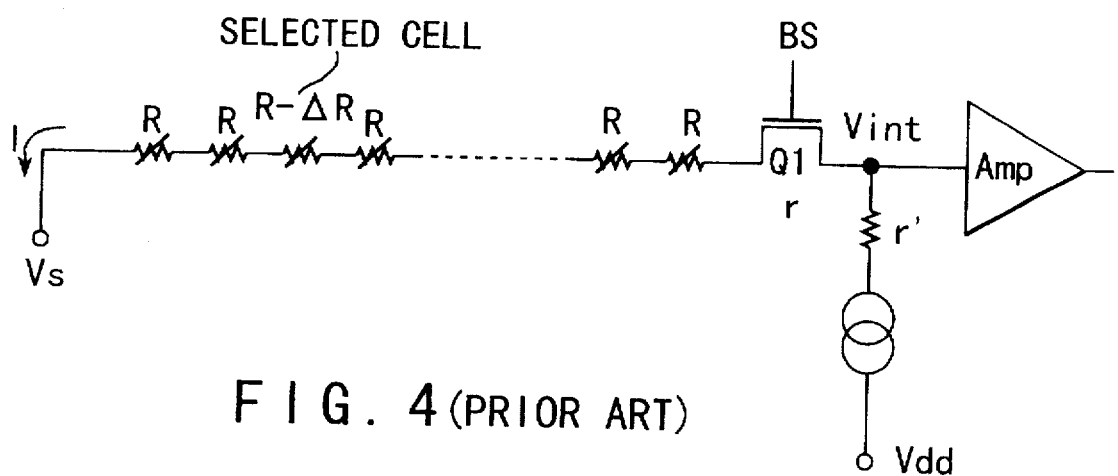
FIG. 4 is a circuit diagram showing a cell block of a conventional GMR memory.
Figure 5:
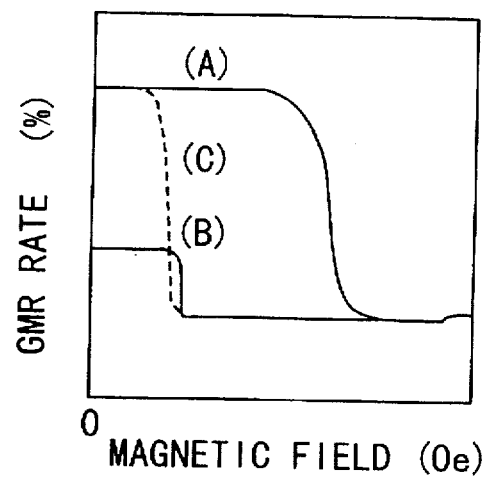
FIG. 5 is a graph showing the relationship between the magnetic field and the change ratio of MR.

Referring to the drawings, embodiments of the present invention will now be described.

(First Embodiment)

FIG. 6 is a circuit diagram showing a semiconductor memory device according to a first embodiment of the present invention. FIG. 6 shows one cell block of a cell array portion of a GMR memory for storing "1" and "0" data items. As magnetoresistance effect device, a structure having a GMR (Giant Magneto Resistance) film composed of a ferromagnetic layer/non-magnetic conductive layer/ferromagnetic layer, having a magnetoresistance effect and formed adjacent to the bitline in the intersection between the bitline and the word line formed above the bitline.

In order to simplify the illustration in FIG. 6, one memory cell is indicated with the symbol indicating resistance having a diagonal line because the resistance of the bitline is changed attributable to the magnetoresistance effect. Word lines are omitted in FIG. 6. The resistance of the bitline in a case where spins in the upper and lower layers of one cell are inverted is R, while the resistance in a case where the directions of the spins are the same is $(R-\Delta R)$.

The structure shown in FIG. 6 comprises four memory connected in series so that a sub-cell block for a memory is formed. Similarly, four dummy cells are connected in series so that a dummy sub-cell block is formed. A cell block is formed by, in series, connecting a block select transistor (Q1) to a structure formed by, in series, connecting n sub-cell blocks for the memory and one dummy sub-cell block. Voltage is applied to Vint and Vs at the two ends of the cell block connected in series so that an electric current is supplied to the bitline. Although omitted from illustration, a plurality of cell blocks are disposed in the direction of the word line, a memory cell array is formed.

An end (Vs) of the above-mentioned structure is grounded and potential Vcc is applied to another end so that the block select transistor (Q1) is turned on to supply an electric current to the bitline. Data is read through the data line. That is, data is read to the data lines (DL0 to DLn) from the nodes at the two ends of the sub-cell block for the memory through the transistors Q3 to Q7. Similarly, reference data on the dummy cell is read from the nodes at the two ends of the dummy sub-cell block to the dummy data lines (DDL0 and DDL1) through transistors Q1 and Q2. At this time, the dummy data lines DDL1 and DL0 are shared.

When a read operation is performed such that, for example, "1" data item is read, the resistance of the selected cell and the other non-selected cell is R. When "0" data item is read, the resistance of the selected cell is $(R-\Delta R)$ and the resistance of the other non-selected cell is R. In the dummy sub-cell block, the resistance of one of the four cells is set to be $(R-\Delta R/2)$ which is half of "1" data item and "0" data item, while the resistance of the other cells is set to be R.

Another method may be employed in which all of the four dummy cells are set to be $(R-\Delta R/8)$. Since the overall resistance of the dummy sub-cell block is required to be $4R-\Delta R/2$, use of all of the four dummy cells is not required. The resistance of one dummy cell may be substituted for the overall resistance.

Assuming that the electric current, which is supplied to the bitline after voltage has been applied between Vint and Vs is I, the potential difference (DL2–DL1) of the data lines connected to the two ends of the sub-cell block for the memory including the selected cell is 4RI when "1" data item is read. When "0" data item is read, the potential difference is $(4R-\Delta R)$ I. The potential difference (DDL1–DDL0) is $(4R-\Delta R/2)$I. Therefore, the difference between the potential difference between data lines and potential difference between dummy data lines on the sense amplifier side, that is read signal Vout={(DL2–DL1)–(DDL1–DDL0)} is $+\Delta RI/2$ When "1" data item is read. When "0" data item is read, Vout is $-\Delta RI/2$. By amplifying the foregoing results, "1" and "0" data items can be read.

The present GMR memory has a low change rate of $\Delta R/R$ of the resistance of 5% to 30% and low Vout of $\pm 5$ mV to $\pm 10$ mV. When the read signal level is low as described above, generation of intense noise in the cell array inhibits accurate reading of data.

An assumption is made that IR drop has been generated in the block select transistor attributable to the ON-resistance (r) of the block select transistor caused from the electric current I supplied to the bitline as the noise source. For example, when the number of series cells=16, the number of series dummy cells=4, R=100 Ω, $\Delta R$=10 Ω, r=625 Ω and Vint=2 V, I=2 V/(100×20+625) Ω=0.76 mA and output Vout=I×$\Delta R$/2=±3.8 mV. On the other hand, a potential of I×r=0.48 is applied between the source and drain of the block select transistor. Assuming that the dispersion in the ON-resistance is ±10%, the voltage between the source and drain of the block select transistor is considerably changed by ±48 mV.

However, this embodiment is theoretically capable of completely canceling noise. The data lines (DL0 to DLn and DDL0 to DDL1) extracted from the two ends of the sub-cell block are connected to a high impedance sense amplifier so that supply of DC current to the data line is inhibited. Thus, IR drop occurring attributable to a parasitic resistance (r") of the data line and IR drop occurring due to the ON-resistance of the sub-cell block select transistors (Q2 to Q7) inserted between the data line and the nodes at the two ends of the sub-cell block can be eliminated. As a result, the potential at the two ends of the sub-cell block can be transmitted to the sense amplifier as it is. Thus, noise can be canceled.

Even if the cell data is read by one read operation, dispersion noise Vnoise of IR drop occurring due to the above-mentioned dispersion of the ON-resistance of ±48 mV of the cell block select transistor connected to the end of the bitline of the cell block can be divided by n sub-cell blocks. When the noise is observed at two ends of one sub-cell block, it can be reduced to Vnoise/n. Since also the dummy sub-cell block is, in series, connected to the bitline, the same electric current flows in the dummy sub-cell block even if noise Vnoise/n acts due to change in the electric current which flows in the one sub-cell block attributable to the dispersion. Therefore, the difference between the potential difference between the data lines and the potential difference between the dummy data lines, that is, the read signal Vout ={(DL2−DL1)−(DDL1−DDL0)} is obtained on the sense amplifier side so that the difference of the two Vnoise/n is obtained. Thus, noise Vnoise/n can theoretically be canceled.

Similarly, the problem experienced with the conventional GMR memory that the potential disperses attributable to the dispersion of IR drop occurring due to the dispersion of the parasitic resistance of the wiring between the power source and the bitline can be overcome by this embodiment because the dispersion can be canceled. Since cell data is read by one time in this embodiment, noise occurring when the power supply voltage is changed is not generated. Even if cell data is read by a plurality of read operations, noise occurring when Vint is changed attributable to change in the power supply voltage can be canceled. Thus, noise can theoretically be canceled.

Although omitted in the description of this embodiment, data can, as a matter of course, be read/written by using the synthesized magnetic field of the word line and the bitline. Moreover, data may be read/written by using the synthesized magnetic field of the column line perpendicular to the word line and the word line.

(Second Embodiment)

Figures 7A, 7B:
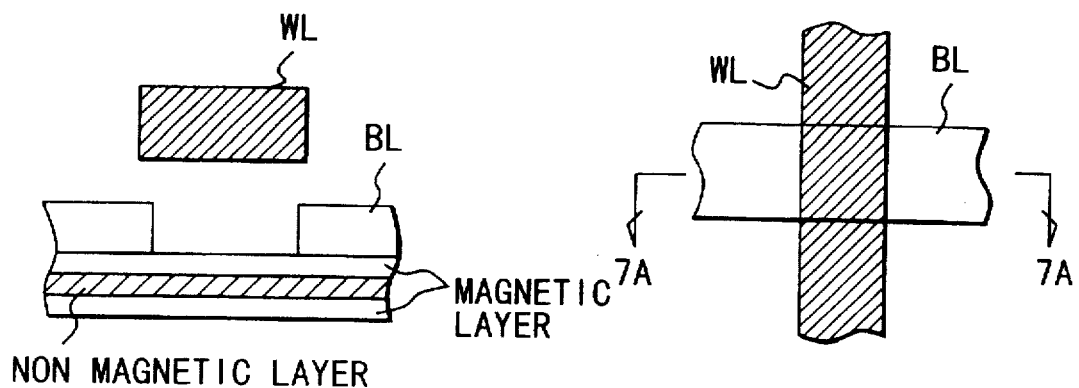
FIGS. 7A and 7B are a cross sectional view and a plan view showing the structure of a cell of a GMR memory according to a second embodiment.

FIGS. 7A and 7B are diagrams showing an example of the structure of a cell of a GMR memory according to a second embodiment of the present invention. The illustrated memory cell may be applied to all of the cell blocks according to the present invention. FIG. 7A is a cross sectional view taken along line 1A—1A shown in FIG. 7B. FIG. 7B is a plan view.

In this embodiment, the exchange connection structure is employed as the magnetoresistance effect film which comprises the GMR (Giant Magneto Resistance) film such that ferromagnetic layers made of Co, Ni, Fe or their alloy are connected to the two sides of a non-magnetic conductive layer made of Cu, Au, Ag or Cr.

The structure is not limited to this. For example, a spin-bulb structure may be employed in which (semi) hard magnetic layer made of, for example, CoPt is connected to either side of the non-magnetic conductive layer made of Cu, Au, Ag, or Cr and a soft magnetic layer made of NiFe or NiFeCo is connected to another side. Another spin-bulb structure may be employed in which a soft magnetic layer made of NiFe or NiFeCo and an inverse ferromagnetic layer made of FeMn or the like are connected to either side of the non-magnetic conductive layer made of Cu, Au, Ag or Cr and a soft magnetic layer made of NiFe or NiFeCo is connected to another side.

(Third Embodiment)

Figure 8A:
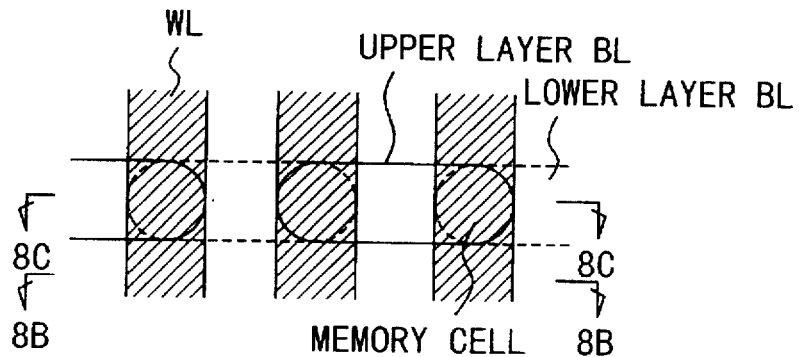
FIGS. 8A to 8C are a cross sectional view and a plan view showing the structure of a cell of a GMR memory according to a third embodiment.
Figure 8B:
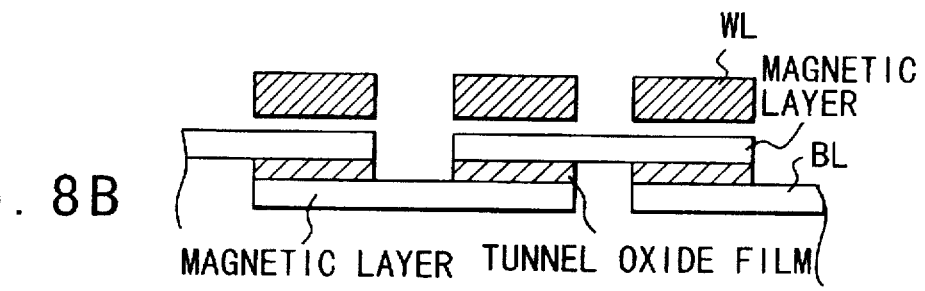
Figure 8C:
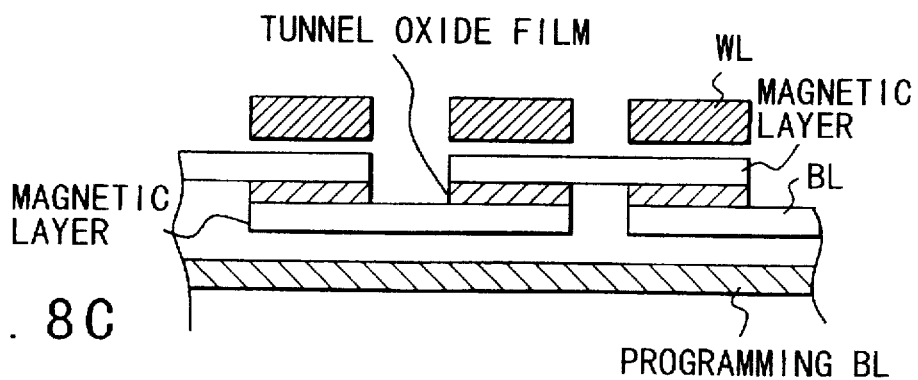

FIGS. 8A to 8C are diagrams showing an example of a GMR memory according to a third embodiment of the present invention. The illustrated memory cell may be applied to all of cell blocks according to the present invention. FIG. 8A is a plan view, FIG. 8B is a cross sectional view taken along line 8B—8B shown in FIG. 8A, and FIG. 8C is a cross sectional view taken along line 8C—8C shown in FIG. 8A.

In this embodiment, a tunnel type GMR is employed in which ferromagnetic layers made of Co, Fe or Ni are connected to the two sides of a non-ferromagnetic insulation layer made of $Al_2O_3$ or the like. The word line WL may be formed below the tunnel type GMR, or a column line perpendicular to the word line WL may be formed in addition to the WL so as to read/write data by their synthesized magnetic field. Moreover, a memory cell in the form of a CMR (Colossal Magneto Resistance) film containing Pr, Sr, Mn, O or the like may be employed.

(Fourth Embodiment)

FIG. 9 is a circuit diagram showing a semiconductor memory device according to a fourth embodiment of the present invention. FIG. 9 shows a cell block of a GMR memory. This embodiment is different from the first embodiment shown in FIG. 6 in that the number of the series cells in the sub-cell block is two. The other structures are the same as those according to the first embodiment.

Although the difference between data lines (DLk−DLk-1)(k=1, 2, . . . , n) is 4RI in the first embodiment, the difference between the data lines is 2RI in this embodiment. Thus, the value (read signal)/(difference between data lines) can be enlarged and therefore a great margin can be obtained in the sensing operation.

(Fifth Embodiment)

Figure 10:
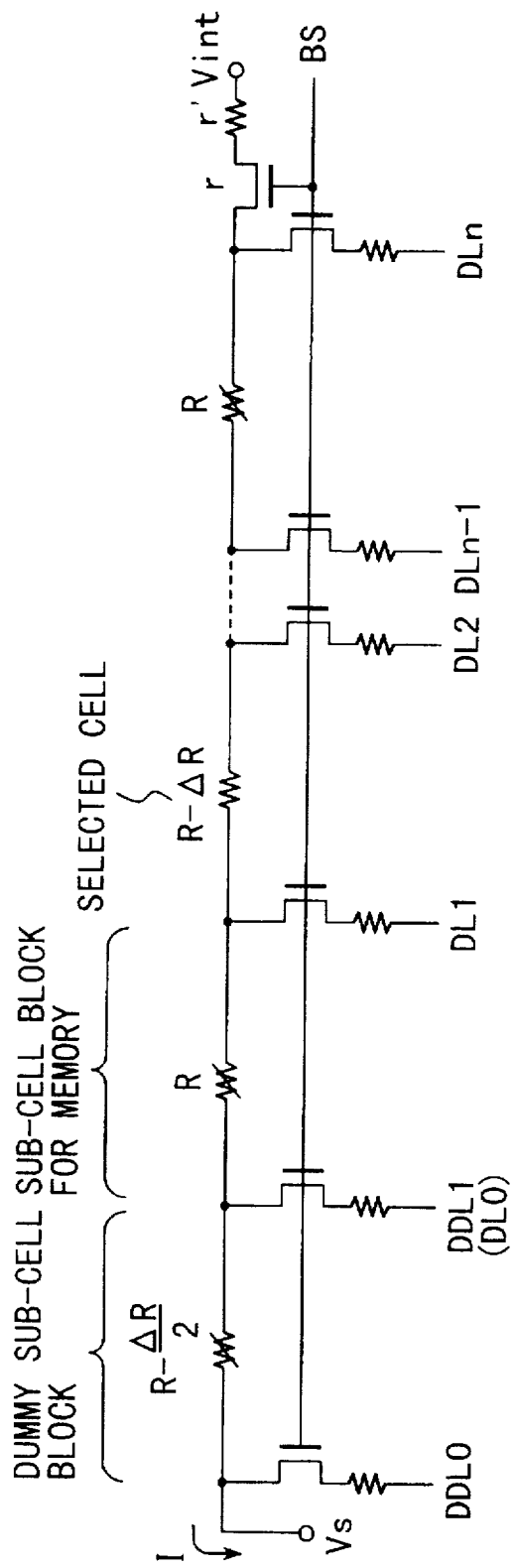
FIG. 10 is a circuit diagram showing a cell block of a GMR memory according to a fifth embodiment.

FIG. 10 is a circuit diagram showing a semiconductor memory device according to a fifth embodiment of the present invention. FIG. 10 shows a cell block of a GMR memory. This embodiment is different from the first embodiment shown in FIG. 6 in that the number of the series cell in the sub-cell block is one. Also this embodiment attains the same effect obtainable from the first embodiment.

Although the difference between data lines (DLk−DLk-1)(k=1, 2, . . . , n) is 4RI in the first embodiment, the difference between the data lines is RI in this embodiment. Thus, the value (read signal)/(difference between data lines) can be enlarged and therefore a great margin can be obtained in the sensing operation.

(Sixth Embodiment)

Figure 11:
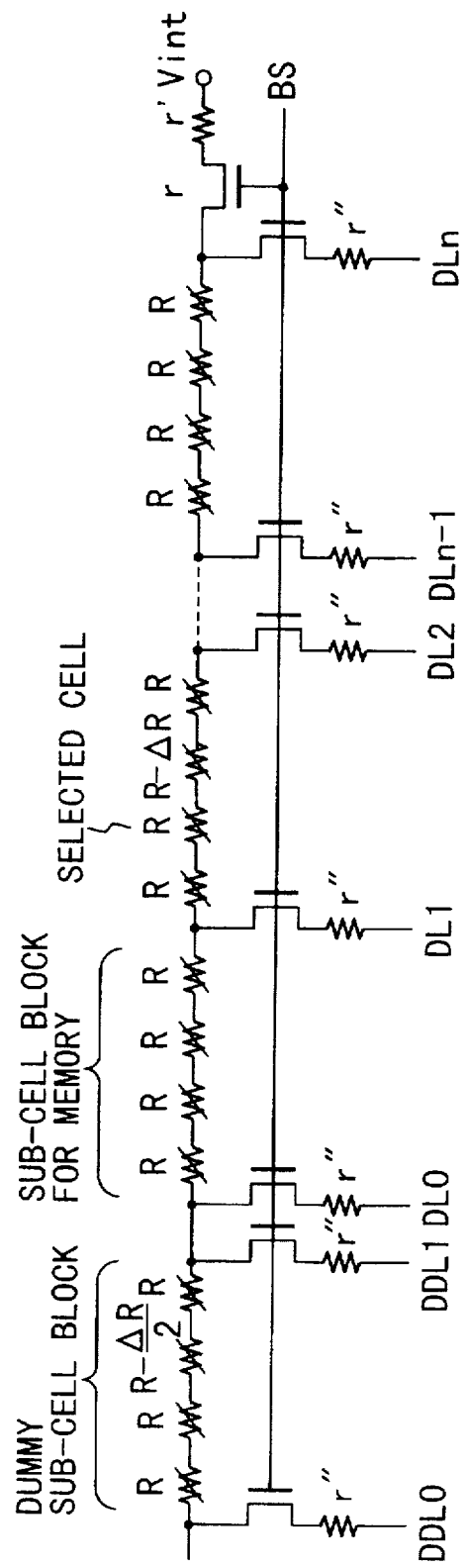
FIG. 11 is a circuit diagram showing a cell block of a GMR memory according to a sixth embodiment.

FIG. 11 is a circuit diagram showing a semiconductor memory device according to a sixth embodiment of the present invention. FIG. 11 shows a cell block of a GMR memory.

This embodiment is different from the first embodiment shown in FIG. 6 in that the dummy data line DDL1 and the data line DL0 are not shared and they are independently provided. Also this embodiment attains a similar effect to that obtainable from the first embodiment.

(Seventh Embodiment)

FIG. 12 is a circuit diagram showing a semiconductor memory device according to a seventh embodiment of the present invention. FIG. 12 shows a cell block of a GMR memory. This embodiment is different from the first embodiment shown in FIG. 6 in that the dummy sub-cell block is disposed in the central portion of the sub-cell block for the memory in place of the end portion of the same.

As a matter of course, the above-mentioned structure attains an effect similar to that obtainable from the first embodiment and the following effects are obtained additionally.

That is, the comparison between the potential, which appears on the data line DL and the potential, which appears on the dummy data line DDL is performed with a reduced amount of the shift. Thus, coupling noise, which is generated due to the parasitic capacitance when the SET signal operation during the sense amplifying operation can be halved. The foregoing effect will be described later.

(Eighth Embodiment)

FIG. 13 is a circuit diagram showing a semiconductor memory device according to an eighth embodiment of the present invention. FIG. 13 shows a cell block of a GMR memory.

This embodiment is different from the first embodiment shown in FIG. 6 in that the dummy sub-cell block connected in series is omitted and thus a cell block for the memory composed of only the memory cells is formed. Although omitted from the illustration, a dummy sub-cell block formed by, in series, connecting a plurality of dummy cells is formed individually from the cell block for the memory. Moreover, the dummy sub-cell blocks are connected in series so that a dummy cell block is formed. In this case, the following effects can be obtained.

The data lines (DL0 to DLn and DDL0 to DDL1) extracted from the two ends of the sub-cell block for the memory are connected to a high impedance sense amplifier so that supply of DC current to the data line is inhibited. Thus, IR drop occurring attributable to a parasitic resistance (r") of the data line and IR drop occurring due to the ON-resistance of the sub-cell block select transistors (Q2 to Q7) inserted between the data line and the nodes at the two ends of the sub-cell block can be eliminated. As a result, the potential at the two ends of the sub-cell block can be transmitted to the sense amplifier as it is. Thus, noise can be canceled.

Even if the cell data is read by one read operation, dispersion noise Vnoise of IR drop occurring due to the above-mentioned dispersion of the ON-resistance of ±48 mV of the cell block select transistor connected to the end of the bitline of the cell block can be divided by n sub-cell blocks. When the noise is observed at two ends of one sub-cell block, it can be reduced to Vnoise/n.

(Ninth Embodiment)

FIG. 14 is a circuit diagram showing a semiconductor memory device according to a ninth embodiment of the present invention. FIG. 14 shows the structure of a cell array in a GMR memory adaptable to the eighth embodiment shown in FIG. 13.

A dummy cell block side dummy data line having the same structure as that of the cell of the cell block for the memory is connected to a sense amplifier (AMP) connected to memory cell block side data line. The AMP subjects the memory cell block side data line and dummy cell block side dummy data line to a comparison to determine whether data is "1" data item or "0" data item. The dummy cell blocks may be disposed opposite to each other across the AMP or disposed on the same side.

(Tenth Embodiment)

Figure 15:
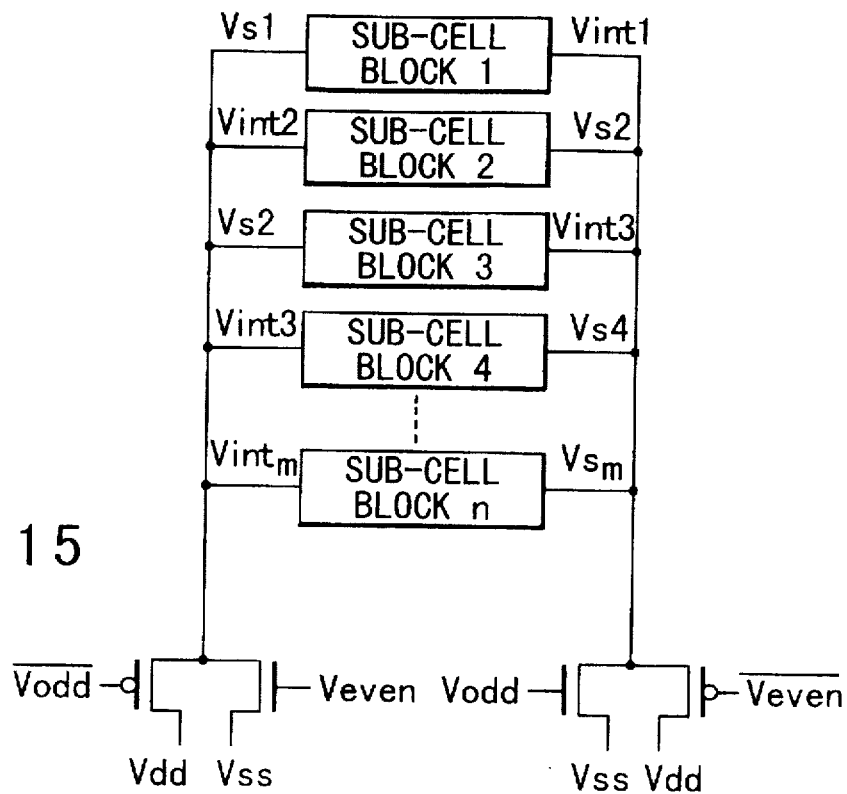
FIG. 15 is a circuit diagram showing a cell array of a GMR memory according to a tenth embodiment.

FIG. 15 is a circuit diagram showing a semiconductor memory device according to a tenth embodiment of the present invention. FIG. 15 shows the structure of the cell array of a GMR memory.

In this embodiment, the directions of the cell blocks shown in FIGS. 6 and 9 to 13 are alternately inverted. The potentials of Vint and Vs are inverted between writing of "1" data item and writing of "0" data item. When data is read, the block select transistor may be disposed on the right-hand side or the left-hand side with respect to the series cells, as shown in FIG. 6. In response to Odd signal and Even signal, the positions of Vint and Vs are switched.

(Eleventh Embodiment)

Figure 16:
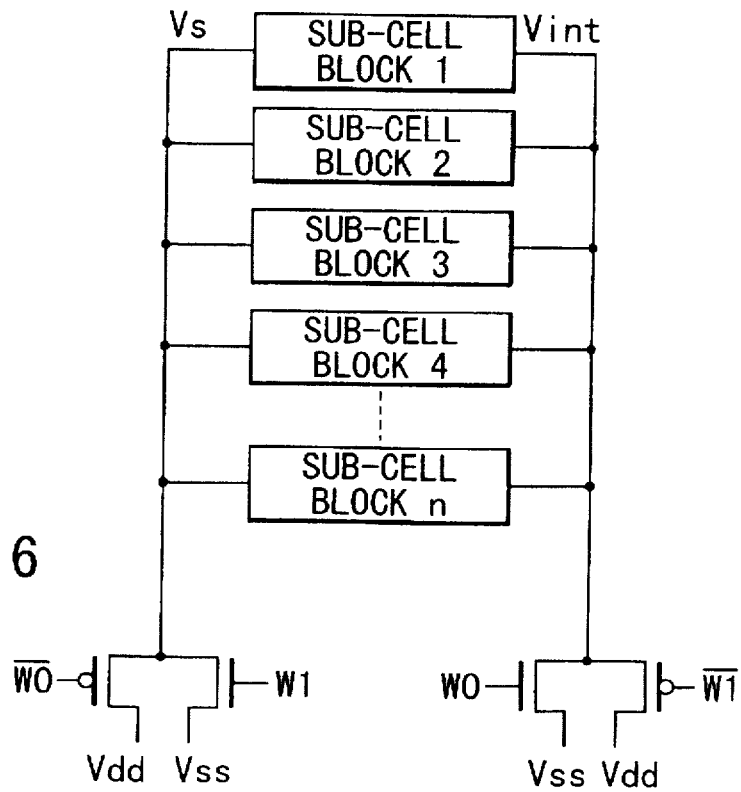
FIG. 16 is a circuit diagram showing a cell array of a GMR memory according to an eleventh embodiment.

FIG. 16 is a circuit diagram showing a semiconductor memory device according to an eleventh embodiment of the present invention. FIG. 16 shows the structure of a cell array of a GMR memory.

This embodiment is different from the tenth embodiment shown in FIG. 15 in that all of the cell blocks shown in FIGS. 6 and 9 to 13 are disposed in the same direction. When "1" data item is written and "0" data item is written, the relationship of the potentials of Vint and Vs can be inverted by using signals /W0, W0 and /W1 and W1.

(Twelfth Embodiment)

Figure 17A:
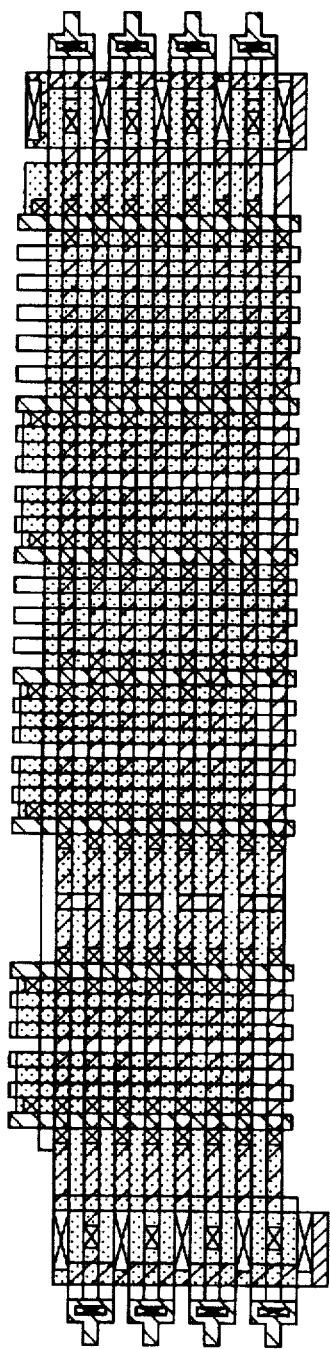
FIGS. 17A to 17C are diagrams showing a layout of pattern disposition in a GMR memory according to a twelfth embodiment.
Figure 17B:
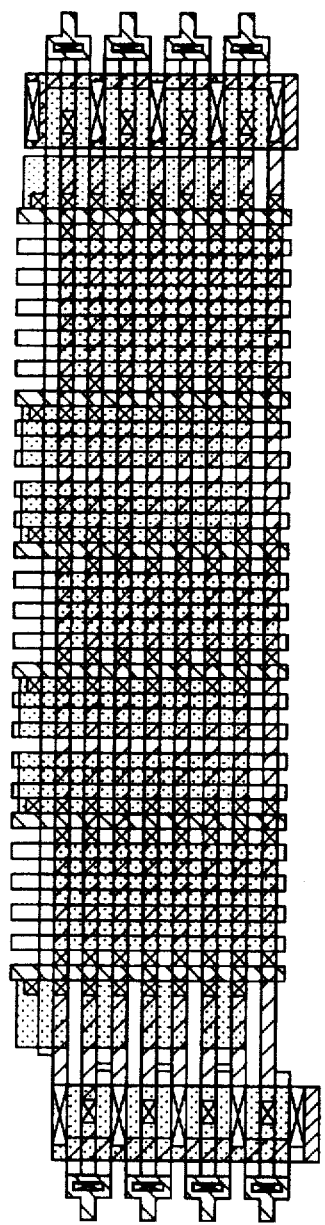
Figure 17C:
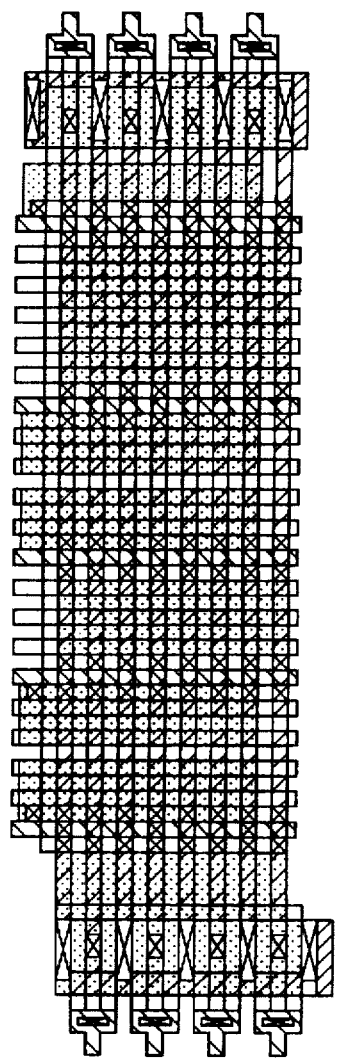

FIGS. 17A to 17C are diagrams showing a semiconductor memory device according to a twelfth embodiment of the present invention. FIGS. 17A to 17C show the layout of a GMR memory, in particular, bitlines, a word line layer, a data line layer, an active area layer, a gate layer, a contact between the bitline and active area and contact between the bitline and the active area.

FIG. 17A shows the layout corresponding to FIG. 11, in which the number of cells in the sub-cell block is such that m=4 and the number of sub-cell blocks in the cell block is such that n=4. As shown in FIG. 15, the block select transistors are alternately connected to the right-hand side and the left-hand side when viewed from an upper position.

FIG. 17B shows the layout corresponding to FIG. 6 or 12, in which the number of cells in the sub-cell block is such that m=4 and the number of sub-cell blocks in the cell block is such that n=4. As shown in FIG. 15, the block select transistors are alternately connected to the right-hand side and the left-hand side when viewed from an upper position.

FIG. 17C shows the layout corresponding to FIG. 13, in which the number of cells in the sub-cell block is such that m=4 and the number of sub-cell blocks in the cell block is such that n=4. As shown in FIG. 15, the block select transistors are alternately connected to the right-hand side and the left-hand side when viewed from an upper position.

Since the number of cells in the sub-cell block is such that m=4, the average size of the cells is $5F^2$. Symbol F indicates a shortest wiring length.

19

Figures 18A, 18B, 18C:
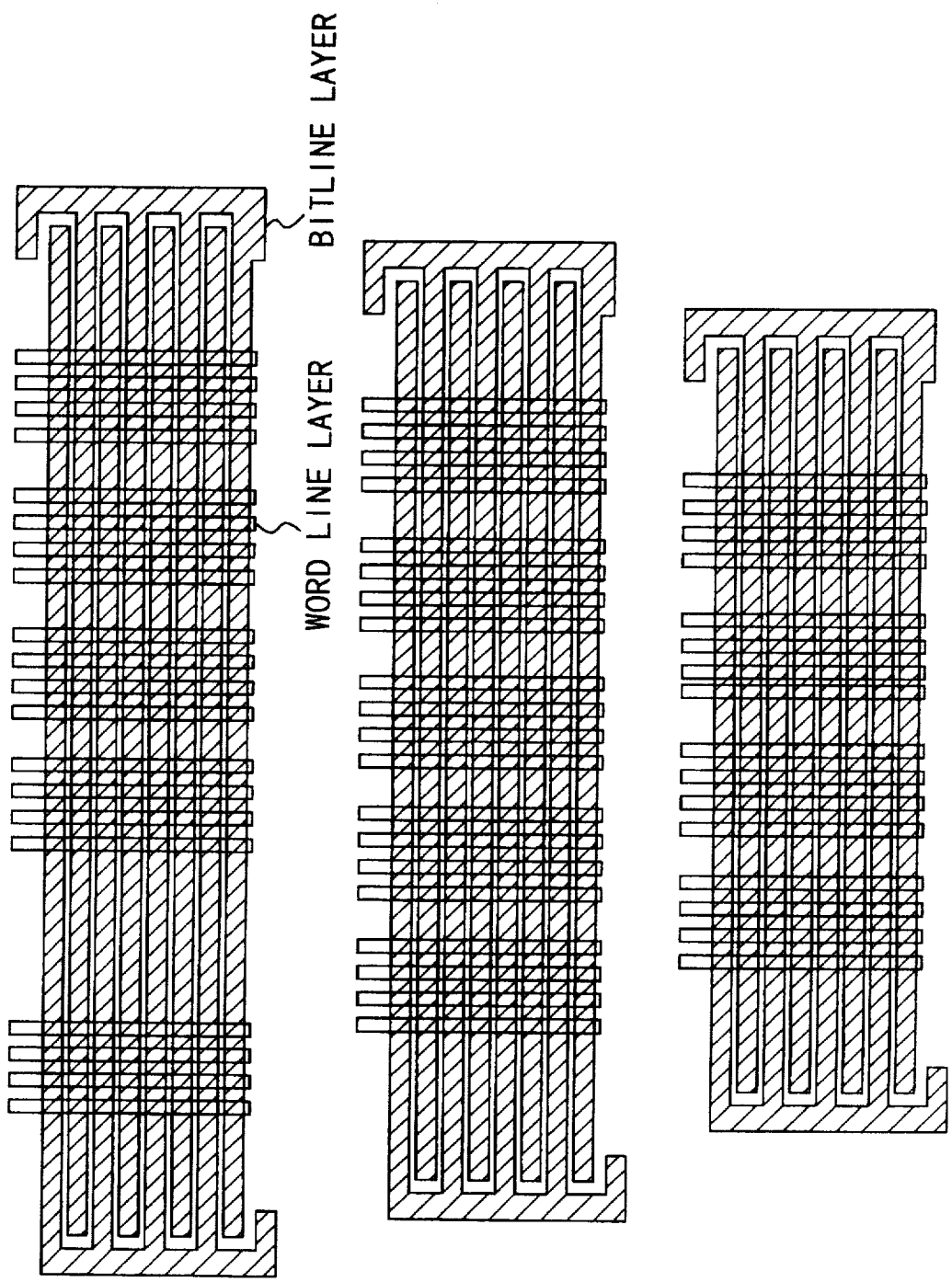
FIGS. 18A to 18C are diagrams showing a layout of a portion of layers according to the twelfth embodiment.
Figure 19A:
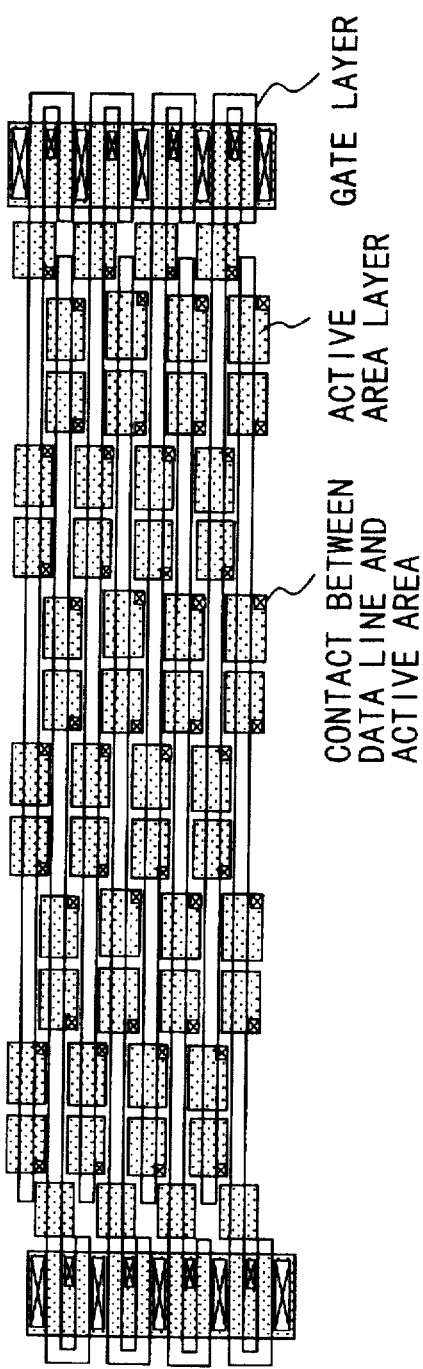
FIGS. 19A to 19C are diagrams showing a layout of a portion of layers according to the twelfth embodiment.
Figure 19B:
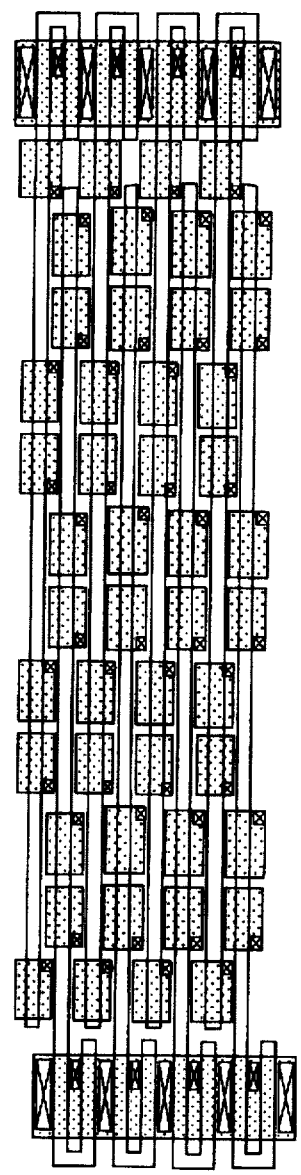
Figure 19C:
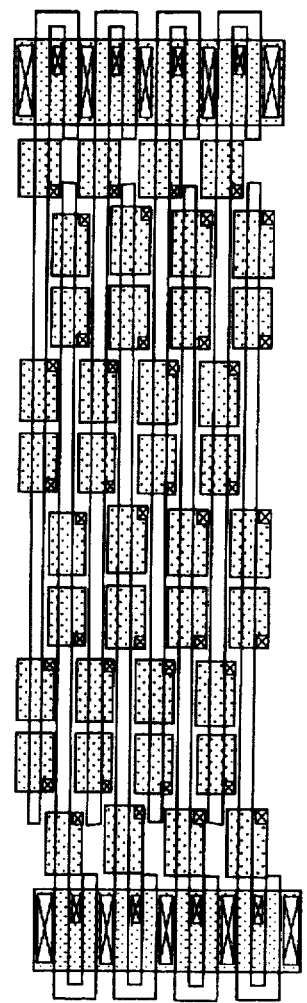
Figures 20A, 20B, 20C:
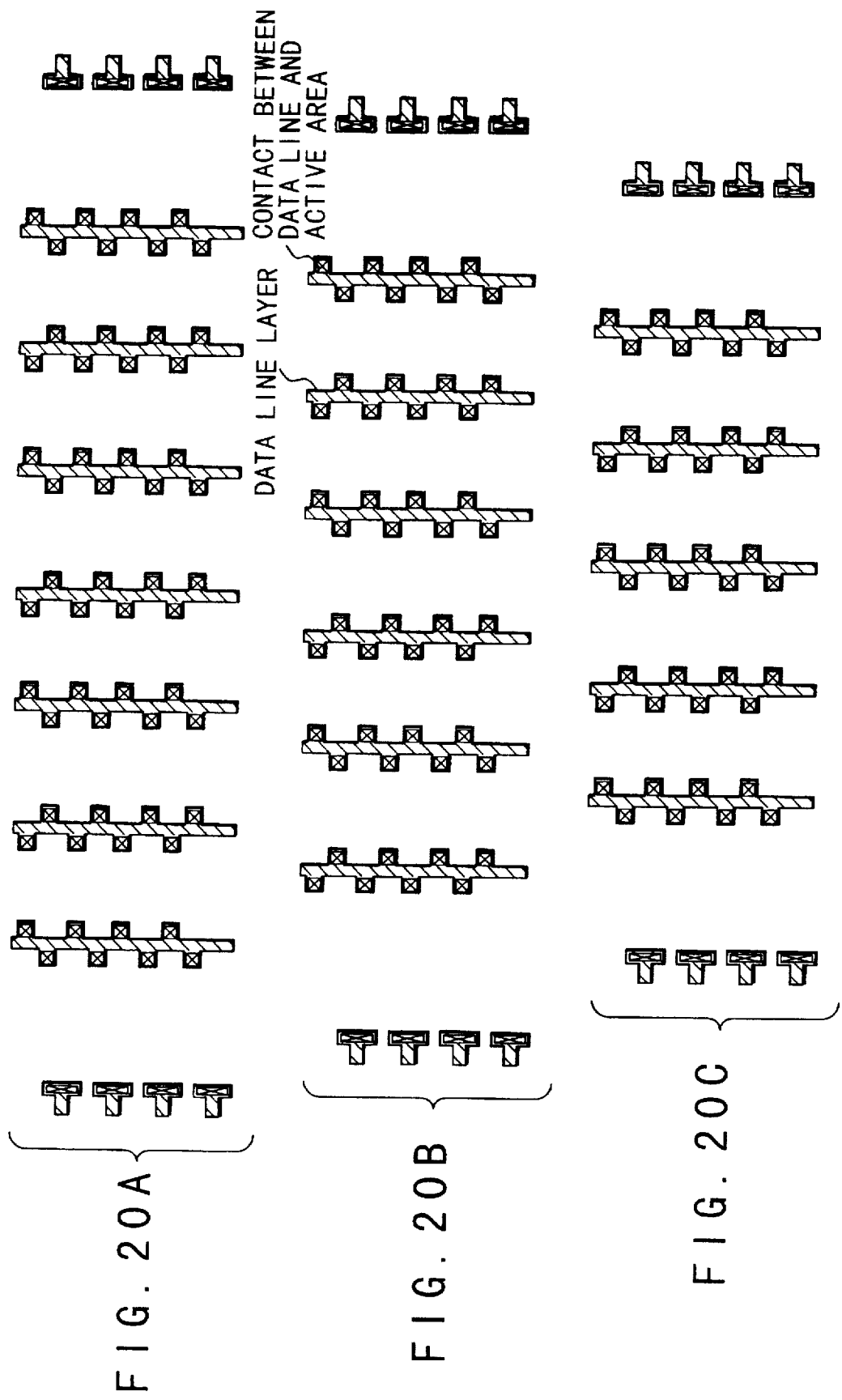
FIGS. 20A to 20C are diagrams showing a layout of a portion of layers according to the twelfth embodiment.

FIGS. 18A to 18C show only the bitline and the word line shown in FIGS. 17A to 17C. FIGS. 19A to 19C show only the active area layer, the gate layer and the contact between the bitline and the active area. FIGS. 20A to 20C show only the data line layer and the contact between the data line and the active area.

(Thirteenth Embodiment)

Figure 21A:
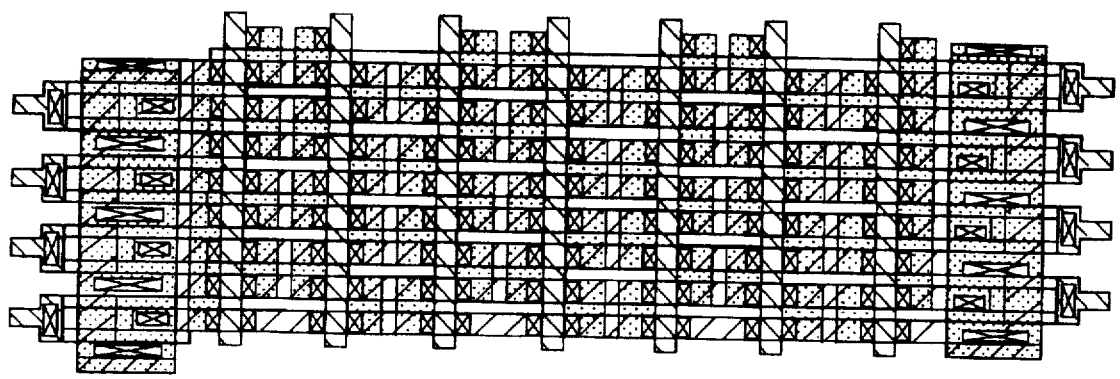
FIGS. 21A to 21C are diagrams showing a layout of pattern disposition in a GMR memory according to a thirteenth embodiment.
Figure 21B:
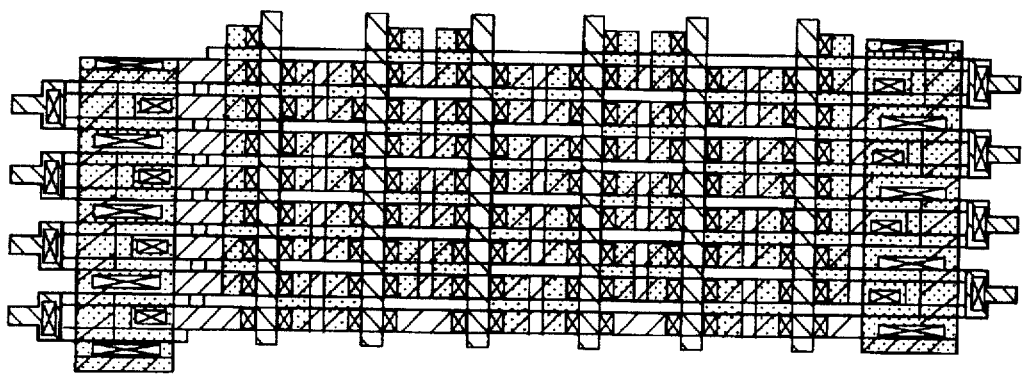
Figure 21C:
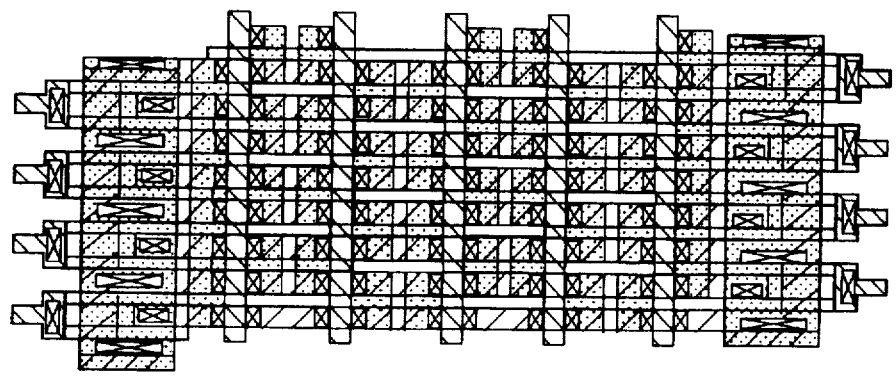

FIGS. 21A to 21C show a semiconductor memory device according to a thirteenth embodiment of the present invention. FIGS. 21A to 21C show the layout of a magnetoresistance effect memory, in particular, bitlines, a word line layer, a data line layer, an active area layer, a gate layer, a contact between the bitline and active area and contact between the data line and the active area.

FIG. 21A shows the layout corresponding to FIG. 11, in which the number of cells in the sub-cell block is such that m=2 and the number of sub-cell blocks in the cell block is such that n=4. As shown in FIG. 15, the block select transistors are alternately connected to the right-hand side and the left-hand side when viewed from an upper position.

FIG. 21B shows the layout corresponding to FIG. 9 or 12, in which the number of cells in the sub-cell block is such that m=2 and the number of sub-cell blocks in the cell block is such that n=4. As shown in FIG. 15, the block select transistors are alternately connected to the right-hand side and the left-hand side when viewed from an upper position.

FIG. 21C shows the layout corresponding to FIG. 13, in which the number of cells in the sub-cell block is such that m=2 and the number of sub-cell blocks in the cell block is such that n=4. As shown in FIG. 15, the block select transistors are alternately connected to the right-hand side and the left-hand side when viewed from an upper position.

Since the number of cells in the sub-cell block is such that m=2, the average size of the cells is $6F^2$. Symbol F indicates a shortest wiring length.

Figure 22A:
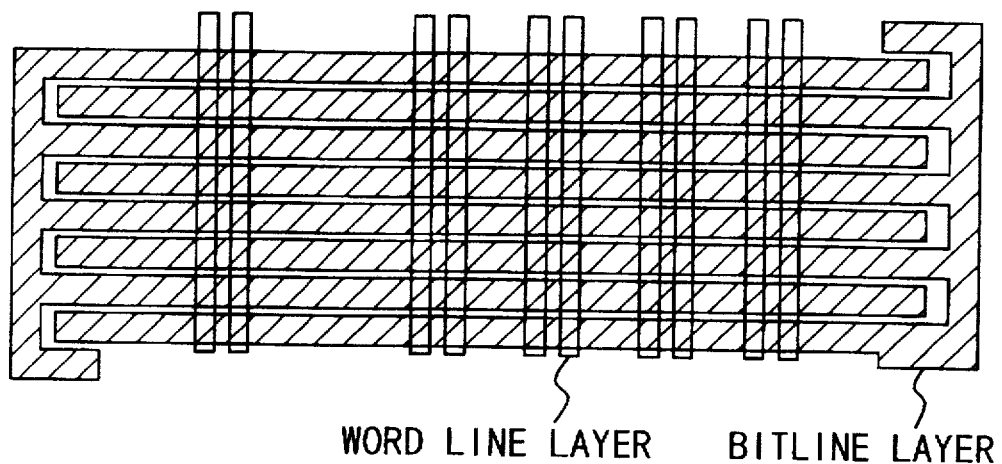
FIGS. 22A to 22C are diagrams showing a layout of a portion of layers according to the thirteenth embodiment.
Figure 22B:
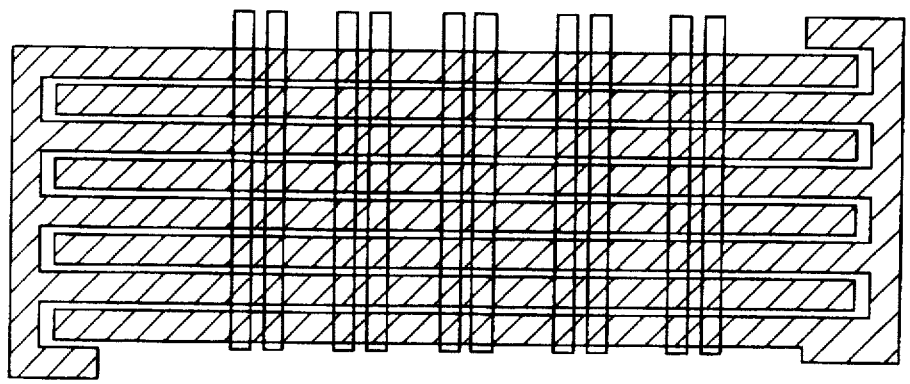
Figure 22C:
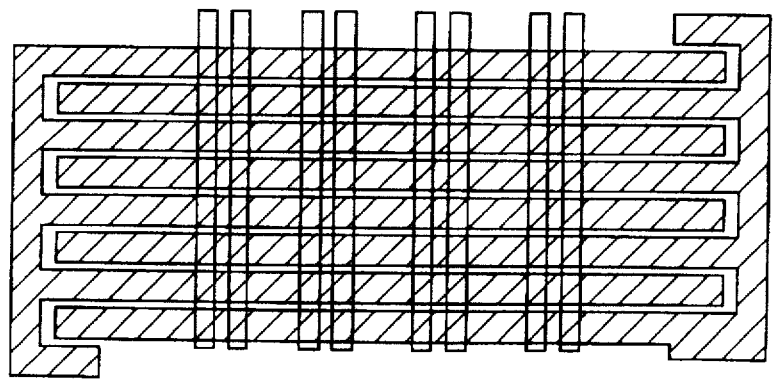
Figure 23A:
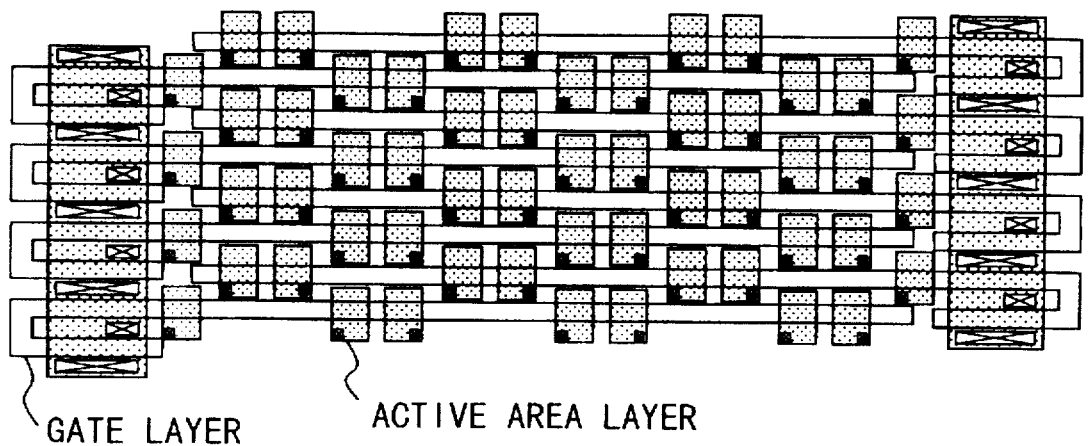
FIGS. 23A to 23C are diagrams showing a layout of a portion of layers according to the thirteenth embodiment.
Figure 23B:
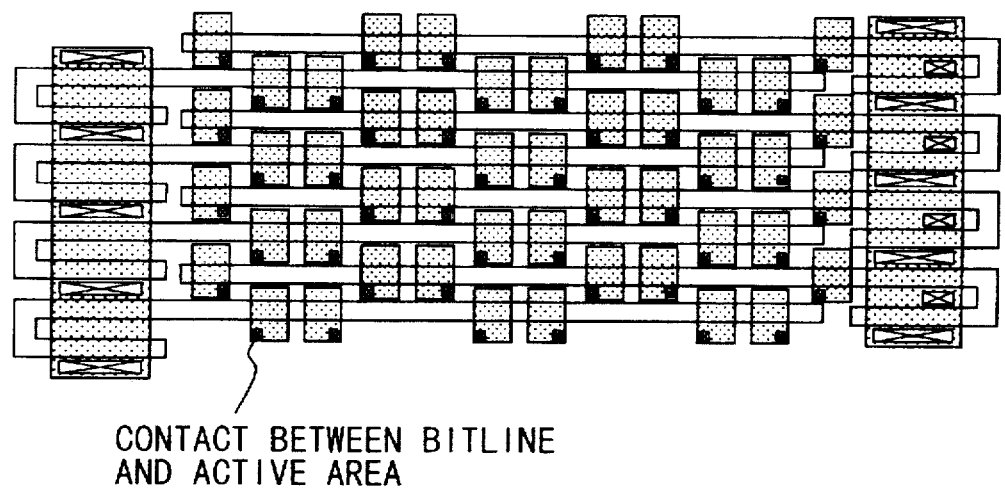
Figure 23C:
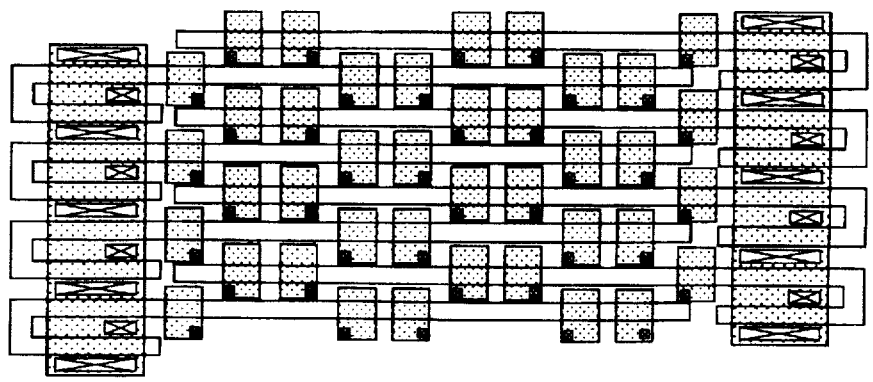
Figure 24A:
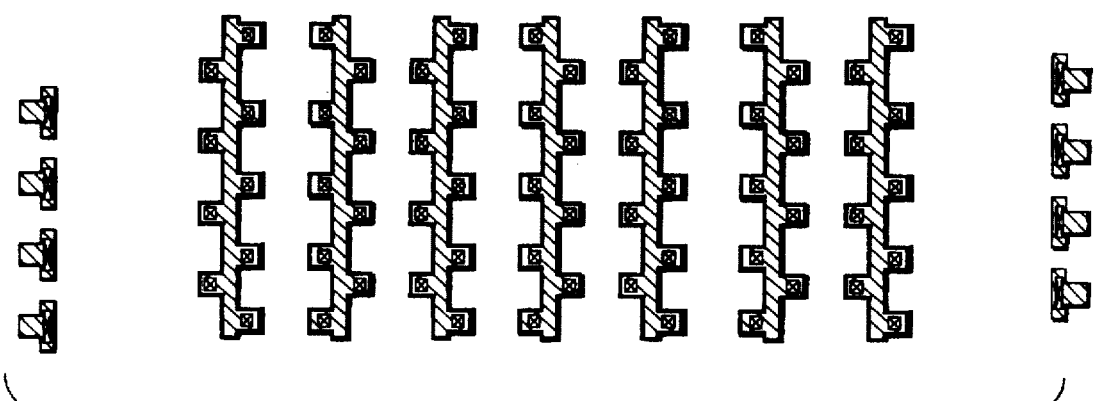
FIGS. 24A to 24C are diagrams showing a layout of a portion of layers according to the thirteenth embodiment.
Figure 24B:
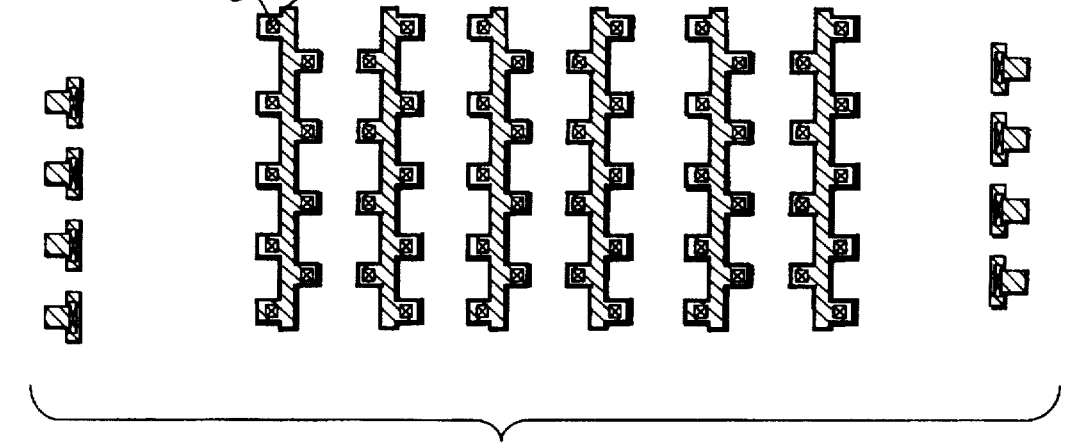
Figure 24C:
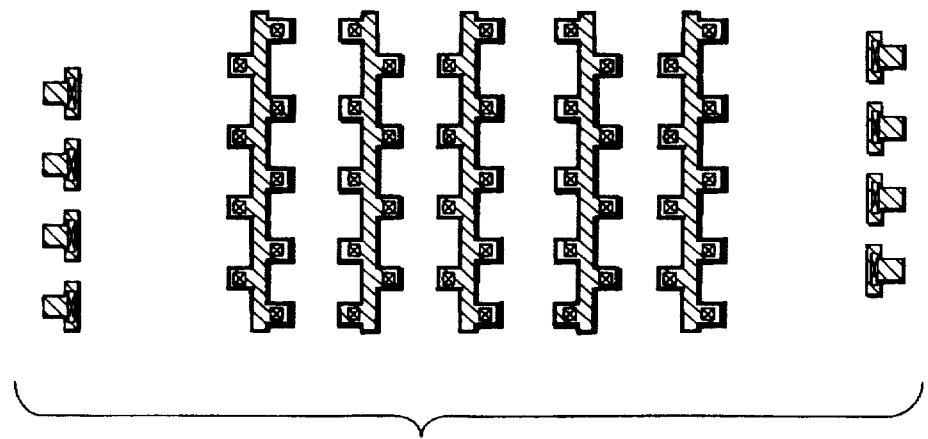

FIGS. 22A to 22C show only the bitline and the word line layer shown in FIGS. 21A to 21C. FIGS. 23A to 23C show only the active area layer, the gate layer and the contact between the bitline and the active area shown in FIGS. 21A to 21C. FIGS. 24A to 24C show only the data line layer and the contact between the data line and the active area shown in FIGS. 21A to 21C.

(Fourteenth Embodiment)

Figure 25:
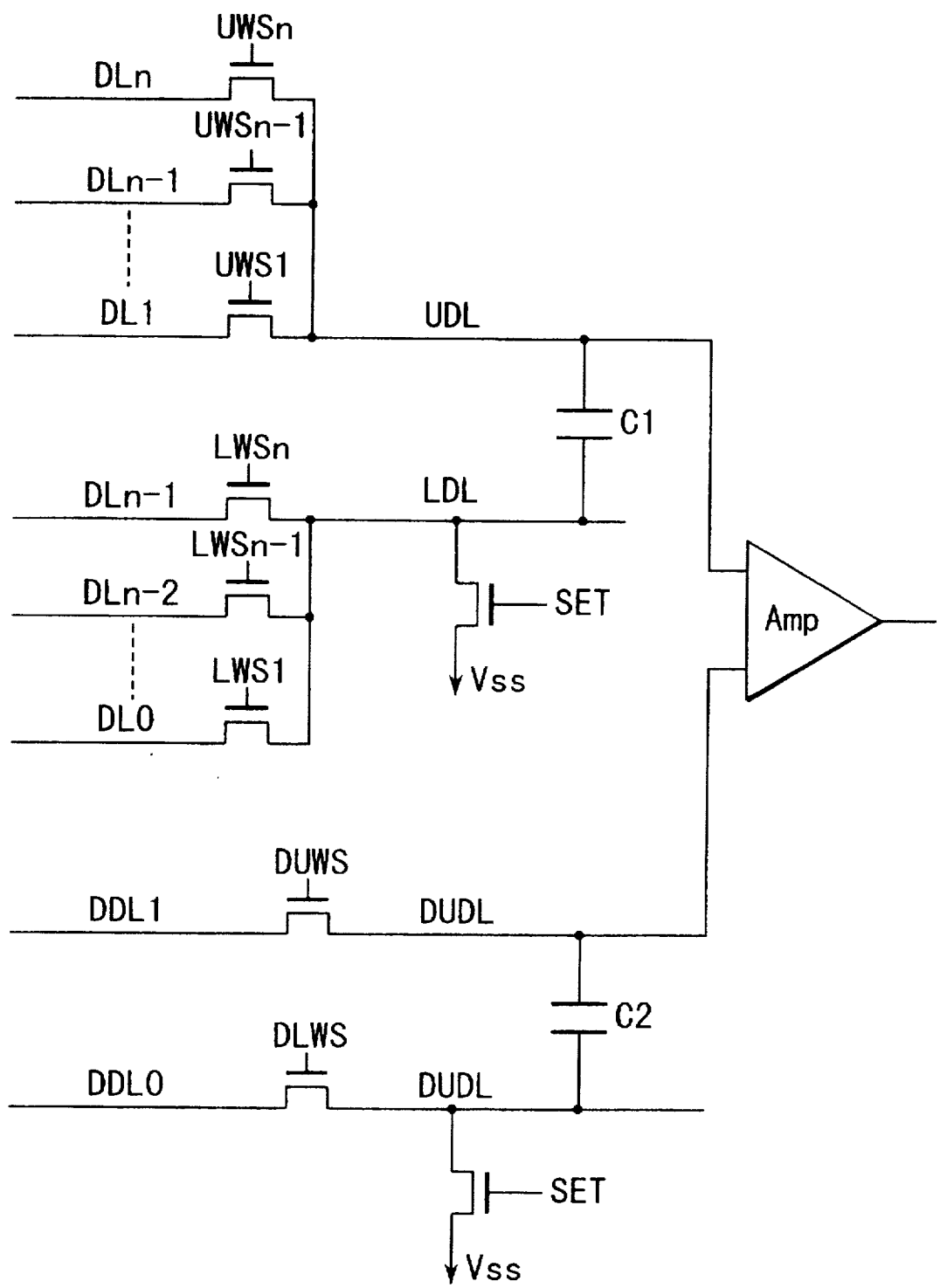
FIG. 25 is a circuit diagram showing a sense amplifier portion of a GMR memory according to a fourteenth embodiment.
Figure 26:
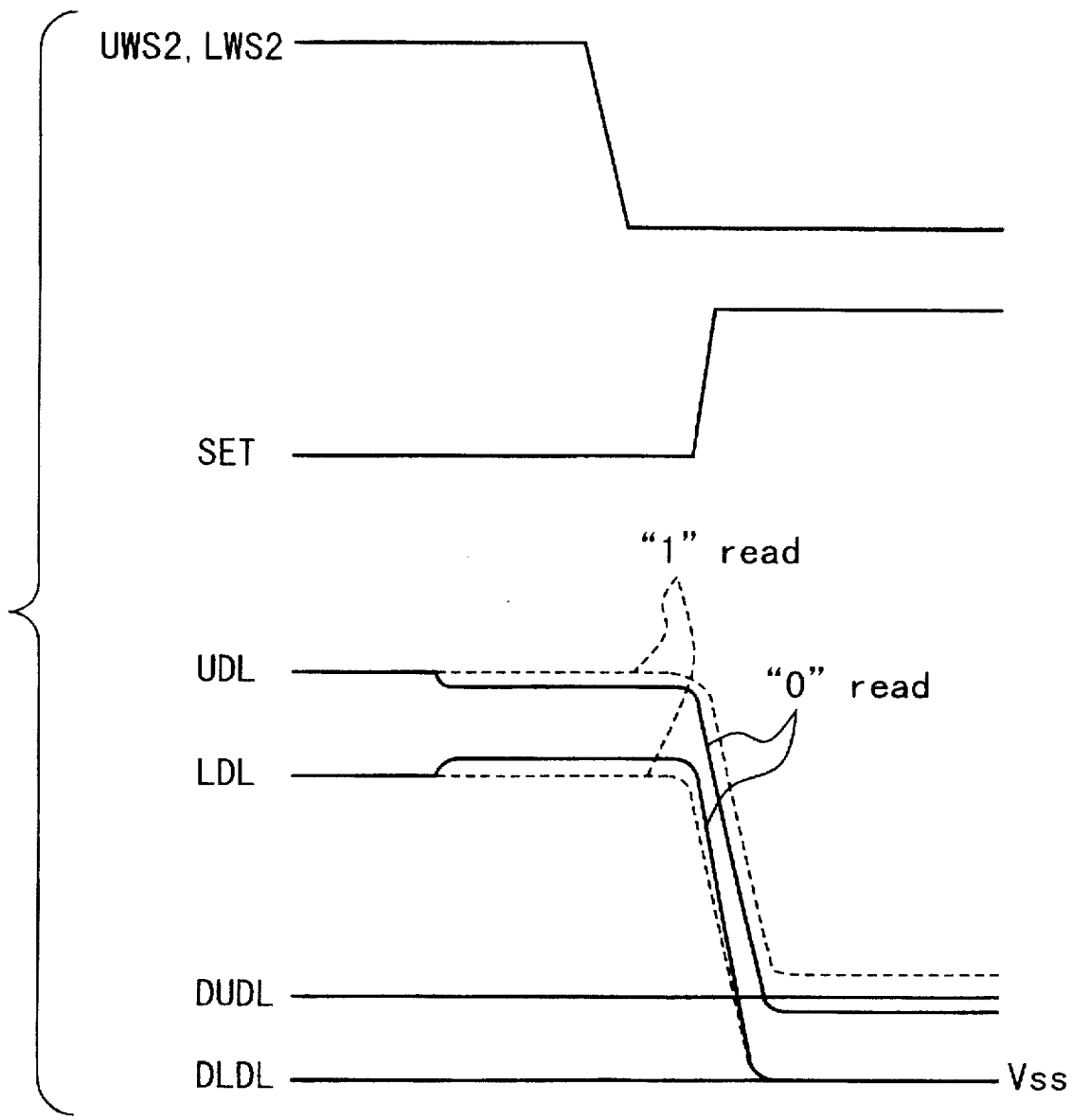
FIG. 26 is a signal waveform graph showing an example of the operation of the fourteenth embodiment.

FIG. 25 is a diagram showing a GMR memory according to a fourteenth embodiment of the present invention and is a circuit diagram showing a sense amplifier portion. FIG. 26 is a signal waveform graph showing an example of the operation of the sense amplifier portion.

Data lines DL0 to DLn-1 respectively are connected to a common data line LDL through cell block select transistors LWS1 to LWSn. Data lines DL1 to DLn respectively are connected to a common data line UDL through cell block select transistors UWS1 to UWSn. A capacitor C1 is connected between LDL and UDL, a potential shifting transistor is connected to LDL, while UDL is connected to the sense amplifier.

The dummy data line DDLO is connected to a common dummy data line DLDL through a cell block select transistor DLWS. Dummy data line DDL1 is connected to the common dummy data line DUDL through the cell block select transistor DUWS. A capacitor C2 is connected between DLDL and DUDL, a potential shifting transistor is connected to DLDL, and DUDL is connected to the sense amplifier.

20

In the above-mentioned structure, only the data lines at the two ends of the memory sub-cell block including the selected cells are selected in response to signals UWSi and LWSi, and then the signals UWSi and LWSi are lowered so as to be fetched as common data lines UDL and LDL. Simultaneously DUWS and DLWS are lowered so as to be fetched into the common dummy data line. At this time, the potential difference (UDL—LDL) at the two ends of the memory sub-cell block is stored in the capacitor C1. Simultaneously, the potential difference (DUDL—DLDL) at the two ends of the dummy sub-cell block is stored in the capacitor C2. Then, the level of signal SET, which is supplied to the potential shifting transistor, is made to be High so that the potential of the LDL and the DLDL is made to be 0 V. As a result, determination of the level of the potential between UDL and DUDL by the amplifier circuit enables "0" data item and "1" data item to be determined.

When LDL is lowered to 0 V and also UDL is lowered attributable to the coupling of C1, there arises a problem in that also the potential of UDL is made to be somewhat higher than a required potential attributable to the effect of the parasitic capacitance except C1 connected to UDL. The problem can be overcome by attaching a capacitor for correcting the parasitic capacitance effect to UDL or DUDL to correct it by coupling. As an alternative to this, also the portion, such as the substrate adjacent to the UDL wiring and having the parasitic capacitance is simultaneously lowered so that the parasitic capacitance effect is reduced. The method of overcoming the problem may be applied to the following embodiments (shown in FIGS. 27 and 29).

(Fifteenth Embodiment)

Figure 27:
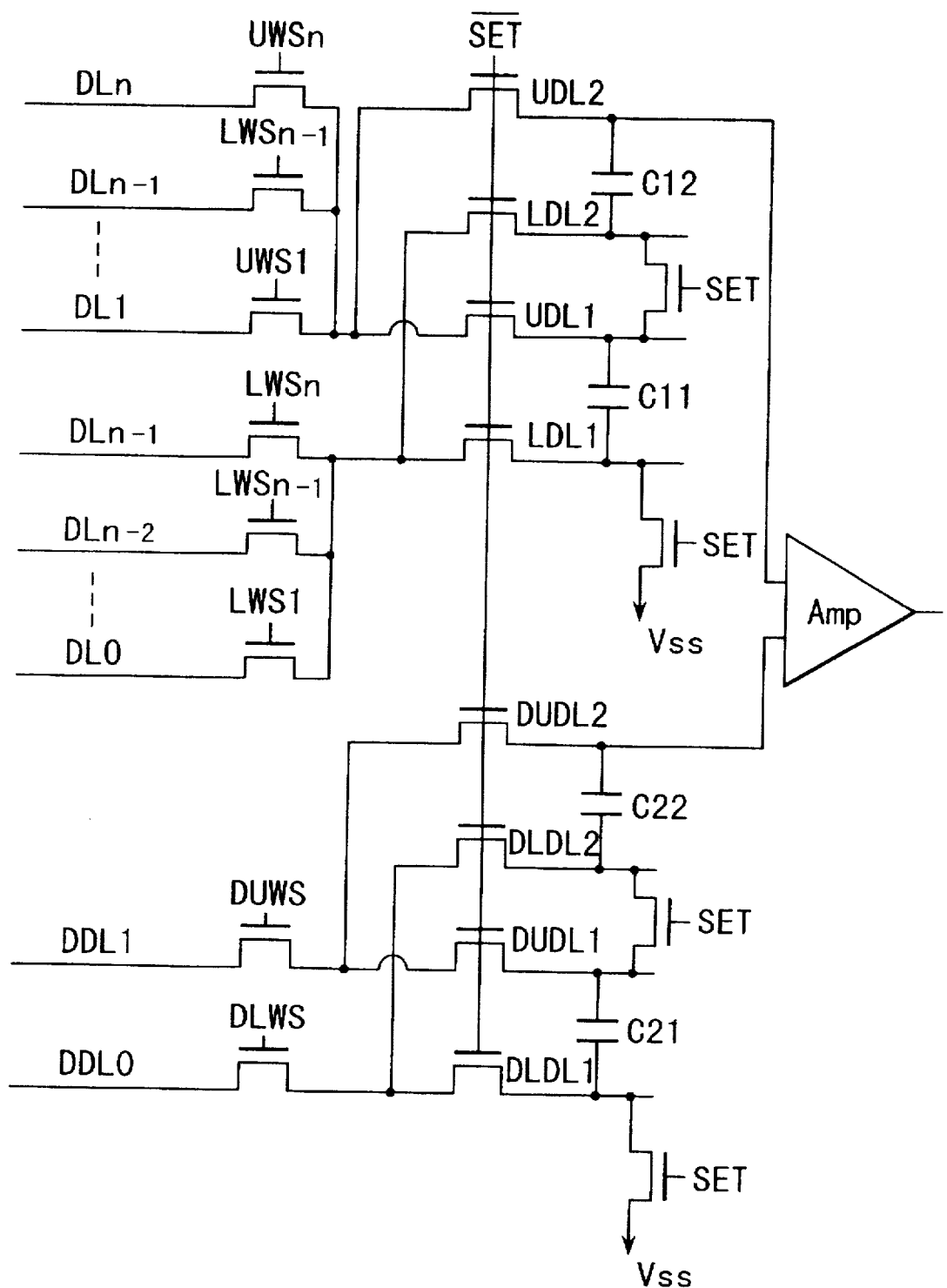
FIG. 27 is a circuit diagram showing a sense amplifier portion of a GMR memory according to a fifteenth embodiment.
Figure 28:
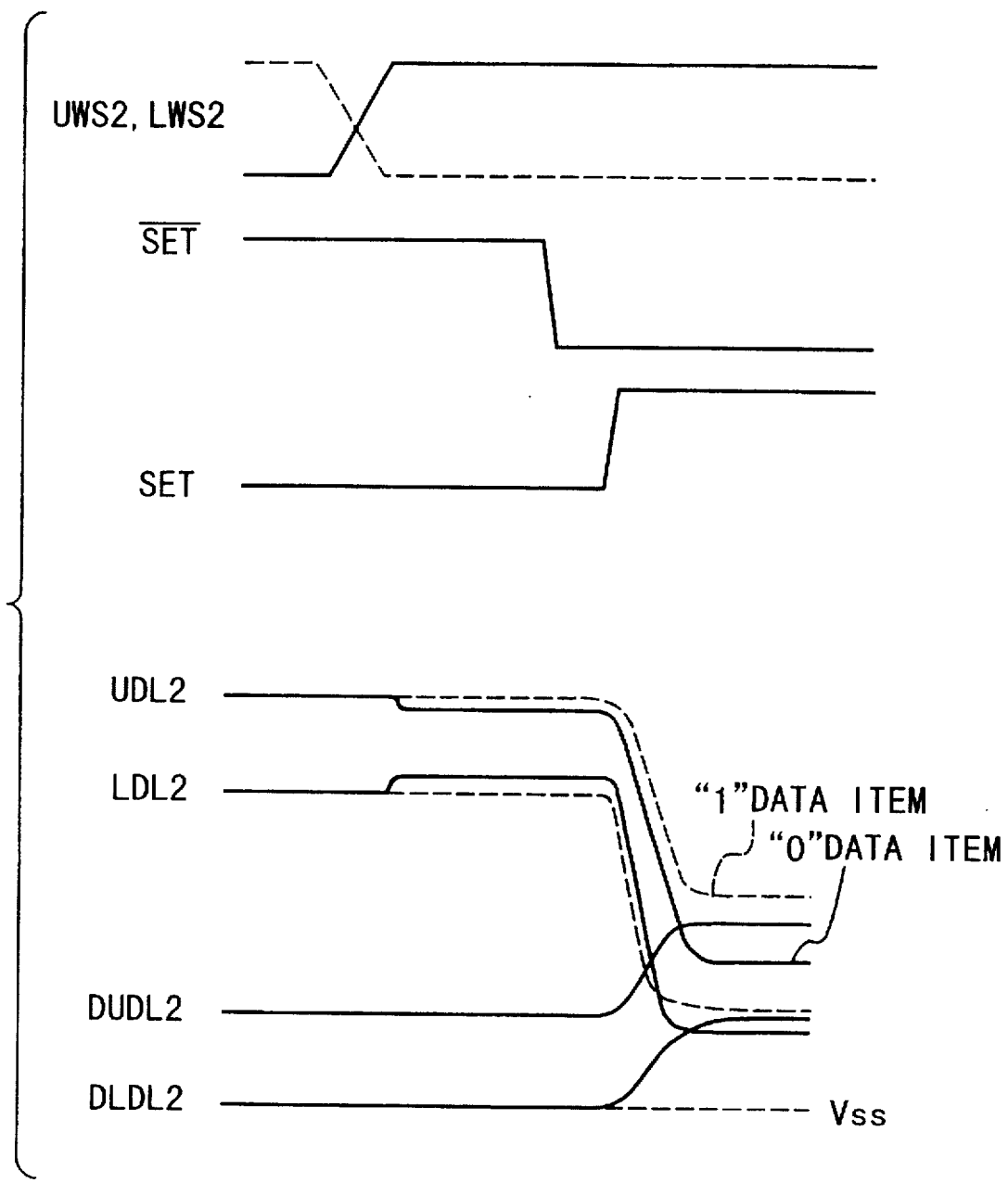
FIG. 28 is a signal waveform graph showing an example of the operation of the fifteenth embodiment.

FIG. 27 is a diagram showing a GMR memory according to a fifteenth embodiment of the present invention. FIG. 27 is a circuit diagram showing a sense amplifier portion. FIG. 28 is a signal waveform graph showing an example of the sense amplifier portion.

Data line DL0 to DLn-1 respectively are connected to dispersed common data lines LDL1 and LDL2 through the cell block select transistors LWS1 to LWSn. The data lines DL1 to DLn respectively are connected to common data lines UDL1 and UDL2 through cell block select transistors UWS1 to UWSn. A capacitor C11 is connected between LDL1 and UDL1, and a capacitor C12 is connected between LDL2 and UDL2. A potential shifting transistor is connected between UDL1 and LDL2 and between LDL1 and ground end Vss. UDL2 is connected to the sense amplifier.

Dummy data line DDL0 is connected to common dummy data lines DLDL1 and DLDL2 through a cell block select transistor DLWS. Dummy data line DDL1 is connected to dispersed common dummy data lines DUDL1 and DUDL2 through the cell block select transistor DUWS. A capacitor C21 is connected between DLDL1 and DUDL1, and a capacitor C22 is connected between DLDL2 and DUDL2. A potential shifting transistor is connected between DUDL1 and DLDL2 and between DLDL1 and ground end Vss. DUDL2 is connected to the sense amplifier.

This embodiment is able to overcome the problem of the GMR memory in that the cell signal is too small and multiply the input signal to the amplifier circuit to n times (two times in this embodiment). Initially, only the data lines at two ends of the memory sub-cell block including the selected cells are, similarly to FIG. 25, selected in response to signals UWSi and LWSi, and then the signals UWSi and LWSi are lowered. Then /SET signal is used to fetch it as dispersed common data lines UDL2, UDL1, LDL2 and LDL1 obtained by dispersing the common data lines UDL and LDL into a plurality of sections. Simultaneously, DUWS and DLWS are lowered so that it is fetched to dispersed common data lines DUDL2, DUDL1, DLDL2 and DLDL2 obtained by dispersing the common dummy data line into a plurality of sections.

At this time, the potential difference between the two ends of the sub-cell block is stored in the capacitor C12 between UDL2 and LDL2 and the capacitor C11 between UDL1 and LDL1. Simultaneously, the potential difference between the two ends of the sub-cell block of the dummy cell is stored in the capacitor C22 between DUDL2 and DLDL2 and the capacitor C21 between DUDL1 and DLDL1. Then, the level of the signal SET is raised so that the potential of LDL1 and DLDL1 is made to be 0 V. Thus, UDL1 and LDL2 are short-circuited and thus made to be the same potential. DUDL1 and DLDL2 are short-circuited and thus made to be the same potential. As a result, the potential of the UDL2 and DUDL2 is made to be a level which is two times the potential difference between the two ends of the sub-cell block. Also the cell signal is doubled. Then, the amplifying operation is performed such that the level of the potential between UDL2 and DULD2 is determined by the amplifier circuit so that "0" data item and "1" data item are determined. As described above, when parallel storage in a plurality of capacitors is performed and then series connection is established so that the signal is multiplied to n times.

(Sixteenth Embodiment)

FIG. 29 is a diagram showing a GMR memory according to a sixteenth embodiment of the present invention. FIG. 29 is a circuit diagram showing a sense amplifier portion. FIG. 30 is a signal waveform graph showing an example of the operation of the sense amplifier portion.

Only data lines at the two ends of a sub-cell block including the selected cells are selected in response to signals UWSi and LWSi, and then the signals UWSi and LWSi are lowered so as to be fetched to the common data lines (UDL and LDL). Simultaneously, DUWS and DLWS are lowered and fetching to the common dummy data line (DUDL and DLDL) are performed similarly to the structure shown in FIG. 25. Then, a different method is employed to store the electric charges into the capacitor.

That is, in this embodiment, the potential between UDL and DUDL is stored in the capacitor C1, while the potential between LDL and DLDL is stored in the capacitor C2. Then, the signal SET is made to be High so that the potential of DUDL and DLDL is made to be 0 V. Then, the level of the potential between UDL and LDL is determined so that "0" data item and "1" data item is determined.

Although the structure shown in FIG. 25 is arranged such that the amplifying signal is obtained such that (UDL–LDL)–(DUDL–DL), the structure shown in FIG. 29 is equivalent to a structure in which the foregoing equation is deformed into (UDL–LDL)–(DUDL–DLDL)=(UDL–DUDL)–(LDL–DLDL). The method according to this embodiment is characterized in that the shifted potential of the node occurring due to coupling of C1 and C2 can be reduced to one potential difference between the two ends of the sub-cell block. Thus, noise of the parasitic capacitance shown in FIG. 25 can be reduced.

(Seventeenth Embodiment)

Figure 31:
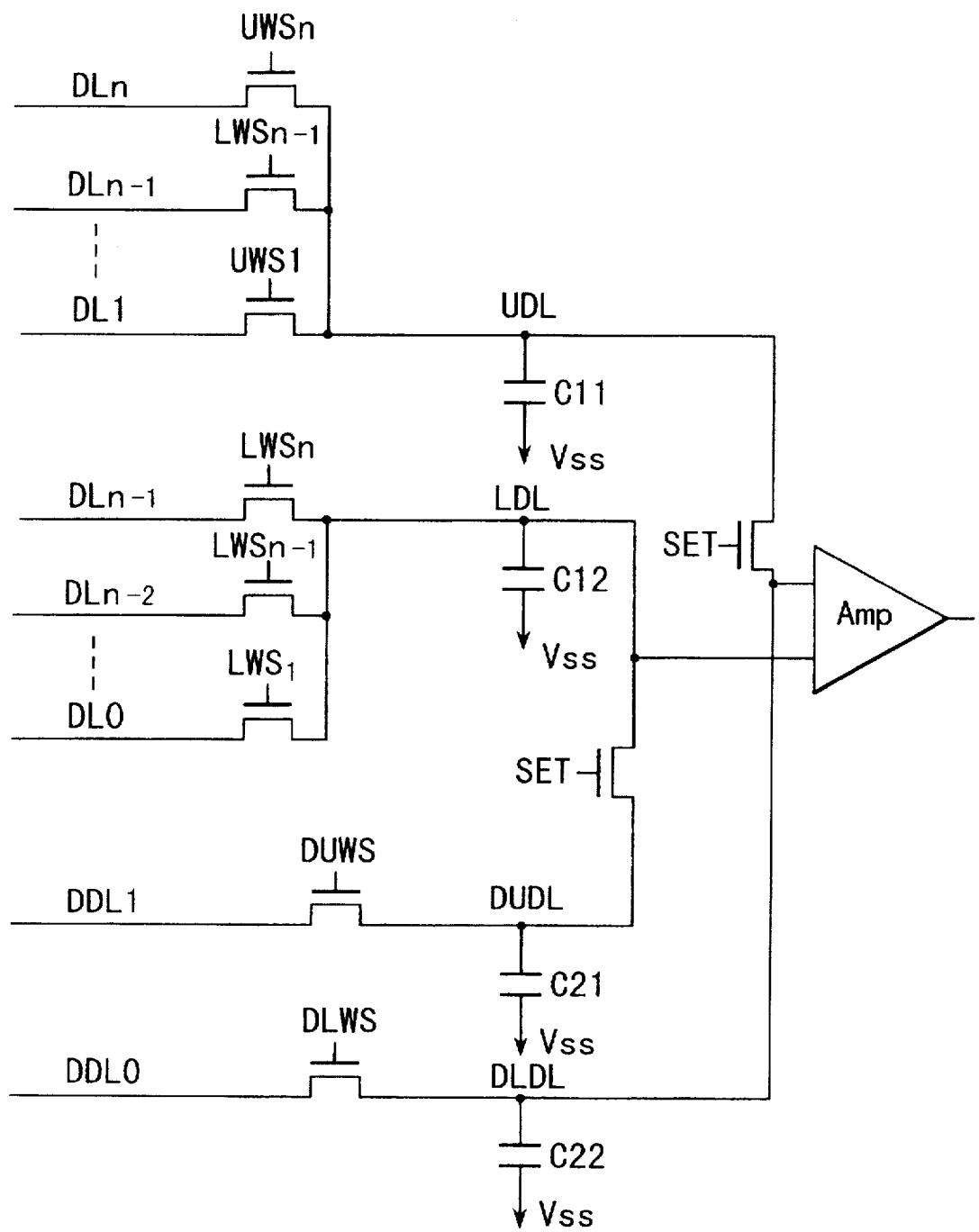
FIG. 31 is a circuit diagram showing a sense amplifier portion of a GMR memory according to a seventeenth embodiment.

FIG. 31 is a diagram showing a GMR memory according to a seventeenth embodiment of the present invention. FIG. 31 is a circuit diagram showing a sense amplifier portion.

FIG. 32 is a signal waveform graph showing an example of the operation of the sense amplifier portion.

Only data lines at the two ends of a sub-cell block including the selected cells are selected in response to signals UWSi and LWSi, and then the signals UWSi and LWSi are lowered so as to be fetched to the common data lines (UDL and LDL). Simultaneously, DUWS and DLWS are lowered and fetching to the common dummy data line (DUDL and DLDL) are performed similarly to the structure shown in FIG. 25. Then, a different method is employed to store the electric charges into the capacitor.

That is, this embodiment is arranged such that the potentials of UDL, DUDL, LDL and DLDL respectively are stored in the capacitors C11, C21, C12 and C22. Then, the level of the signal SET is made to be High so that UDL and DLDL are short-circuited and LDL and DUDL are short-circuited so as to have the same potential. As a result, determination of the potential between UDL and LDL by the amplifying circuit enables "0" data item and "1" data item to be determined.

Although the structure shown in FIG. 25 is structured such that the amplifying signal is obtained by (UDL–LDL)–(DUDL–DL), the structure shown in FIG. 31 is equivalent to a structure in which it is obtained by dividing the equation by two such that ½ {(UDL–LDL)–(DUDL–DLDL)}=½ (UDL+DLDL)–½ (LDL+DUDL).

This embodiment is characterized in that the noise of the parasitic capacitance shown in FIG. 25 can be canceled though the amount of the read signal is halved. The reason for this is that the UDL and LDL nodes are lowered attributable to the short circuit and the DUDL and DLDL nodes are raised by the same degree. Thus, the noise of the parasitic capacitance of UDL and LDL and noise of the parasitic capacitance of DUDL and DLDL are canceled.

(Eighteenth Embodiment)

Figure 33A:
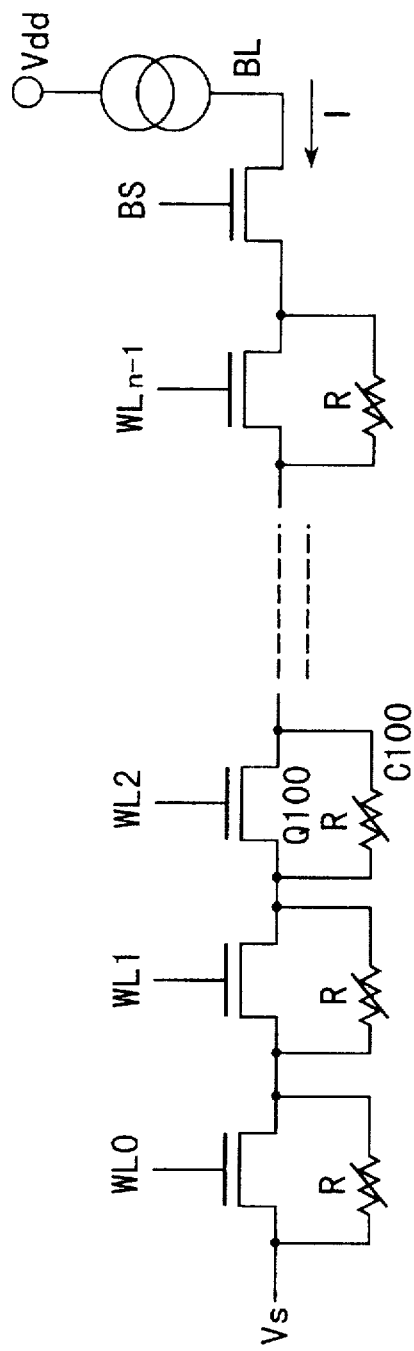
FIGS. 33A and 33B are an equivalent circuit diagram and a cross sectional view showing the structure of a cell block of a GMR memory according to an eighteenth embodiment.
Figure 33B:
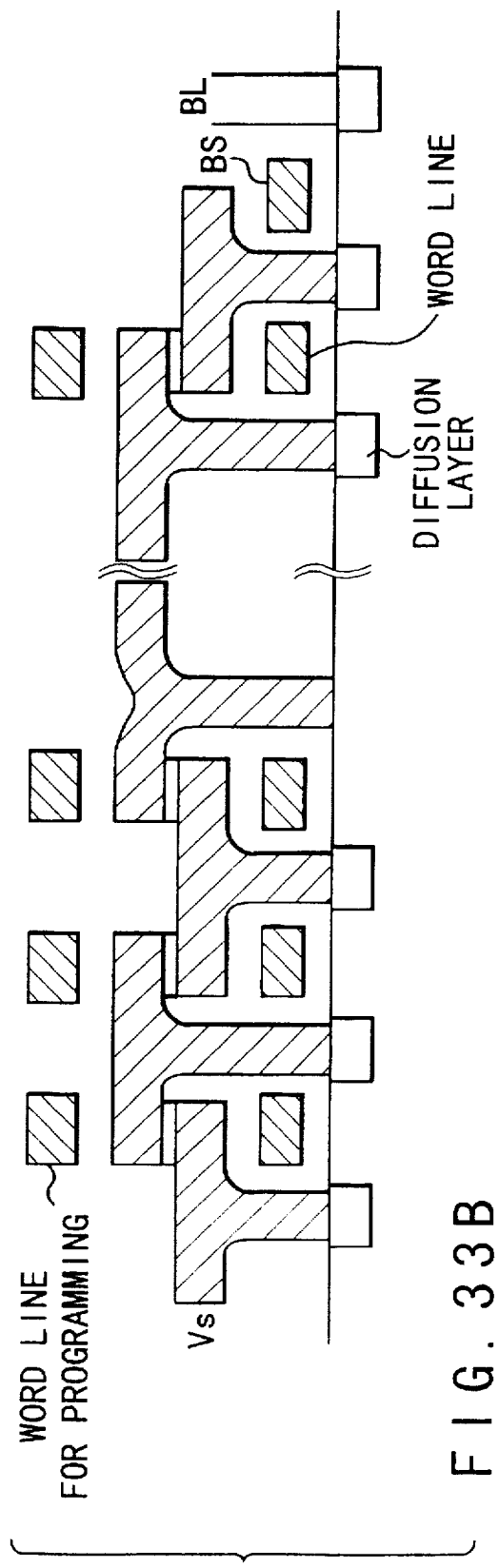

FIGS. 33A and 33B are diagrams showing a semiconductor memory device according to an eighteenth embodiment of the present invention. FIGS. 33A and 33B are an equivalent circuit of a cell block structure of a GMR memory and a cross sectional view of the same.

Referring to the circuit diagram shown in FIG. 33A, two terminals each having magnetoresistance and cell transistor are connected in parallel to form one cell. Moreover, the cells are connected in series. In addition, a block select transistor is connected in series so that one cell block is formed. Although omitted from illustration, a plurality of cell blocks are disposed in the direction of the word line so that a memory cell array is formed.

In a standby mode, all of the word lines WL1 are made to be High, all of the cell transistors are turned on, block select signal BS is made to be Low and the block select transistor is turned off. When a cell is selected, for example, when C100 is selected, WL2 is made to be Low, the cell transistor Q100 is turned off, the block select signal BS is made to be High and the block select transistor is turned on. Then, a constant current generating circuit is operated to apply voltage between BL and Vs so as to apply voltage to C100. At this time, the magnetic resistance is made to be R or (R–ΔR) in accordance with whether the data in C100 is "1" or "0". Therefore, the electric current I is changed so that the signal is read in accordance with the change in the potential of BL.

This embodiment is effective when the magnetic resistance of the tunnel type GMR is higher than the ON-resistance of the cell transistor. In this case, the cell transistor of the non-selected cell in the selected cell block has been turned on, substantially no voltage is applied between the magnetoresistance devices. As a result, substantially the overall potential between Vs and BL is supplied between the magnetoresistance devices of the selected cells. Since a large potential difference is generated with a small electric current between two terminals of the devices having high magnetic resistance, series connection cannot easily be established. However, this embodiment has the structure in which the non-selected cell is bypassed by the cell transistor. Therefore, a great effect can be obtained because a high voltage is not required between Vs and BL.

FIG. 33B is a cross sectional view showing the cell. Although a writing word line is required in addition to the word line for the cell transistor, the cell size can be reduced to $4F^2$. Data may be read/written by the synthesized magnetic field of the bitline electric current and the word line electric current as shown in FIG. 33B. Although omitted from illustration, a column line perpendicular to the word line may be added to form a synthesized magnetic field of the word line and the column line for use to read/write data.

(Nineteenth Embodiment)

FIGS. 34A and 34B are diagrams showing a semiconductor memory device according to a nineteenth embodiment of the present invention. FIGS. 34A and 34B are equivalent circuit diagram of the cell block of a GMR memory and a cross sectional view of the same.

This embodiment is different from the nineteenth embodiment shown in FIGS. 33A and 33B in that one block select transistor connected in series is added. A D-type (Depletion type) transistor is employed as that adjacent to BS0 and a E-type (Enhancement type) transistor is employed as that adjacent to BS1. Although omitted in the embodiment, a D-type transistor is employed as the transistor adjacent to BS1 and a E-type transistor is employed as that adjacent to BS0. In this case, BS0 or BS1 is made to be High so that either cell block is selected. Thus, a folded bitline structure, such as a DRAM, can be realized. The other effects are the same as that obtainable from the structure shown in FIGS. 33A and 33B.

(Twentieth Embodiment)

FIGS. 35A and 35B are diagrams showing a semiconductor memory device according to a twentieth embodiment of the present invention. FIGS. 35A and 35B are a equivalent circuit diagram of a cell block of a memory cell using the magnetoresistance effect and a cross sectional view of the same.

Although the structure of the circuit is the same as that shown in FIGS. 33A and 33B, this embodiment is arranged such that an exchange connection GMR film is employed in place of the tunnel type GMR film as a magnetic resistance for forming the memory cell. As a matter of course, an effect similar to that obtainable from the eighteenth embodiment can be obtained.

(Twenty-First Embodiment)

Figure 36A:
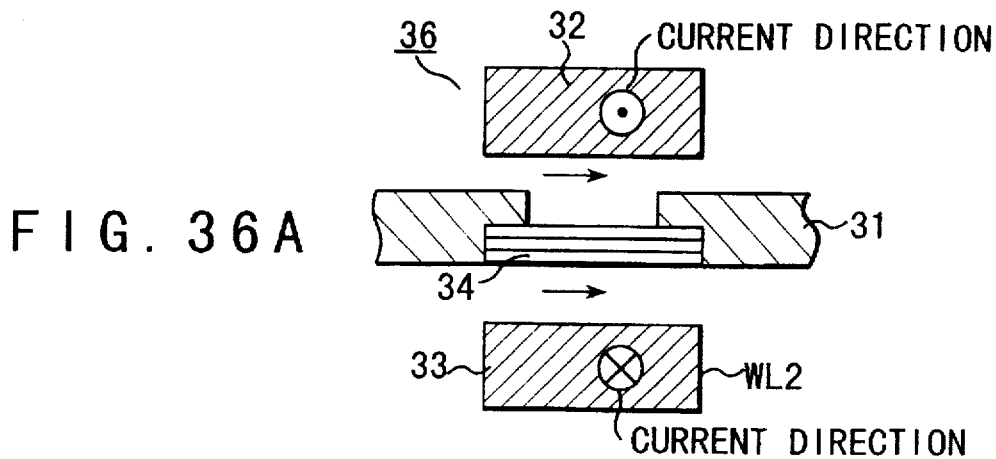
FIGS. 36A to 36C are a cross sectional view of a magnetoresistance effect memory cell, a plan view of a plurality of adjacent memory cells and a cross sectional view of a cell array according to a twenty-first embodiment of the present invention.
Figure 36B:
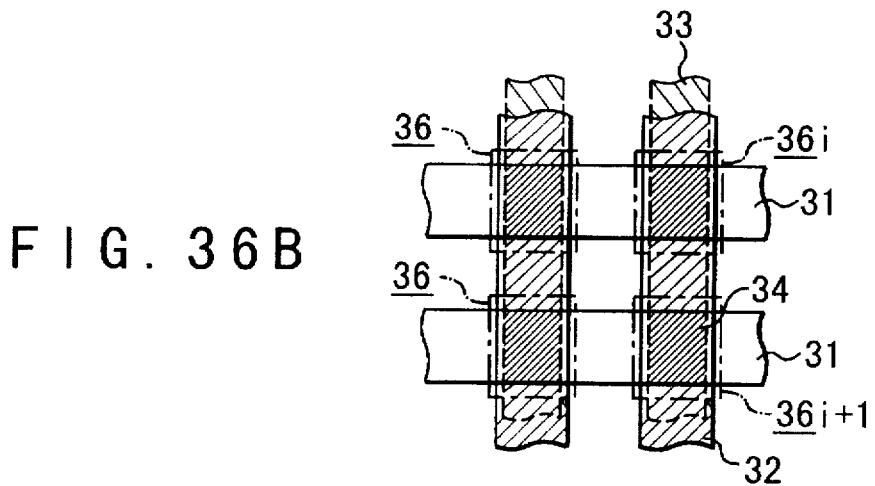
Figure 36C:
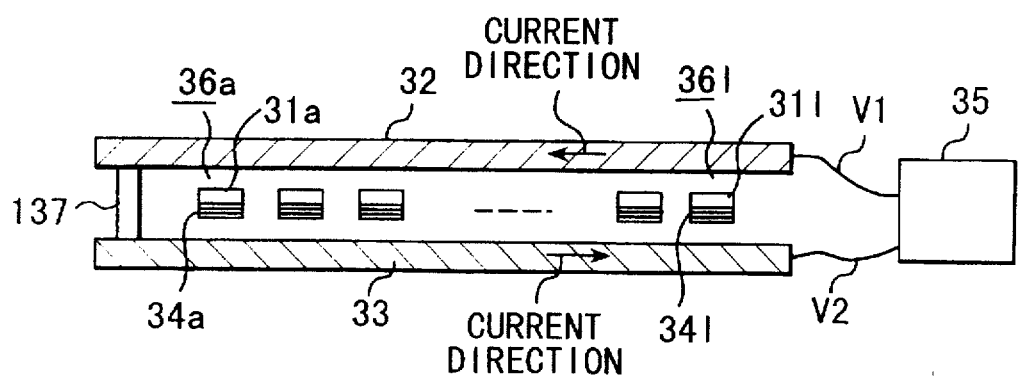

FIG. 36A is a cross sectional view showing a memory cell of a semiconductor memory device using the magnetoresistance effect according to the twenty-first embodiment of the present invention. FIG. 36B is a plan view showing a plurality of memory cells disposed adjacently, and FIG. 36C is a cross sectional view showing a cell array in the direction of the word line and a word line drive circuit.

As shown in FIGS. 36A and 36B, this embodiment has a structure in which bitline 31 and upper word line 32 and lower word line 33 vertical formed to across the bitline 31 are stereoscopically intersect. A GMR film 34 having two ends connected to the bitline 31 is formed in the intersection region. That is, the upper word line 32 is formed right above the GMR film 34 and the lower word line 33 is formed right below the GMR film 34. The upper and lower word lines 32 and 30 are formed to be superimposed in the vertical direction of the main surface of the substrate across the GMR film 34 and the interlayer film. The interlayer film electrically isolates between the upper and lower word lines 32 and 33 and between the GMR film 34 and the bitline 31.

Then, an electric current is supplied to one upper word line 32 of the memory cell in a direction from a reverse side of the drawing sheet to this side (as indicated by a circle mark including a dot). On the other hand, an electric current is supplied from this side of the drawing sheet to the reverse side (as indicated by a circle mark including X). As a result, a magnetic field is generated by the electric currents in the upper word line 32 and the lower word line 33 in a direction toward the right-hand portion of the drawing sheet owning to the Ampere's corkscrew rule. As a result, a synthesized magnetic field of the magnetic fields generated by the word lines in the two layers is generated in the cell to act on the GMR film 34. The synthesized magnetic field has an intensity which is about two times a magnetic field which is generated from a word line in one layer (the conventional technique) if the amount of the electric current is not changed.

When, for example, the upper and lower word lines 32 and 33 are extended from the left-hand end cell 36a of the cell array to the right-hand end cell 361 to, in series, connect the upper and lower word lines 32 and 33 to each other through a contact 37 at the left-hand end of the cell array, the synthesized magnetic field of the electric currents, which flow in the word lines in the two layers, can be substantially doubled though the consumption of the electric current is the same as that required for the conventional technique.

When voltage is applied to each layer such that voltage V1 is applied to the upper word line 32 by the word line driving circuit 35 and potential V2 is connected to the lower word line 33 by the word line driving circuit 35, that is, when V1>V2, an electric current flowing to the left when viewed in the drawing sheet is supplied to the upper word line 32. On the other hand, an electric current flowing to the right is supplied to the lower word line 33. The arrangement that V1>V2 may be realized by making V1=Vcc and V2=0 V. The arrangement that V2>V1 may be realized by making V2=Vcc and V1=0 V. To supply a required electric current, V1 and V2 may be made to arbitrary potentials which satisfy the foregoing relationship. The upper word line and the lower word line may be made to be different between the data writing operation and the data read operation such that V1–V2 is made to be large when data is written and V1–V2 is made to be small when data is read. Thus, the electric current consumption can be reduced.

This embodiment is able to generate a required magnetic field with a small electric current consumption in the word line. Even if a material having a high change ratio of the magnetic resistance and thus having an excellent sensitivity is employed, an LSI consuming small electric power can be realized. Thus, both of the reduction in the power consumption and improvement in the sensitivity can be realized.

This embodiment is not limited to the structure shown in FIG. 36C. Another structure may be employed if the structure is formed such that the layers are connected in series.

(Twenty-Second Embodiment)

Figure 37A:
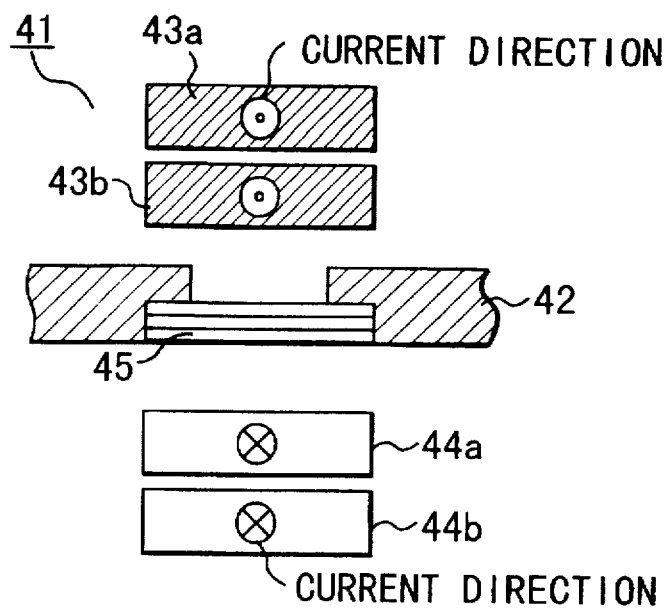
FIGS. 37A and 37B are a cross sectional view of a magnetoresistance effect memory cell and a cross sectional view of a cell array according to a twenty-second embodiment of the present invention.
Figure 37B:
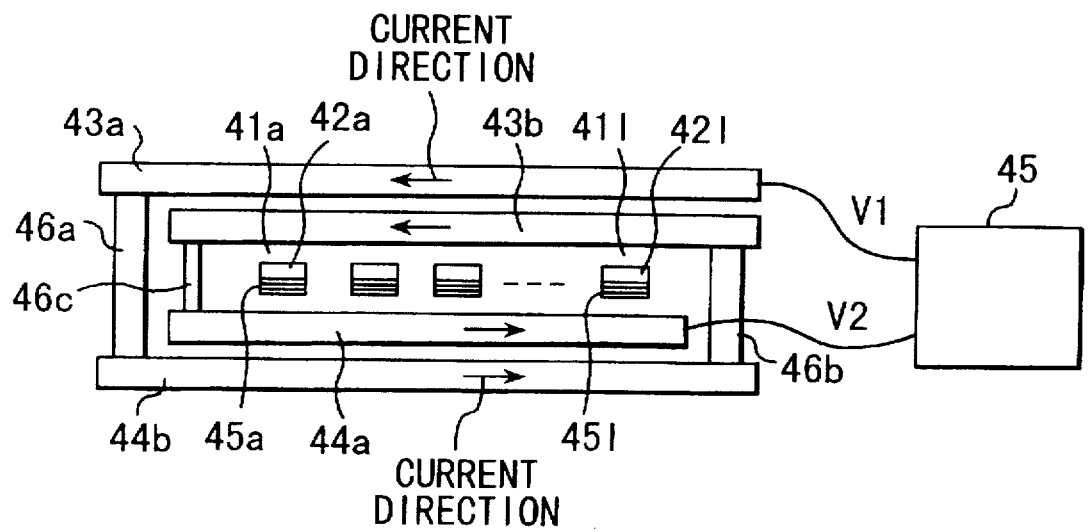

A semiconductor memory device according to a twenty-second embodiment of the present invention will now be described. FIG. 37A is a cross sectional view showing a memory cell, and FIG. 37B is a cross sectional view showing a cell array in the direction of the word line and a word line driving circuit. In this embodiment, there are provided first and second word line layers 40a and 40b, a GMR film 45 formed below the first and second word line layers 40a and 40b and first and second word line layers 44a and 44b formed below the GMR film 45. A bitline 42 intersects the first and second word line layers 40a and 40b and the third and fourth lower word lines 44a and 44b forming four layers. The GMR film 45 is formed in the intersection portion.

A magnetic field generated for the memory cell 41 will now be described. When electric currents flowing in the same direction are supplied to the first and second word line layers 43a and 43b of the memory cell 41 and electric currents flowing in the opposite direction to the direction in which the electric currents are allowed to flow in the first and second word line layers 43a and 43b are allowed to flow in the third and fourth lower word lines 44a and 44b, a magnetic field which is about four times the magnetic field which is generated by the conventional structure can be generated thanks to the synthesized magnetic field if the amount of the electric currents are not changed. The GMR film 45 is affected by the synthesized magnetic field. The synthesized magnetic field is enlarged in proportion to the number of the layers.

The connection of the word lines will now be described. In this embodiment, series connection are, at the two ends of the cell area, established between the first word line layer 43a and the fourth word line layer 44b, between the second word line layer 43b and the fourth word line layer 44a and between the second word line layer 43b and the fourth word line layer 44a by contacts 46a, 46b and 46c, as shown in FIG. 37B. Therefore, if the electric current consumption is the same, a synthesized magnetic field which is four times the magnetic field which is generated by the conventional structure can be generated. Thus, an LSI which consumes electric power smaller than that required for the first embodiment can be realized. Since the GMR film 45 is provided, a material having a higher change ratio in the magnetic resistance can be employed.

The method of connecting the layers in series is not limited to that shown in FIG. 37B. Voltages V1 and V2, which are applied to the word lines, may be applied similarly to the first embodiment. Therefore, the voltage application is omitted from detailed description here.

(Twenty-Third Embodiment)

A twenty-third embodiment of the present invention will now be described.

It is considered that the following problems arise if the pitch of the word lines is determined when the upper and lower word line layers are formed across the magnetoresistance effect film as is employed in the twenty-second embodiment. That is, since the contact 46a is formed, the uppermost layer (which is the third word line layer 44a in the twenty-second embodiment) of the word line 1 in the lower layer and the word line driving circuit 57 cannot easily be connected to each other. The twenty-third embodiment is attempted to overcome the above-mentioned problem.

Figures 38, 39:
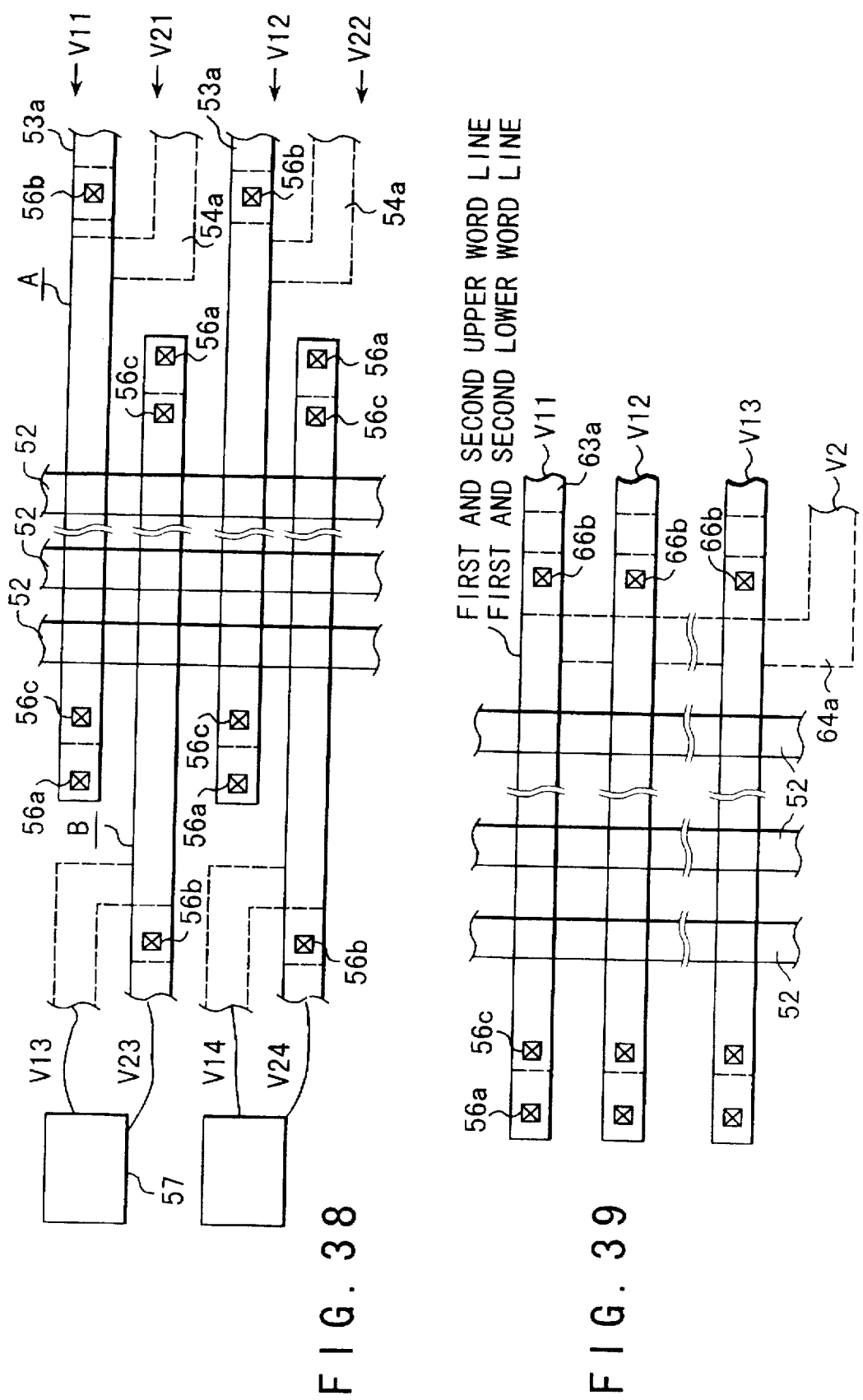
FIG. 38 is a plan view showing a cell array according to a twenty-third embodiment of the present invention.
FIG. 39 is a plan view showing a cell array according to a twenty-fourth embodiment of the present invention.

As shown in FIG. 38, this embodiment is structured such that the right and left cell arrays are alternately connected to the word line driving circuit 57 (the word line driving circuit 57 connected to either side is omitted from FIG. 38). Thus, word line layers which cannot easily be connected to the word line driving circuit by the second contact are extracted to the side portion of the second contact 56b so that the above-mentioned problem is overcome.

At this time, the cell arrays symmetrically connected to the word line driving circuit are shifted from one another to the right and left, as shown in FIG. 38. The layers, such as the second upper word line of the cell array A, which are not connected to drive circuit are, on the inside of the cell array, are disposed such that, for example, the symmetric first lower word lines of the cell array block is shifted into the direction of the cell array A by one pitch so as to be connected to the first or third contact.

The layout of the word lines according to this embodiment may be applied to a cell array having three or more word line layers requiring contacts so as to be connected in series.

(Twenty-Fourth Embodiment)

A twenty-fourth embodiment of the present invention will now be described.

As described above, a method using one word line layer to store "1" data item and "0" data item on an exchange connection GMR film has been disclosed (J. L. Brown). The foregoing storage method is arranged such that the word line current is allowed to flow in the opposite direction between the read operation and the writing operation.

On the other hand, the present invention having a multi-layered word lines is able to cause the word line currents to flow in the same direction regardless of the operation whether it is the read operation or writing operation. Even if the directions of spins of the two ferromagnetic layers are made to be the same bitline direction, the structure according to the present invention is able to act as a memory device. Similar to the case where "1" data item has been written with the above-mentioned system, a rotating magnetic field is generated by the bitline current in a direction opposite to the directions of the spins of the two ferromagnetic layers. In a case of "1" data item, the direction of the spin and the rotating magnetic field are in the same direction. Therefore, the spins are made to be opposite direction to each other in the direction of the word line regardless of the word line current. As a result, the resistance of the bitline is raised. In a case of "0" data item, two ends directions of spins of the two ferromagnetic layers and the rotating magnetic field are in the different directions. Therefore, the force for causing the directions of the spins of the two ferromagnetic layers attributable to the word line current to be directed to the bitline direction is enlarged (no inversion takes place because the word line current is small. As a result, the resistance of the bitline is lowered so that memory cell operation is permitted. That is, the word line current is required to be only one direction in reading/writing operations. Therefore, a plurality of word line driving circuits can be disposed at ends of the cell array and ends of the word lines connected to the cell arrays, for example, the ends of the word line layers, to which a potential of V2 is applied, can be formed into common ends. For example, the third word line layer is formed into a common portion in front of the second contact, and then extracted into the bitline direction and taken out to the outside of the cell array.

If the structure according to this embodiment is applied to a cell structure, for example, that according to the twenty-second embodiment in which a plurality of word Line layers are, in series, connected to the upper and lower layers by the contacts, the potential V2 can be applied commonly to the all word lines adjacent to the ground side. Therefore, the word line driving circuit and the word line can be formed with the minimum design rule.

(Twenty-Fifth Embodiment)

Figure 40A:
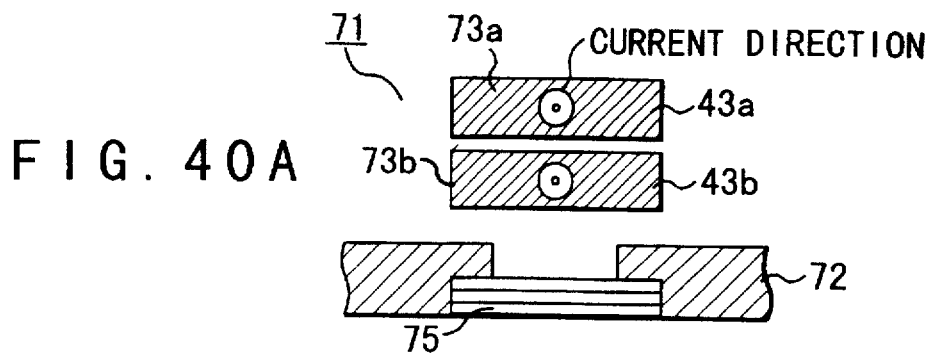
FIGS. 40A and 40B are a cross sectional view of a magnetoresistance effect memory cell and a word line layout view according to a twenty-fifth embodiment of the present invention.

A twenty-fifth embodiment of the present invention will now be described with reference to FIGS. 40A and 40B. As shown in FIG. 40A, this embodiment is structured such that two word line layers (a first word line 73a and a second word line 73b) are provided above the GMR cell to allow electric current to flow in each of the layers in the same direction so that a generated synthesized magnetic field enables the magnetic field which can be generated with the conventional structure having one layer to be enlarged to about two times. In this embodiment, no word line layer is provided below the GMR film as has been provided in the first to twenty-fourth embodiments.

As described above, the word line layers formed above or below the GMR film cannot be connected to each other in series so as to be allow electric currents to flow in the same direction.

Figure 40B:
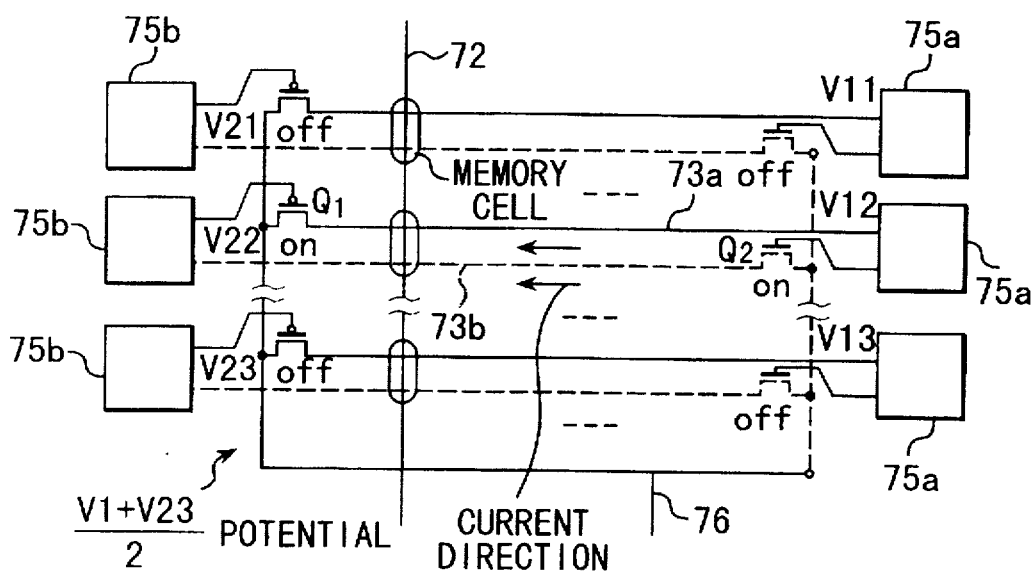

Therefore, this embodiment has a structure such that the word line layers are disposed, as shown in FIG. 40B. A first word line layer 73a, to which voltage V12 is applied from the word line driving circuit 75a at the right-hand end of the cell array A formed in parallel to the word line layer is extended to the left-hand end of the cell array. Only switch Q1 connected to the selected first word line layer is switched on so as to be connected to a first power supply line 76 common to the word lines. The first power supply line 76 is disposed in the direction of the bitline and extended to the right-hand end of the cell array in units of several word lines. Although the extended first power supply line 76 intersects a bitline 72, no problem arises if a memory cell is disposed in the intersection. The first power supply line 76 is extended to the direction of the bitline at the right-hand end of the cell array so as to be connected to a second word line 73b of each cell array through a switch. When the selected word line switch Q2 is switched on, a second word line current can be allowed to flow in the same direction below the first word line. The left-hand end of the second word line is connected to a drive circuit 75b for applying potential V2.

As described above, the plural layers of word lines arranged to be, in series, connected to the cell array are provide, a required magnetic field can be generated with a smaller word line electric current consumption. Even if a material and structure having a large change ratio of the magnetic resistance to obtain excellent sensing performance is employed, a low power consumption LSI can be realized. Thus, both of reduction in the electric power consumption and improvement in the sensing performance can be realized.

(Twenty-Sixth Embodiment)

Figure 41:
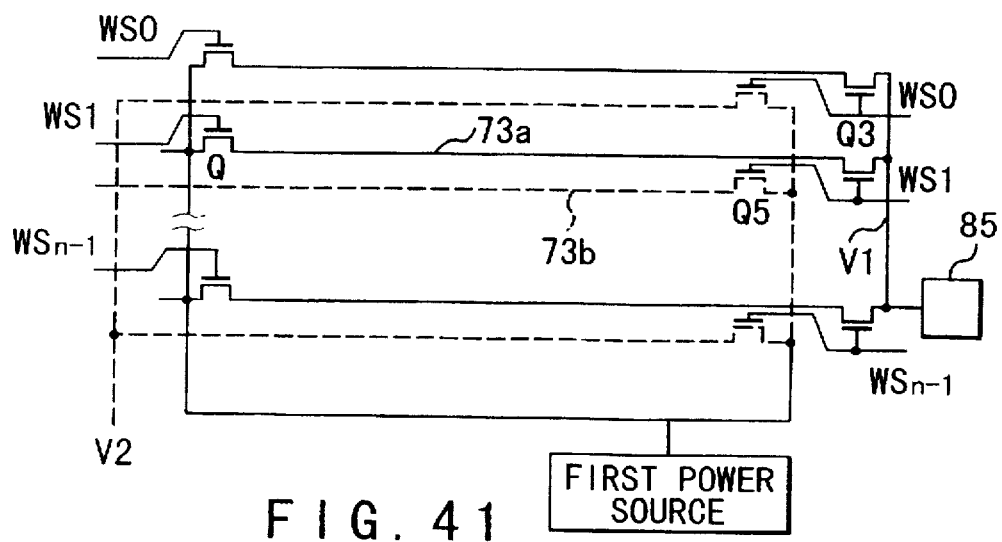
FIG. 41 is a diagram showing the layout of a word line according to a twenty-sixth embodiment.

A twenty-sixth embodiment of the present invention will now be described. This embodiment is another example of the structure of the word line in a cell structure similar to the twenty-fifth embodiment in which a plurality of word line layers are disposed either above or below the GMR film. Since data can be read/write by the word line current which flow in one direction, the drive circuit at an end (at the left-hand end in the structure shown in FIG. 41) of the cell array can be omitted from the structure. Thus, the connection to power supply V2 common to the cell arrays. At the other end (the right-hand end in the structure shown in FIG. 41), the word line driving circuit 85 for supply V1 is shared by a plurality of cell arrays. The word line driving circuit 85 is used as the switch to select an arbitrary word line through a switch, such as Q3. Symbols WS0-1 and WSn-1 represent word line selection control signals.

(Twenty-Seventh Embodiment)

A twenty-seventh embodiment of the present invention will now be described.

The first to twenty-sixth embodiments have a problem in that the resistance of the overall wiring is enlarged in proportion to the number of the layers because a multiplicity of word line layers are connected in series. Although any problem arises in a case where the resistance of the wiring of each of the word line layers is small, there arises a problem in that the voltage drops and RC delay takes place in a case where the resistance of the wiring is high. This embodiment employing division of the word lines is able to overcome the above-mentioned problem.

Figure 42:
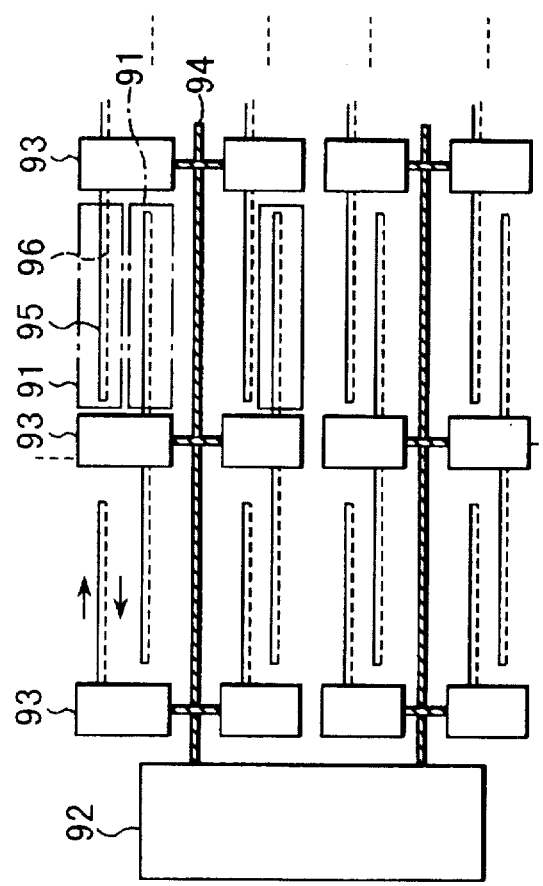
FIG. 42 is a diagram showing wiring of main/sub-decoder and word line according to a twenty-seventh embodiment.

In this embodiment, the cell array is divided into a plurality of sub-arrays 91, as shown in FIG. 42. A main row decoder 92 is disposed at the end of the cell array, while sub-row decoder 90 is disposed at an end of the sub-arrays 91. The main row decoder 92 and the sub-row decoder 90 are connected to each other through a main word line 94. As the word line to be disposed from a sub-row decoder 93 to the sub-arrays 91, the multi-layered word lines 95 and 96 according to the present invention is applied.

Since the decoder is divided as described above, voltage drop and excessive RC delay can be prevented because of the multi-layered word line in the form of the series connection according to the present invention.

(Twenty-Eighth Embodiment)

A twenty-eighth embodiment of the present invention will now be described.

With the conventional MRAM, if a plurality of word lines in a plurality of cell array blocks are simultaneously selected as can be performed with the DRAM, an electric current consumption is required the quantity of which is in proportion to the number of the selected word lines. The foregoing fact is a critical problem for the GMR memory in which a large electric current flows if one word line is selected.

In this embodiment, even if a plurality of word lines of a plurality of cell arrays are simultaneously selected, the electric current consumption can be reduced to a quantity which is required when one word line of one cell array is selected. Moreover, this embodiment is able to activate a plurality of word lines with small electric power. Thus, data of a multiplicity of bitlines can be input/output.

Figure 43:
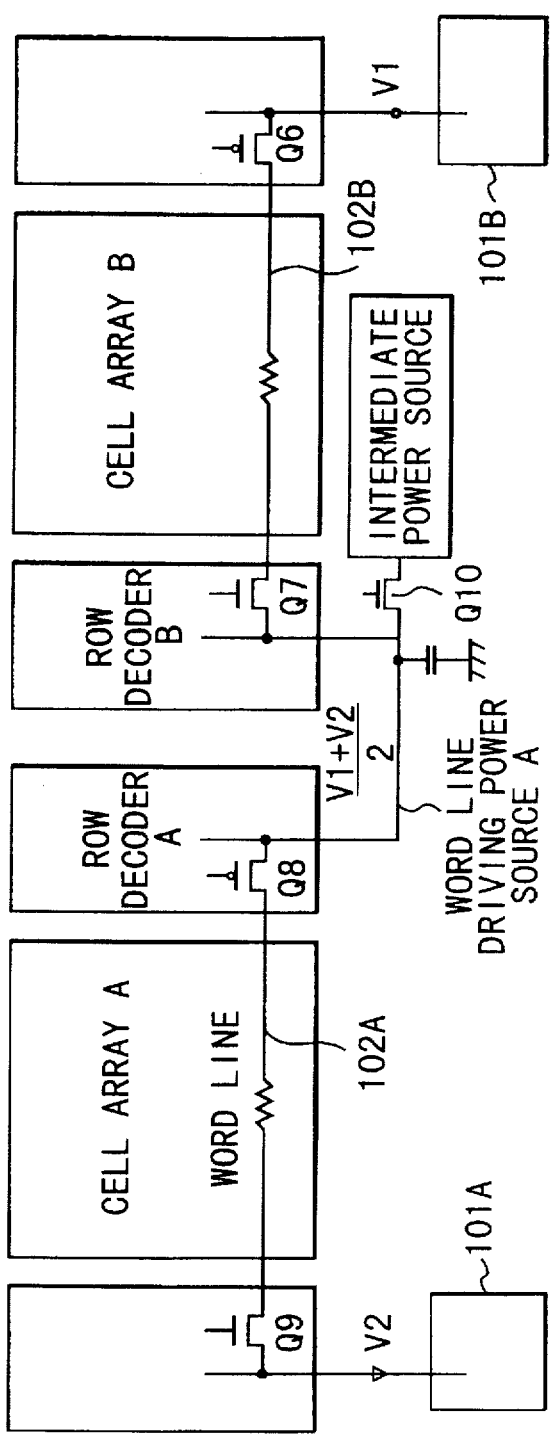
FIG. 43 is a diagram showing the wiring of a word line of a plurality of cell arrays, a row decoder and a drive power source according to a twenty-eighth embodiment of the present invention.

Two cell array blocks A and B shown in FIG. 43 will now be described to explain the twenty-eight embodiment. A row decoder B is connected to the cell array B. An electric current for use to drive an arbitrary word line 102B of the cell array B connected to the row decoder A is used to drive an arbitrary word line 102A of the cell array A. The foregoing structure can be realized by establishing the connection between the ground side power source of the final driver of the word line driving circuit of the row decoder B connected to the cell array B and the power source side of the final driver of the word line drive circuit of the row decoder A. Moreover, (V1+V2)/2 [V] (V1 and V2 are voltages supplied to each cell array from the word line driving circuits 101A and 101B) to the junction. An intermediate power source shown in FIG. 43 generates (V1+V2)/2, is fixed during standby mode. When the memory cell is operated, Q10 is switched off to disconnect the word line. As a result, a problem in that voltage is first applied to the word line in the cell array B, and then voltage is applied to the word line of the cell array A and instable operation occurring due to clock skew can be prevented.

As described above, even if a plurality of word lines in a plurality of cell array blocks are simultaneously selected, this embodiment is able to reduce the electric power consumption to a level required when one word line of one cell array block is selected. Since a plurality of word lines can be activated as described above data of a multiplicity of word lines can be output/input to and from the chip.

Although the foregoing description has been performed about the structure having two cell array blocks, the structure according to this embodiment may be applied to three or more cell array blocks.

(Twenty-Ninth Embodiment)

With the conventional MRAM, if a plurality of word lines in a plurality of cell array blocks are simultaneously selected as can be performed with the DRAM, an electric current consumption is required the quantity of which is in proportion to the number of the selected word lines. The foregoing fact is a critical problem for the GMR memory in which a large electric current flows if one word line is selected.

In the twenty-ninth embodiment, even if a plurality of bitlines of a plurality of cell arrays are simultaneously selected, the electric current consumption can be reduced to a quantity which is required when one bitline of one cell array is selected. Moreover, this embodiment is able to activate a plurality of bitlines with small electric power. Thus, a number of bit data can be input/output.

This embodiment will now be described with reference to FIG. 44 showing two cell array blocks. An electric current for use in a bitline current generating circuit of the cell array B of the two cell array blocks A and B is again used as the electric current for the bitline current generating circuit for the cell array A. That is, the ground side power source of the final driver of the bitline current generating circuit of the cell array B and the power source side of the final driver of the bitline current generating circuit of the cell array A are connected to each other so as to be operated simultaneously.

Even if a plurality of bitlines (or a plurality of bitlines in one cell array) of a plurality of cell array blocks are simultaneously selected, this embodiment is able to reduce the required electric current to a level which is required in a case where one bitline pair of one cell array block is selected. Moreover, this embodiment is able to simultaneously activate a plurality of bitlines. As a result, data of a multiplicity of bitlines can be input/output to and from the chip.

Figure 45:
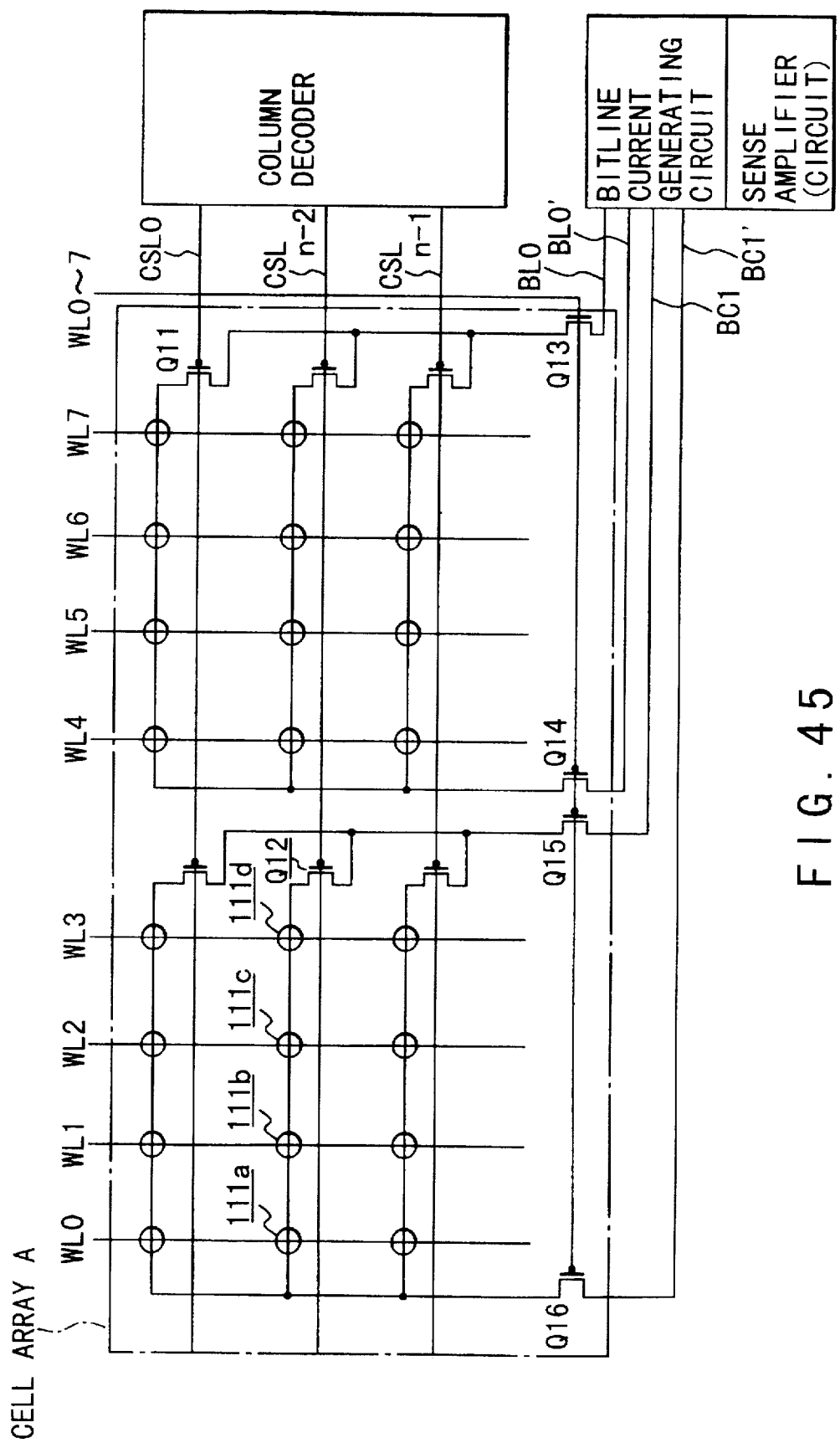
FIG. 45 is a diagram showing a bitline and a word line of a cell array according to a twenty-ninth embodiment.

The detailed structure of the twenty-ninth embodiment will now be described with reference to FIG. 45. FIG. 45 shows a memory cell 111 of the cell array A shown in FIG. 44, word lines WL0 to WL7 connected to the row decoder, main bitlines BL0, BL0', BL1 and BL1' connected to the bitline current generating circuit and a column decoder for selecting a predetermined bitline.

The GMR film is able to realize a poor change rate of the electric resistance of about 5% and about 100%. If a plurality of cells (for example, n cells) are connected to one bitline, the resistance change rate is made to be 1/n, thus raising a problem. Therefore, as shown in FIG. 45, four cells (111a, 111b, 111c and 111d) are connected so as to be connected to a main bitline BL1 through a transistor Q12 of the selected column control line CSLn-2. The connection to BL1 is established through the transistors Q15 and Q16. Since the GMR memory consumes a large electric current, the temperature is raised and the resistance of the cell is changed.

Accordingly, the bitlines (BL0 and BL0') connected to the non-selected cell adjacent to the selected word line is made to be a reference bitline so as to be, together with the bitline to which the selected cell is connected, connected to the sense amplifier circuit and the bitline current generating circuit.

Figures 46, 47:
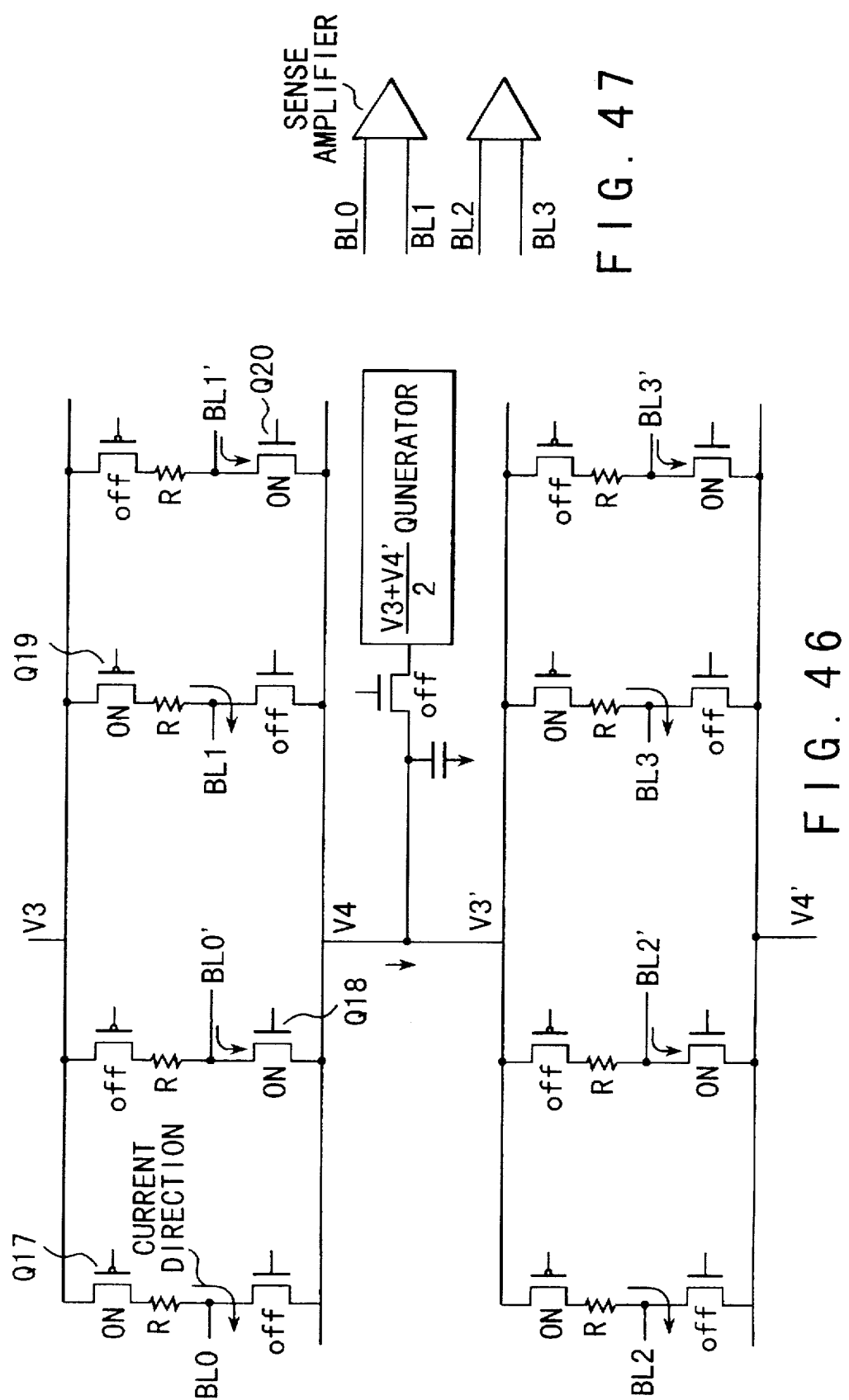
FIG. 46 is a diagram showing the bitline current generating circuit shown in FIG. 44.
FIG. 47 is a diagram showing the sense amplifier shown in FIG. 44.

FIG. 46 shows the detailed structure of the bitline current generating circuit shown in FIG. 44.

In the structure shown in FIG. 46, each of the bitlines (BLi and BLi') must be supplied with an electric current from a bitline i to a bitline i' or an electric current from the bitline i' to the bitline i to mutually read/write data. Each bitline pair (BL0 and BL0' and BL1 and BL1') must have a circuit for supplying an electric current from power source V3 to power source V4. Therefore, when an electric current is allowed to flow from BL0 to BL0' and from BL1 to BL1', the transistors Q17, Q18, Q19 and Q20 are turned on. The constant current control is performed by controlling the potential difference between the V0 and V4 and by using resistance R. When the power sources V3' and V4 of the bitline current generating circuit are connected to each other, the electric power consumption for the multiple bitline pair, which are operated simultaneously, can be reduced to a level which is required when one bitline is operated. FIG. 47 shows the sense amplifier shown in FIG. 44.

Figure 48:
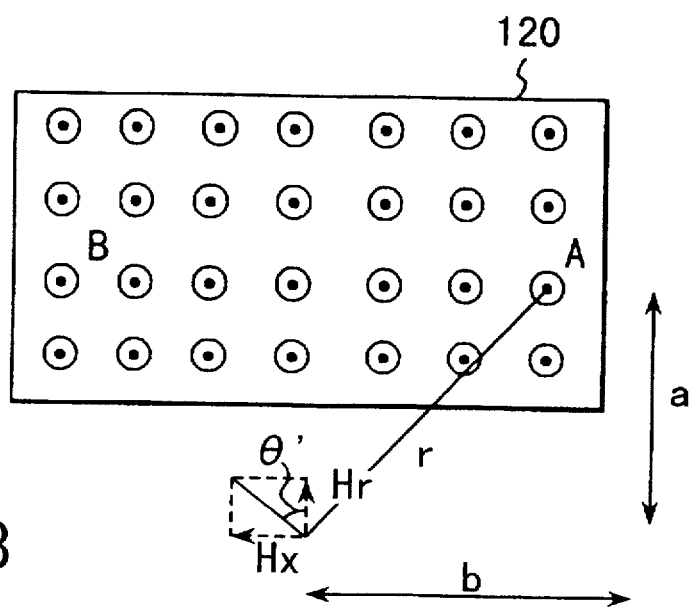
FIG. 48 is a cross sectional view showing an effect of the present invention.
Figure 50A:
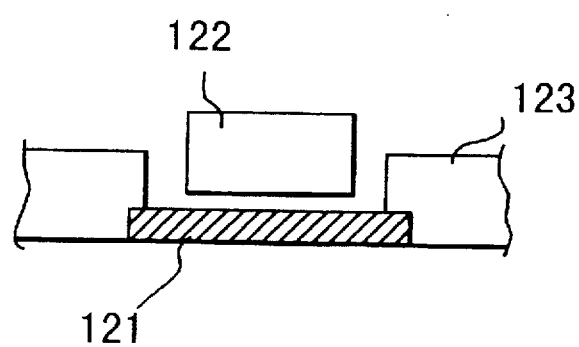
FIGS. 50A and 50B are cross sectional views showing a cell according to a thirtieth embodiment of the present invention.
Figure 50B:
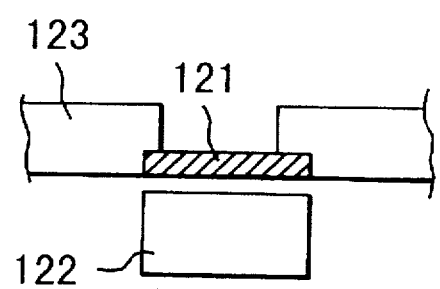

The voltage drop occurring in each of the embodiments and experienced with the conventional technique will now be estimated quantitatively. FIG. 48 is a diagram showing a method of estimating the magnetic field which is generated in the central portion of the GMR film. The estimation was performed as follows. The square cross section of the word line is equally divided into a plurality of sections. Then, an electric current for each of the sections is calculated. The distance from each section to the GMR film and the angle of the same are calculated so that Biot-Savart's law is used to calculate the horizontal magnetic field component Hx and vertical magnetic field component Hy. The magnetic field components are obtained for all of the divided electric currents so that the synthesized magnetic field of all of the horizontal magnetic field Hx and the vertical magnetic field Hy is obtained. The results are as follows. In this estimating operation, the quantity of the electric current to be supplied to each word line layer is unified to 50 m ampere.

Figure 49A:
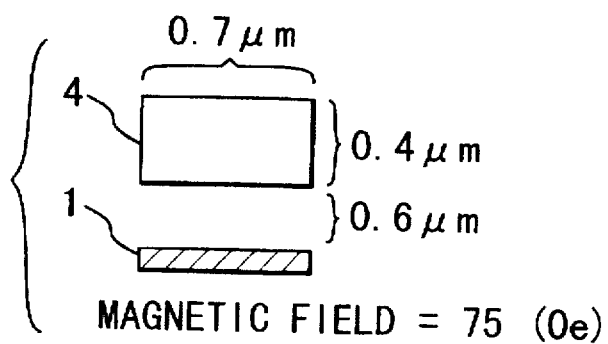
FIGS. 49A to 49H are diagrams showing an effect of the present invention as compared with the conventional technique.
Figure 49B:
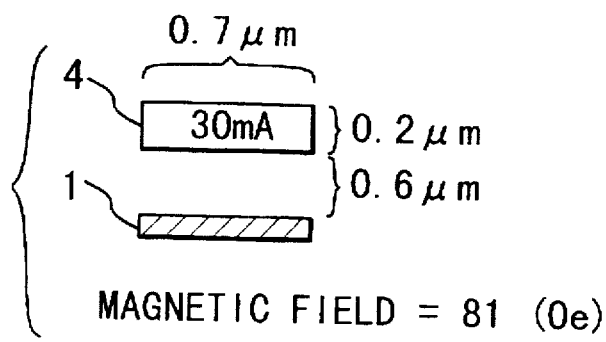
Figure 49C:
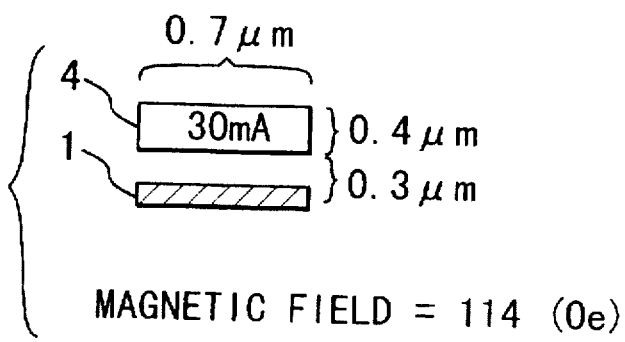

FIGS. 49A, 49B and 49C show the conventional example. Assuming that the distance from a word line 4 having a thickness of 0.4 μm to the GMR film 1 is 0.6 μm, 75 |Oe| was generated (see FIG. 49A). Assuming that the distance from a word line 4 having a thickness of 0.2 μm to the GMR film 1 is 0.6 μm, 81 |Oe| was generated (see FIG. 49B). Assuming that the distance from a word line 4 having a thickness of 0.4 μm to the GMR film 1 is 0.3 μm, 114 |Oe| was generated (see FIG. 49C). Note that 1 |Oe| is about 80 (A/m). As shown in FIG. 49B, the magnetic field is enlarged slightly when the thickness of the word line 4 is reduced. The reason for this is that the magnetic field is in inverse proportion to the distance r in accordance with the Biot-Savart's law. If the distance from the word line 4 to the GMR film 1 is further reduced as shown in FIG. 49C, a large magnetic field is generated. However, in the structures shown in FIGS. 49A, 49B and 49C, the distance cannot be reduced because of the obstruction of the bitline 2 connected to the GMR film 1.

Figure 49D:
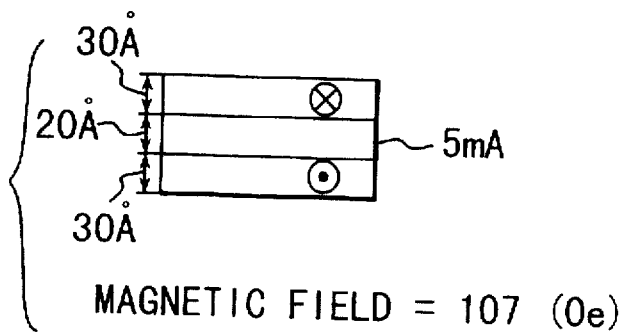
Figure 49E:
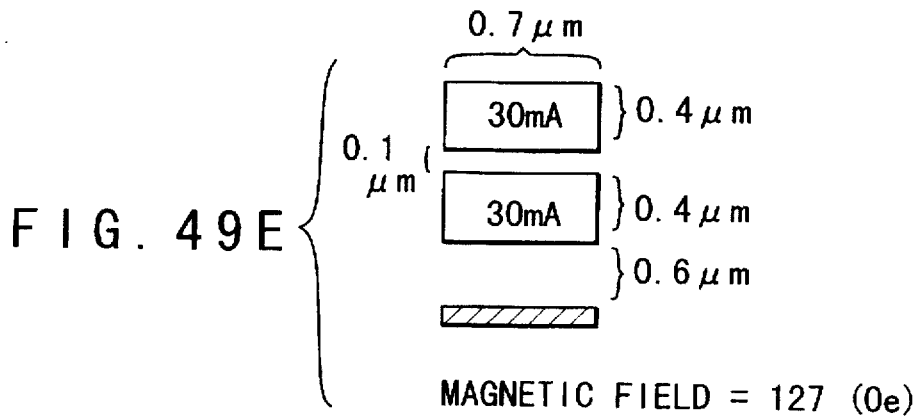
Figure 49F:
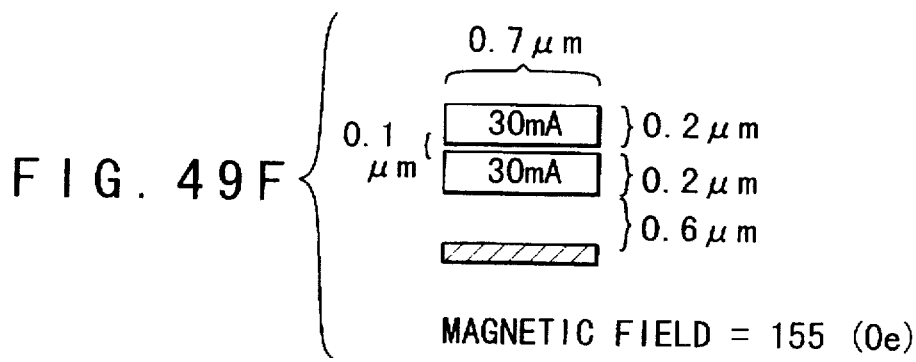
Figure 49G:
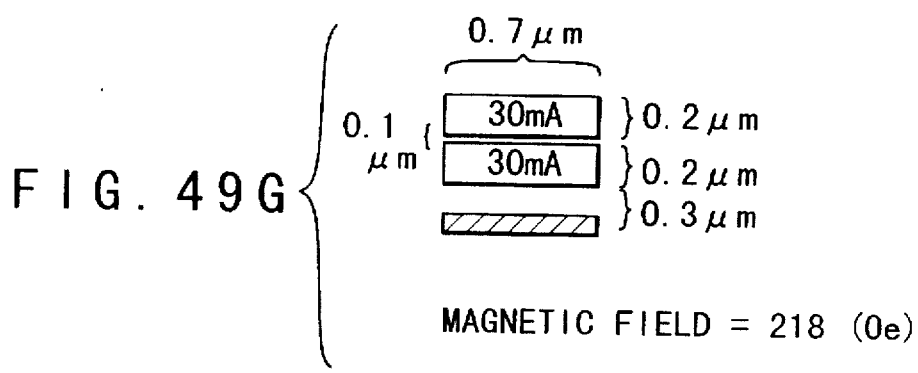
Figure 49H:
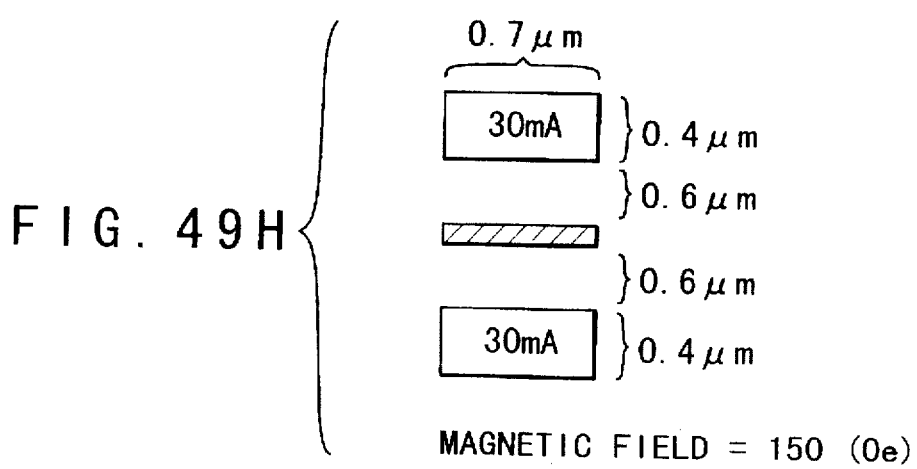

FIGS. 49E, 49F, 49G and 49H show the magnetic fields generated due to the multi-layered word line according to the present invention. If one layer is simply increased as shown in FIG. 49E, the magnetic field is substantially doubled as compared with the conventional structure. If the distance from the word line layer to the GMR film is reduced as shown in FIG. 49G, the magnetic field is excessively enlarged to 218 (Oe). If the word line layers are vertically formed across the bitline as shown in FIG. 49H, a magnetic field which is two times the magnetic field shown in FIG. 49A is generated. As can be understood from the above-mentioned examples, the magnetic field is considerably enlarged in a case of a multilayered structure even if the electric current is constant.

FIG. 49D shows a magnetic field which is generated in the central portion of a ferromagnetic film attributable to the bitline current. Since the distance r is small, a magnetic field of 107 (Oe) is generated with a small current of 5 mA. Thus, insufficient efficiency of the magnetic field generated by the word line can be understood.

(Thirtieth Embodiment)

A thirtieth embodiment of the present invention will now be described.

In the conventional structures shown in FIGS. 49A, 49B and 49C, the existence of the bitline 2 connected to the GMR film 1 inhibits reduction in the distance from the word line 4 to the GMR film 1. To enlarge the intensity of the magnetic field, the distance must be reduced as described above.

In this embodiment, the region between bitline wirings and region between word line wirings are embedded or the word line is formed below the bitline layer so that the distance is shortened.

(Thirty-First Embodiment)

Figure 51A:
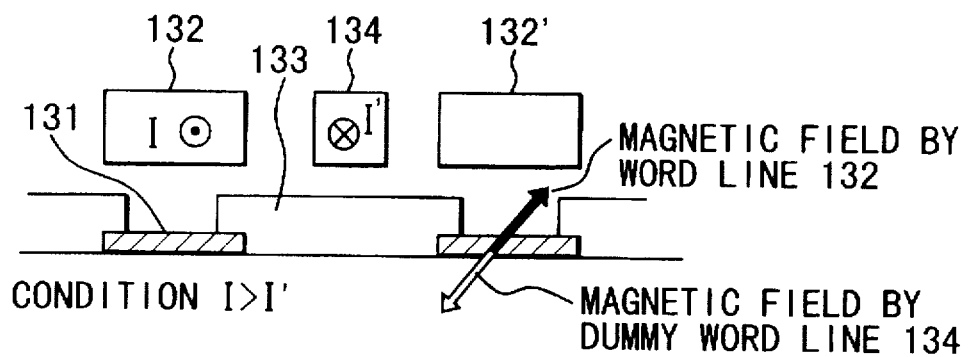
FIGS. 51A to 51C are a cross sectional view and a plan view showing a thirty-first embodiment of the present invention.
Figure 51B:
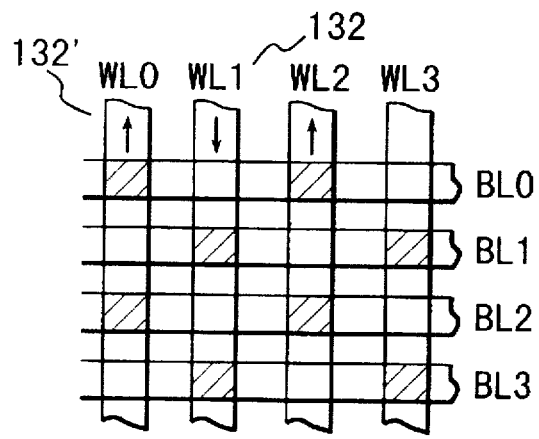
Figure 51C:
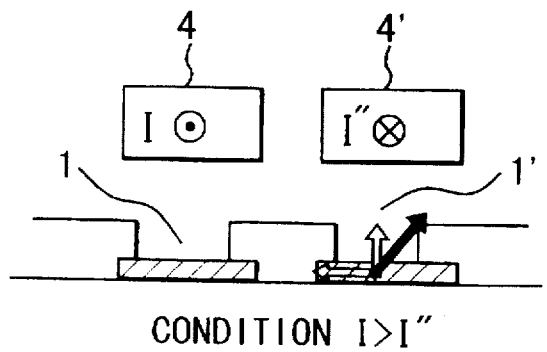

FIGS. 51A and 51B shows a thirty-first embodiment of the present invention. If the memory cell is formed precisely, the pitch of the word lines is reduced and the thickness of each layer cannot be reduced satisfactorily, a leak magnetic field is generated in the non-selected word line 4' as indicated by a black arrow as described in the conventional structure shown in FIG. 51C. Thus, there arises a fear that data on the adjacent cell is broken. Accordingly, a dummy word line 134 is disposed between word lines as shown in FIG. 51A to allow an electric current smaller than the electric current in the word line to flow in the opposite direction. Thus, a magnetic field as indicated by a white arrow is generated so that the magnetic field indicated by the black arrow is substantially canceled. The word line may be a dummy line as shown in FIG. 51A or an adjacent word line as shown in FIG. 51C. In the case shown in FIG. 51C, the upward component of the synthesized magnetic field is retained. However, the spinning direction of the GMR device is not changed with respect to the upward direction. Therefore, the foregoing magnetic field does not affect the effect. When the adjacent word line is employed as described above, the cells are disposed at every two intersection between the word line and the bitline. In a case where cells are disposed at all intersections between the word lines and the bitlines, a slight opposite current is supplied to the adjacent cell. Thus, a required effect can be obtained.

The GMR film in the foregoing embodiments is the exchange connection GMR film in which ferromagnetic layers made of Cu, Ni, Fe or their alloy are connected to the two sides of a non-magnetic conductive layer made of Cu, Au, Ag or Cr; a spin-bulb GMR film in which a (semi) hard magnetic layer made of CoPt or the like is connected to either side of a ferromagnetic layer made of Cu, Au, Ag or Cr and a soft magnetic layer made of NiFe or NiFeCo is connected to the other side; or a spin-bulb GMR film in which a soft magnetic layer made of NiFe or NiFeCo and an inverse ferromagnetic layer made of FeMn or the like are connected to either side of the non-magnetic conductive layer made of Cu, Au, Ag or Cr and a soft magnetic layer made of NiFe or NiFeCo is connected to the other side. As the tunnel type GMR film, a structure in which ferromagnetic layers made of Fe or the like are connected to the two sides of a non-magnetic insulation layer made of Al or the like. The film may be a GMR film containing Pr, Sr, Mn or O may be employed as well as the GMR film. Permalloy having an AMR effect having magnetic anisotropy in one direction may be employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor memory device comprising:
   a plurality of word lines;
   a plurality of bitlines;
   a plurality of memory cells selectively disposed at intersections between said plural bitlines and said plural word lines and arranged to store data in accordance with change in resistance, a plurality of sub-cell blocks formed by one of said plural memory cells or two or more memory cells connected in series in a direction of said bitline, a plurality of cell blocks each formed by at least two sub-cell blocks connected in series in the direction of said bitline and a memory cell array formed by at least two cell blocks disposed in a direction of said word line;
   means for allowing an electric current to flow through said bitline of said plural cell blocks; and
   means for reading data from nodes at two ends of said sub-cell block including a memory cell selected by activating one of said plural word lines.

2. A semiconductor memory device according to claim 1, wherein
   said plural cell blocks have a structure in which at least two sub-cell blocks and a dummy sub-cell block for use as a dummy cell are connected in series in the direction of said bitline, and further comprising
   means for reading reference data from nodes at two ends of said dummy sub-cell block.

3. A semiconductor memory device according to claim 1, wherein
   said memory cell array includes a cell block for a memory and a dummy cell block for use as a dummy cell, and further comprising
   means for reading reference data from nodes at two ends of a dummy sub-cell block corresponding to a selected memory cell in said dummy cell block.

4. A semiconductor memory device according to claim 2, wherein data in said selected memory cell is read as a potential difference between first potential difference between nodes at two ends of said sub-cell block for a memory and a second potential difference between nodes at two ends of said dummy sub-cell blocks.

5. A semiconductor memory device according to claim 2, wherein a resistance level of said dummy sub-cell block is set to be an intermediate level between a resistance level of said sub-cell block when data in a selected memory cell in said sub-cell block for a memory is "0" and a resistance level of said sub-cell block when data in a selected memory cell is "1".

6. A semiconductor memory device according to claim 1, wherein at least either end of said cell block is connected to a power supply terminal through a cell block select transistor.

7. A semiconductor memory device according to claim 1, wherein the nodes at two ends of said sub-cell block are connected to a sense amplifier through a sub-cell block select transistor.

8. A semiconductor memory device according to claim 1, wherein said memory cell includes a magnetoresistance effect element.

9. A semiconductor memory device comprising:
a plurality of first word lines;
a plurality of second word lines;
a plurality of memory cells each including a magnetoresistance effect device and the first word line which applies magnetic field to said magnetoresistance effect device to store data in accordance with change in the resistance and a cell transistor whose gate is the second word line connected in parallel to said magnetoresistance effect device and a plurality of memory cell block which consist at least two memory cells being in series connected; and
at least one block select transistor for connecting at least one cell block to a power supply terminal.

* * * * *